US010481269B2

(12) United States Patent
Pacala et al.

(10) Patent No.: US 10,481,269 B2
(45) Date of Patent: Nov. 19, 2019

(54) ROTATING COMPACT LIGHT RANGING SYSTEM

(71) Applicant: Ouster, Inc., San Francisco, CA (US)

(72) Inventors: Angus Pacala, San Francisco, CA (US); Mark Frichtl, San Francisco, CA (US); Marvin Shu, Daly City, CA (US); Eric Younge, Portola Valley, CA (US)

(73) Assignee: Ouster, Inc., San Francisco, CA (US)

( * ) Notice: Subject to any disclaimer, the term of this patent is extended or adjusted under 35 U.S.C. 154(b) by 0 days.

(21) Appl. No.: 16/209,867

(22) Filed: Dec. 4, 2018

(65) Prior Publication Data

US 2019/0179028 A1 Jun. 13, 2019

Related U.S. Application Data

(60) Provisional application No. 62/596,018, filed on Dec. 7, 2017.

(51) Int. Cl.
*G01C 3/08* (2006.01)
*G01S 17/89* (2006.01)
(Continued)

(52) U.S. Cl.
CPC ............ *G01S 17/89* (2013.01); *B60L 3/0015* (2013.01); *G01S 7/486* (2013.01); *G01S 7/4816* (2013.01); *G01S 7/4817* (2013.01); *G01S 17/42* (2013.01); *H01S 5/146* (2013.01); *H02J 7/025* (2013.01); *H02J 50/10* (2016.02)

(58) Field of Classification Search
CPC ...... G01S 17/89; G01S 7/4817; G01S 7/4816; G01S 7/486; G01S 17/42; H02J 7/025; H02J 50/10; H01S 5/146; B60L 3/0015
See application file for complete search history.

(56) References Cited

U.S. PATENT DOCUMENTS 4,358,851 A 11/1982 Scifres et al.
4,634,272 A 1/1987 Endo
(Continued)

FOREIGN PATENT DOCUMENTS

EP 2124069 A1 11/2009
EP 3002548 A1 9/2016
(Continued)

OTHER PUBLICATIONS

Velodyne Lidar, Inc., HDL-32E Data Sheet 2010, 2017.
(Continued)

*Primary Examiner* — Samantha K Abraham
(74) *Attorney, Agent, or Firm* — Kilpatrick Townsend & Stockton, LLP

(57) ABSTRACT

A light ranging system including a shaft; a first circuit board assembly that includes a stator assembly comprising a plurality of stator elements arranged about the shaft on a surface of the first circuit board assembly; a second circuit board assembly rotationally coupled to the shaft, wherein the second circuit board assembly includes a rotor assembly comprising a plurality of rotor elements arranged about the shaft on a surface of the second circuit board assembly such that the plurality of rotor elements are aligned with and spaced apart from the plurality of stator elements; a stator driver circuit disposed on either the second or the first circuit board assemblies and configured to provide a drive signal to the plurality of stator elements, thereby imparting an electromagnetic force on the plurality of rotor elements to drive a rotation of the second circuit board assembly about the shaft; and a light ranging device mechanically coupled to the second circuit board assembly such that the light ranging device rotates with the second circuit board assembly.

25 Claims, 18 Drawing Sheets

(51) Int. Cl.
  *G01S 17/42*       (2006.01)
  *G01S 7/486*       (2006.01)
  *G01S 7/481*       (2006.01)
  *B60L 3/00*        (2019.01)
  *H01S 5/14*        (2006.01)
  *H02J 7/02*        (2016.01)
  *H02J 50/10*       (2016.01)

(56) References Cited

U.S. PATENT DOCUMENTS

| | | |
|---|---|---|
| 4,676,599 A | 6/1987 | Cruz |
| 4,702,600 A | 10/1987 | Handrich et al. |
| 4,744,667 A | 5/1988 | Fay et al. |
| 4,851,664 A | 7/1989 | Rieger |
| 5,267,016 A | 11/1993 | Meinzer et al. |
| 5,288,992 A | 2/1994 | Fohl |
| 5,982,552 A | 11/1999 | Nakama et al. |
| 6,014,232 A | 1/2000 | Clarke |
| 6,133,989 A | 10/2000 | Stettner et al. |
| 6,252,331 B1 * | 6/2001 | Mildice ............... H02K 19/12 |
| | | 310/113 |
| 6,255,133 B1 | 7/2001 | Ormond |
| 6,374,024 B1 | 4/2002 | Iijima |
| 6,414,746 B1 | 7/2002 | Stettner et al. |
| 6,690,019 B2 | 2/2004 | Stettner et al. |
| 6,721,262 B1 | 4/2004 | Jordache et al. |
| 7,091,462 B2 | 8/2006 | Wilson et al. |
| D531,525 S | 11/2006 | Dold et al. |
| 7,170,542 B2 | 1/2007 | Hanina et al. |
| 7,295,298 B2 | 11/2007 | Willhoeft et al. |
| 7,345,271 B2 | 3/2008 | Boehlau et al. |
| 7,421,159 B2 | 9/2008 | Yang et al. |
| 7,433,042 B1 | 10/2008 | Cavanaugh et al. |
| 7,570,426 B2 | 8/2009 | Rodgers et al. |
| 7,808,706 B2 | 10/2010 | Fadel et al. |
| 7,969,558 B2 | 6/2011 | Hall |
| 8,013,983 B2 | 9/2011 | Lin et al. |
| 8,130,367 B2 | 3/2012 | Stettner et al. |
| D659,030 S | 5/2012 | Anselment et al. |
| 8,314,612 B1 | 11/2012 | Rodgers et al. |
| 8,319,949 B2 | 11/2012 | Cantin et al. |
| 8,089,618 B2 | 12/2012 | Yang |
| 8,330,840 B2 | 12/2012 | Lenchenkov |
| 8,374,405 B2 | 2/2013 | Lee et al. |
| 8,384,997 B2 | 2/2013 | Shpunt et al. |
| 8,494,252 B2 | 7/2013 | Freedman et al. |
| 8,675,181 B2 | 3/2014 | Hall |
| 8,717,488 B2 | 5/2014 | Shpunt et al. |
| 8,742,325 B1 | 6/2014 | Droz et al. |
| 8,743,176 B2 | 6/2014 | Stettner et al. |
| 8,761,495 B2 | 6/2014 | Freedman et al. |
| 8,767,190 B2 | 7/2014 | Hall |
| 8,829,406 B2 | 9/2014 | Akerman et al. |
| 8,836,922 B1 | 9/2014 | Pennecot et al. |
| 8,848,039 B2 | 9/2014 | Spektor et al. |
| 9,041,915 B2 | 5/2015 | Earnhart et al. |
| 9,063,549 B1 | 6/2015 | Pennecot et al. |
| 9,071,763 B1 | 6/2015 | Templeton et al. |
| 9,086,273 B1 | 7/2015 | Gruver et al. |
| 9,111,444 B2 | 8/2015 | Kaganovich |
| 9,157,790 B2 | 10/2015 | Shpunt et al. |
| 9,164,511 B1 | 10/2015 | Ferguson et al. |
| 9,176,051 B2 | 11/2015 | Mappes et al. |
| 9,229,109 B2 | 1/2016 | Stettner et al. |
| 9,285,464 B2 | 3/2016 | Pennecot et al. |
| 9,299,731 B1 | 3/2016 | Lenius et al. |
| 9,368,936 B1 | 6/2016 | Lenius et al. |
| 9,369,689 B1 | 6/2016 | Tran et al. |
| 9,285,477 B1 | 7/2016 | Smith et al. |
| 9,383,753 B1 | 7/2016 | Templeton et al. |
| 9,425,654 B2 | 8/2016 | Lenius et al. |
| 9,435,891 B2 | 9/2016 | Oggier |
| 9,470,520 B2 | 10/2016 | Schwarz et al. |
| 9,489,601 B2 | 11/2016 | Fairfield et al. |
| 9,525,863 B2 | 12/2016 | Nawasra et al. |
| 9,529,079 B1 | 12/2016 | Droz et al. |
| RE46,672 E * | 1/2018 | Hall ..................... G01S 17/89 |
| | | 356/5.01 |
| 9,882,433 B2 | 1/2018 | Lenius et al. |
| 9,935,514 B1 | 4/2018 | Lenius et al. |
| 10,291,319 B1 | 5/2019 | Karplus et al. |
| 2003/0006676 A1 | 1/2003 | Smith et al. |
| 2003/0047752 A1 | 3/2003 | Campbell |
| 2004/0061502 A1 | 4/2004 | Hasser |
| 2004/0223071 A1 | 11/2004 | Wells |
| 2005/0030409 A1 | 2/2005 | Matherson |
| 2006/0139770 A1 | 6/2006 | Wang et al. |
| 2006/0208193 A1 | 9/2006 | Bodkin |
| 2006/0244851 A1 | 11/2006 | Cartlidge |
| 2007/0007563 A1 | 1/2007 | Mouli |
| 2007/0060806 A1 | 3/2007 | Hunter et al. |
| 2007/0228262 A1 | 10/2007 | Cantin et al. |
| 2008/0088818 A1 | 4/2008 | Mori |
| 2008/0153189 A1 | 6/2008 | Plaine |
| 2009/0016642 A1 | 1/2009 | Hart |
| 2009/0040629 A1 | 2/2009 | Bechtel |
| 2009/0179142 A1 | 7/2009 | Duparre et al. |
| 2009/0295910 A1 | 12/2009 | Mir et al. |
| 2010/0008588 A1 | 1/2010 | Feldkhun et al. |
| 2010/0020306 A1 | 1/2010 | Hall |
| 2010/0110275 A1 | 5/2010 | Mathieu |
| 2010/0123893 A1 | 5/2010 | Yang |
| 2010/0204964 A1 | 8/2010 | Pack et al. |
| 2011/0025843 A1 | 2/2011 | Oggier et al. |
| 2011/0032398 A1 | 2/2011 | Lenchenkov |
| 2011/0037849 A1 | 2/2011 | Niclass |
| 2011/0116262 A1 | 5/2011 | Marson |
| 2011/0216304 A1 | 9/2011 | Hall |
| 2012/0044476 A1 | 2/2012 | Earnhart et al. |
| 2012/0140109 A1 | 6/2012 | Shpunt et al. |
| 2012/0154914 A1 | 6/2012 | Moriguchi et al. |
| 2012/0182464 A1 | 7/2012 | Shpunt et al. |
| 2012/0238907 A1 * | 9/2012 | Boecker .......... A61B 5/150022 |
| | | 600/583 |
| 2012/0287417 A1 | 11/2012 | Mimeault |
| 2012/0320164 A1 | 12/2012 | Lipton |
| 2013/0044310 A1 | 2/2013 | Mimeault |
| 2013/0141549 A1 | 6/2013 | Beers et al. |
| 2013/0206967 A1 | 8/2013 | Shpunt et al. |
| 2013/0294089 A1 | 11/2013 | Freedman et al. |
| 2013/0300840 A1 | 11/2013 | Borowski |
| 2013/0342921 A1 | 12/2013 | Sunne et al. |
| 2014/0118335 A1 | 5/2014 | Gurman |
| 2014/0118493 A1 | 5/2014 | Sali et al. |
| 2014/0153001 A1 | 6/2014 | Chayat et al. |
| 2014/0158900 A1 | 6/2014 | Yoon |
| 2014/0168631 A1 | 6/2014 | Haslim et al. |
| 2014/0176933 A1 | 6/2014 | Haslim et al. |
| 2014/0211194 A1 | 7/2014 | Pacala et al. |
| 2014/0269796 A1 | 9/2014 | Geske |
| 2014/0285628 A1 | 9/2014 | Shpunt et al. |
| 2014/0291491 A1 | 10/2014 | Shpunt et al. |
| 2014/0313519 A1 | 10/2014 | Shpunt et al. |
| 2014/0375977 A1 | 12/2014 | Ludwig et al. |
| 2014/0376092 A1 | 12/2014 | Mor |
| 2015/0002636 A1 | 1/2015 | Brown et al. |
| 2015/0131080 A1 | 5/2015 | Retterath et al. |
| 2015/0184999 A1 | 7/2015 | Stettner |
| 2015/0192677 A1 | 7/2015 | Yu et al. |
| 2015/0292948 A1 | 10/2015 | Goldring et al. |
| 2015/0293224 A1 | 10/2015 | Eldada et al. |
| 2015/0301180 A1 * | 10/2015 | Stettner ............... G01S 17/107 |
| | | 356/5.01 |
| 2015/0316473 A1 | 11/2015 | Kester et al. |
| 2015/0355470 A1 | 12/2015 | Herschbach |
| 2015/0358601 A1 | 12/2015 | Oggier |
| 2015/0378241 A1 | 12/2015 | Eldada |
| 2015/0379371 A1 | 12/2015 | Yoon et al. |
| 2016/0003946 A1 | 1/2016 | Gilliland et al. |
| 2016/0047895 A1 | 2/2016 | Dussan |
| 2016/0047896 A1 | 2/2016 | Dussan |
| 2016/0047897 A1 | 2/2016 | Dussan |
| 2016/0047898 A1 | 2/2016 | Dussan |

| | | | |
|---|---|---|---|
| 2016/0047899 | A1 | 2/2016 | Dussan |
| 2016/0047900 | A1 | 2/2016 | Dussan |
| 2016/0047901 | A1 | 2/2016 | Pacala et al. |
| 2016/0047903 | A1 | 2/2016 | Dussan |
| 2016/0049765 | A1 | 2/2016 | Eldada |
| 2016/0097858 | A1 | 4/2016 | Mundhenk et al. |
| 2016/0150963 | A1 | 6/2016 | Roukes et al. |
| 2016/0161600 | A1 | 6/2016 | Eldada et al. |
| 2016/0218727 | A1 | 7/2016 | Maki |
| 2016/0231527 | A1 | 8/2016 | Tremblay |
| 2016/0259057 | A1 | 9/2016 | Ito |
| 2016/0265902 | A1 | 9/2016 | Nawasra et al. |
| 2016/0291134 | A1 | 10/2016 | Droz et al. |
| 2016/0306032 | A1 | 10/2016 | Schwarz et al. |
| 2016/0327779 | A1 | 11/2016 | Hillman |
| 2016/0328619 | A1 | 11/2016 | Yi et al. |
| 2017/0082836 | A1 | 3/2017 | Weaver |
| 2017/0102454 | A1* | 4/2017 | Yuasa ................ G01S 17/08 |
| 2017/0146640 | A1 | 5/2017 | Hall et al. |
| 2017/0168261 | A1* | 6/2017 | Itami ................ G01S 7/4817 |
| 2017/0219426 | A1 | 8/2017 | Pacala et al. |
| 2017/0219695 | A1 | 8/2017 | Hall et al. |
| 2017/0269197 | A1 | 9/2017 | Hall et al. |
| 2017/0269198 | A1 | 9/2017 | Hall et al. |
| 2017/0269209 | A1 | 9/2017 | Hall et al. |
| 2017/0269215 | A1 | 9/2017 | Hall et al. |
| 2017/0289524 | A1 | 10/2017 | Pacala et al. |
| 2017/0350983 | A1 | 12/2017 | Hall et al. |
| 2018/0109061 | A1 | 4/2018 | Pardhan et al. |
| 2018/0118041 | A1 | 5/2018 | Lenius et al. |
| 2018/0123412 | A1* | 5/2018 | Karplus ............ H02K 11/215 |
| 2018/0321360 | A1 | 11/2018 | Hall et al. |
| 2019/0011537 | A1 | 1/2019 | Utermoehlen et al. |

FOREIGN PATENT DOCUMENTS

| | | |
|---|---|---|
| JP | H3-6407 | 1/1991 |
| JP | 07-049417 A | 2/2007 |
| WO | 2015052616 A1 | 4/2015 |
| WO | 2016116733 A1 | 7/2016 |
| WO | 2016125165 A1 | 8/2016 |
| WO | 2017132704 A1 | 8/2017 |
| WO | 2017164989 | 9/2017 |
| WO | 2019055979 A1 | 3/2019 |

OTHER PUBLICATIONS

Velodyne Lidar, Inc., HDL-32E, User's Manual 2010.; Aug. 2016.
Velodyne Lidar, Inc., HDL-32E, HDL-32E, webpage: http://www.velodynelidar.com/hdl-32e.html; retrieved Dec. 6, 2017.
Velodyne Lidar, Inc., HDL-64E Data Sheet, 2017.
Velodyne Lidar, Inc., HDL-64E S2 and S2.1; User's Manual and Programming Guide 2007; Firmware version 4; 2007, revision Nov. 2012.
Velodyne Lidar, Inc., HDL-64E, S3; User's Manual and Programming Guide revision J; 2007.; Dec. 2017.
Velodyne Lidar, Inc., HDL-64E; webpage: http://www.velodynelidar.com/hdl-64e.html; retrieved Dec. 6, 2017.
Velodyne Lidar, Inc., VLP-16 data sheet, Puck, Real Time 3D Lidar Sensor, 2014.
Velodyne Lidar Inc., Velodyne Lidar Puck; User's Manual and Programming Guide; 2014.
Velodyne Lidar, Inc., VLP-16; retrieved via website: http://www.velodynelidar.com/vlp-16.html; Dec. 6, 2017.
Velodyne, Lidar, Inc.; Puck Hi-Res Data Sheet; Sep. 2016.
Velodyne Lidar, Inc.; Puck Hi-Res User Manual; Sep. 2016.
Velodyne Lidar, Inc.; Puck Hi-Res retrieved via website: http://www.velodynelidar.com/vlp-16-hi-res.html; Dec. 13, 2017.
Velodyne Lidar, Inc.; Puck Lite Data Sheet; Feb. 2016.
Velodyne Lidar, Inc.; Puck Lite User Manual; Feb. 2016.
Velodyne Lidar, Inc.; Puck Lite, Our Lightest Sensor Ever, Apr. 2016; retrieved via website: http://www.velodynelidar.com/vlp-16-lite.html; Dec. 13, 2017.
VeLodyne Lidar, Inc.,; Ultra Puck VLP-32C; Nov. 2017; retrieved via website: http://www.velodynelidar.com/vlp-32c.html; Dec. 13, 2017.
Bronzi, Danilo, "100 000 Frames/s 64x32 Single Photon Detector Array for 2-D Imaging and 3-D Ranging", IEEE Journal of Selected Topic in Quantum Electronics, vol. 20, No. 6, Nov./Dec. 2014; 10 pages.
Quanergy Systems EX, 1005, Review of Scientific Instruments; vol. 72, No. 4, Apr. 2001, 13 pages.
Itzler, Mark A., "Geiger-mode avalance photodiode focal plane arrays for three-dimensional imaging LADAR"; Princeton LIghtwave, Inc., Proc of SPIE vol. 7808 780890C-, 14 pages.
Cova, Sergio D.; Single-Photon Counting Detectors, IEEE Photonics Journal; vol. 3, No. 2, Apr. 2011, 5 pages.
Guerrieri, Fabrizio, Two-Dimensional SPAD Imaging Camera for Photon Counting, vol. 2, No. 5, Oct. 2010, 17 pages.
Charbon, Edoardo, et al. "SPAD-Based Sensors"; TOF Range-Imaging Cameras, Remondino, F.,; Stoppa D. (Eds.), 2013, V, 240 p. 138 Illus., 85 Illus. in color., Hardcover ISBN 978-3-642-27522-7, 2013.
International Search Report and Written Opinion received in International Application No. PCT/US2018/064328, dated Apr. 8, 2019; 27 pages.
Invitation to Pay Additional Fees and, Where Applicable, Protest Fee received in International Application No. PCT/US2018/064328 , dated Jan. 24, 2019, 2 pages.

* cited by examiner

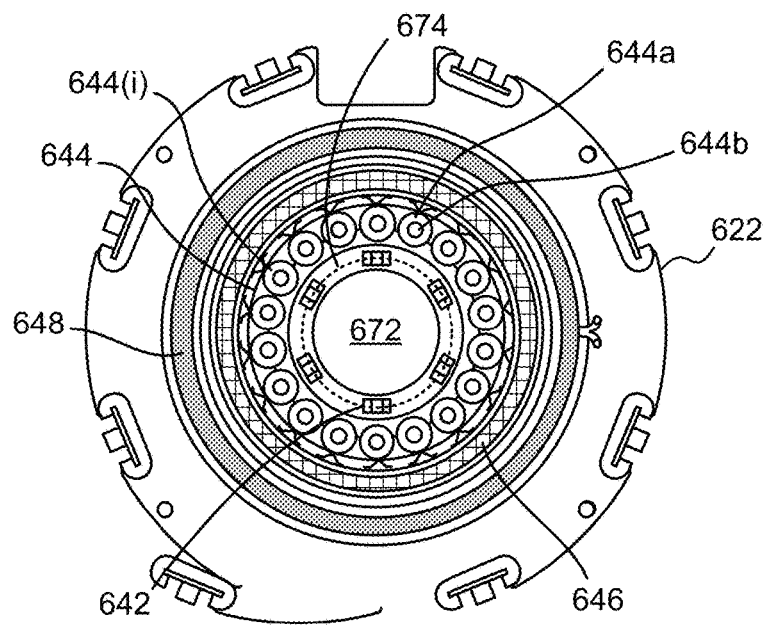
FIG. 6D
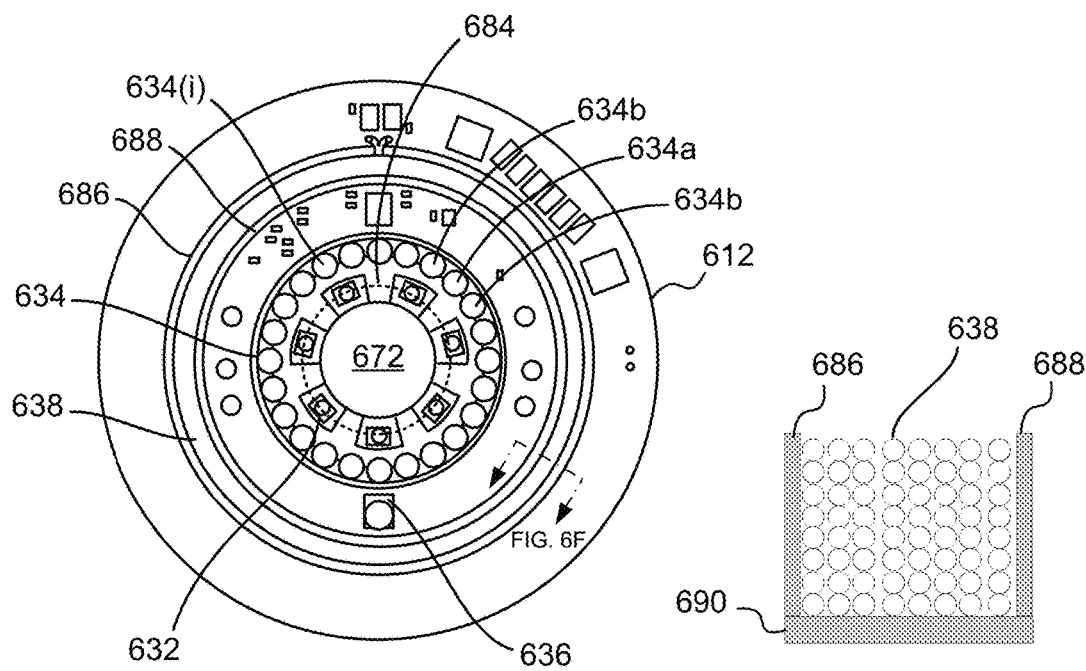
FIG. 6E
FIG. 6F

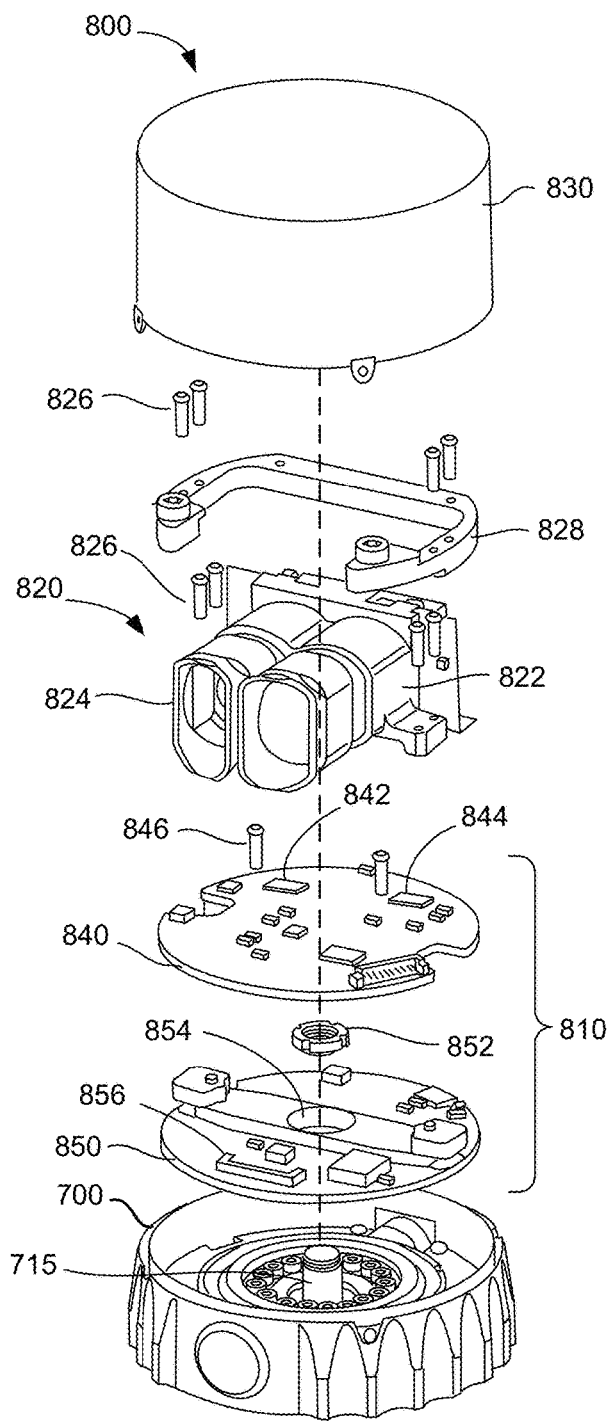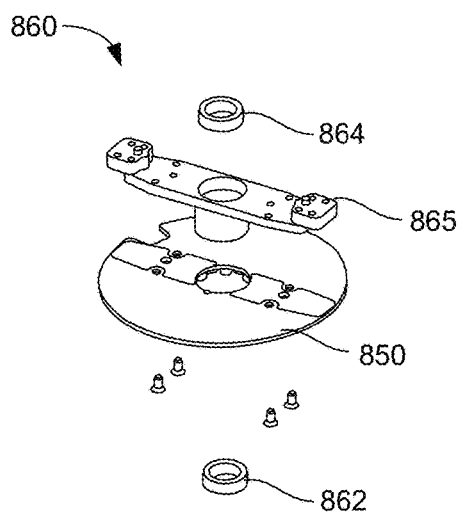
FIG. 8A
FIG. 8B

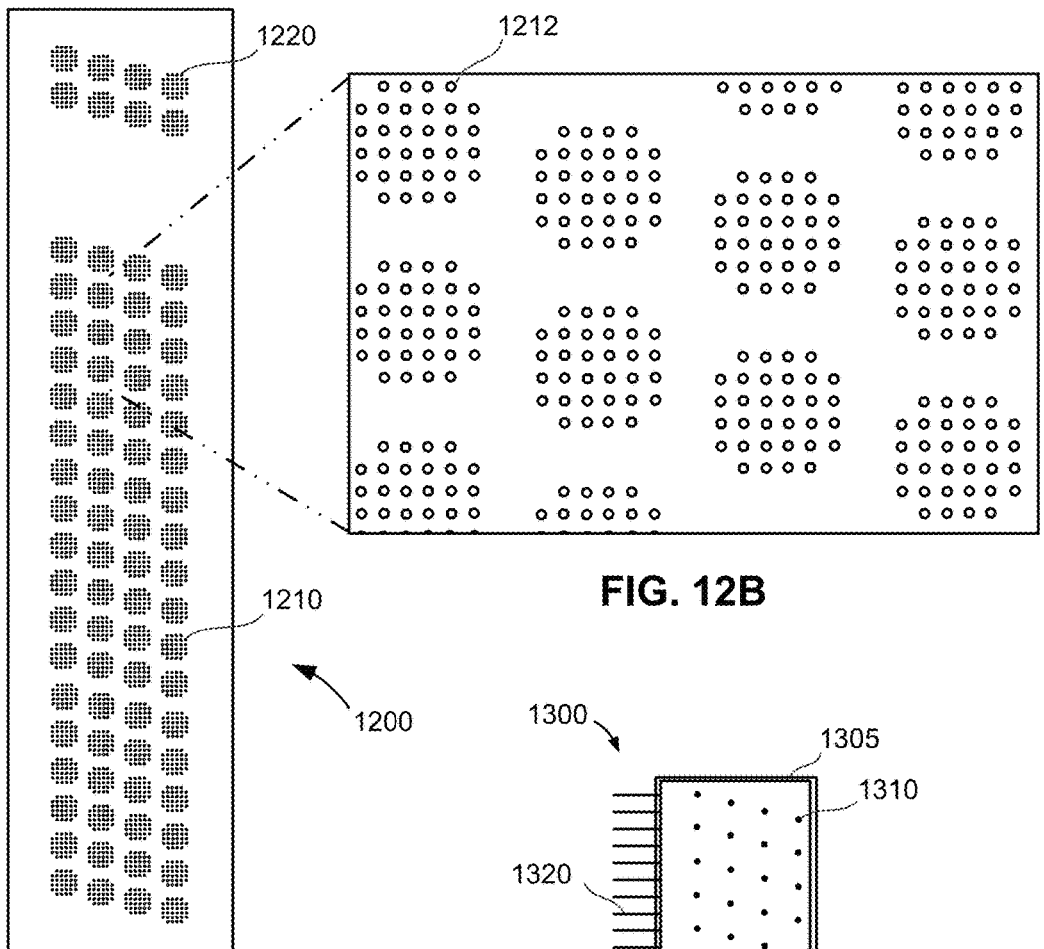
FIG. 12B
FIG. 12A
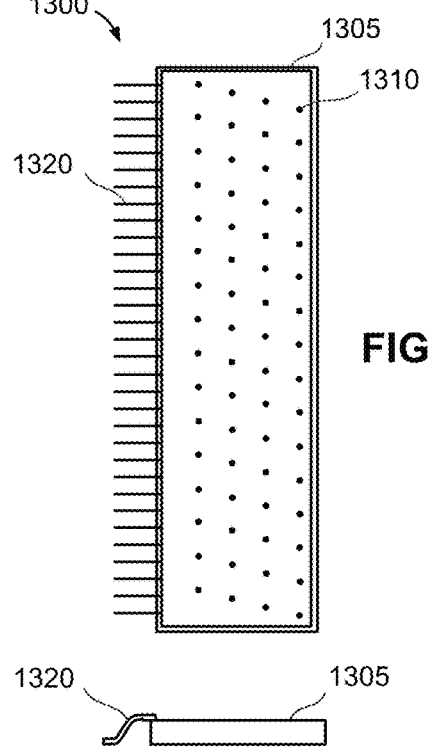
FIG. 13A
FIG. 13B

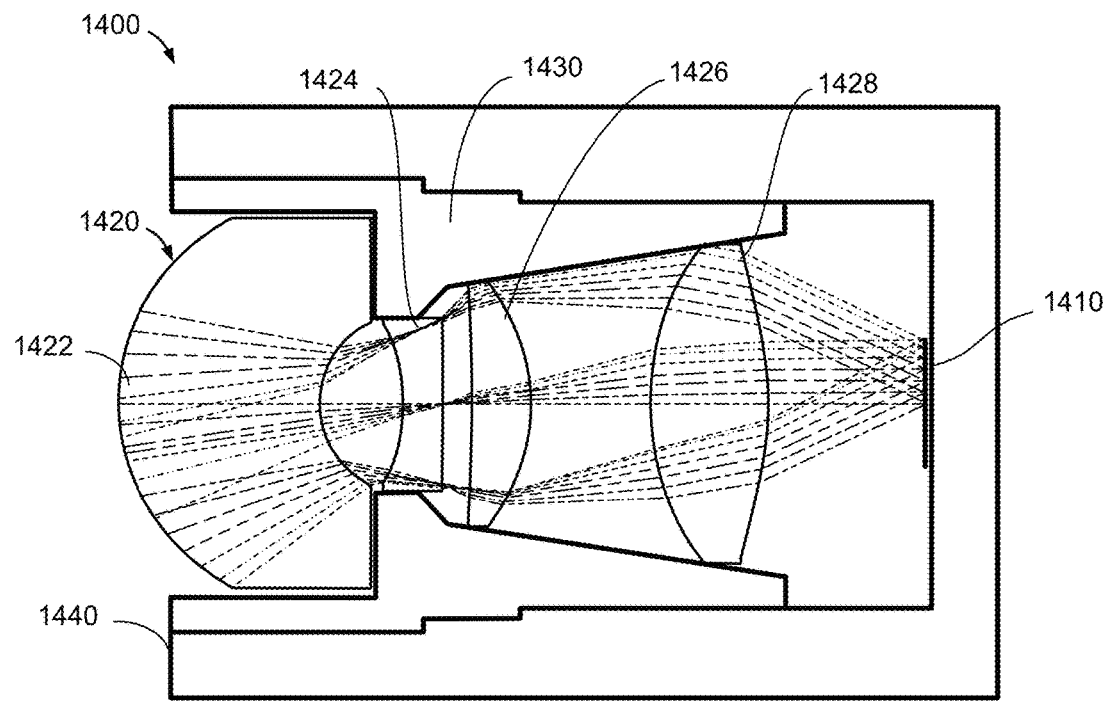
FIG. 14
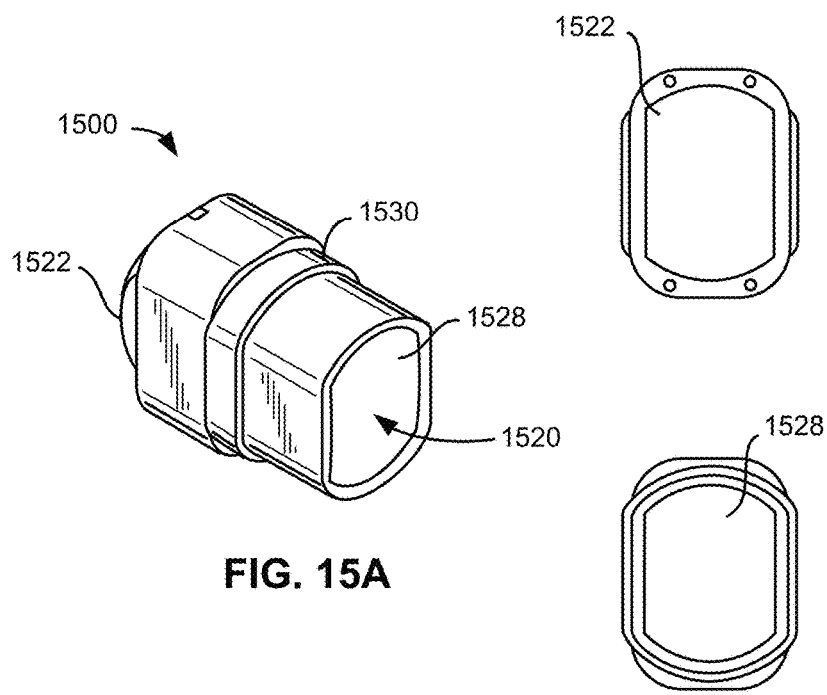
FIG. 15A
FIG. 15B
FIG. 15C

SECTION B-B

ROTATING COMPACT LIGHT RANGING SYSTEM

CROSS-REFERENCES TO RELATED APPLICATIONS

This application claims the benefit of U.S. Provisional Patent Application No. 62/596,018, entitled "Compact LIDAR System," filed Dec. 7, 2017, the disclosure of which is incorporated herein by reference in its entirety for all purposes.

This application is related to the following commonly assigned and concurrently filed patent applications, the disclosures of each of which are incorporated herein by reference in their entirety for all purposes: "Light Ranging System with Opposing Circuit Boards", U.S. patent application Ser. No. 16/209,869; "Rotating Light Ranging System with Optical Communication Uplink and Downlink Channels", U.S. patent application Ser. No. 16/209,875; and "Light Ranging Device with a Multi-element Bulk Lens System", U.S. patent application Ser. No. 16/209,879.

BACKGROUND

Light imaging, detection and ranging (LIDAR) systems measure distance to a target by illuminating the target with a pulsed laser light and measuring the reflected pulses with a sensor. Time-of-flight measurements can then be used to make a digital 3D-representation of the target. LIDAR systems can be used for a variety of applications where 3D depth images are useful including archaeology, geography, geology, forestry, mapping, construction, medical imaging and military applications, among others. Autonomous vehicles can also use LIDAR for obstacle detection and avoidance as well as vehicle navigation.

Many currently available LIDAR sensors that provide coverage and resolution sufficient for obstacle detection and avoidance in autonomous vehicles are both technologically complex and costly to manufacture. Such sensors can thus be too expensive to allow for wide deployment in mass-market automobiles, trucks and other vehicles. Overall component cost and manufacturing complexity of a particular type of LIDAR sensor is typically driven by the underlying complexities in the architecture of the LIDAR sensor itself. This can be further exacerbated in some modern LIDAR sensors which are a conglomeration of different internal sub-systems, each of which can be in itself quite complex, e.g., optoelectronic systems, electromechanical systems, computer control systems, high-speed communication systems, data processing systems, and the like.

To achieve the high positional accuracy, long distance range, and low power consumption that can be important to some modern sensing applications, stringent technical requirements for each one of these sub-systems have led to architectures and designs that are complex and difficult to build and often require expensive calibration and alignment procedures before individual LIDAR units can be used by a customer. For example, some LIDAR systems have internal architectures that employ one or more large motherboards and bulky, heavy optical systems that are mounted on a counter-balanced structural member, all within a turret that rotates at rates on the order of 1,000 RPM. In some of these systems, separate laser emitter/detector pairs are mounted to individual, separate circuit boards. Thus, each emitter board and receiver board can be required to be separately mounted to the motherboard, with each emitter/detector pair precisely aligned along a particular direction to ensure that the field of view of each detector overlaps with the field of view of the detector's respective emitter. As a result of the above architecture, precision alignment techniques are typically required during assembly to align each emitter board and each receiver board separately.

The above-described architecture becomes increasingly problematic when one desires to scale the resolution of the device. Increasing the resolution requires the addition of more laser emitter/detector pairs, again, each mounted on their own circuit board. Consequently, scaling the resolution linearly with this type of architecture can lead to exponential increases in manufacturing costs and also exponential reductions in reliability due to the sheer number of individual parts and boards involved. Once assembly and alignment is complete, great care must be taken that the precisely aligned multi-board arrangement is not disturbed or jolted out of alignment during shipping or at some other point over the design life of the system.

In addition to the complexities of alignment and assembly of the optical systems, most currently available LIDAR units have a relatively low overall degree of system integration. For example, control and drive circuits in many currently available LIDAR units are separate modules mounted to custom boards. These custom boards may, in turn, need to be mounted to a motherboard within the LIDAR unit or may be mounted somewhere else on a structural element of the LIDAR unit by way of one or more mounting brackets. In some cases, each board can have one or more electrical interconnects that need to be routed through one or more internal volumes or passages within the enclosure to eventually connect with the motherboard.

For rotating LIDAR systems even more additional specialized mounts and interconnects may be required for the electric motor rotor and/or stator. In addition to power connections, data uplink and downlink lines are needed and typically accomplished by one or more inductive, capacitive, and/or metal slip ring rotary couplers, which can be difficult to implement and/or lead to low rates of data transfer. Some systems employ metal brushes within the rotary coupler and are thus potentially unreliable due to the requirement of mechanical contact of the brushes within the rotary mechanism. Other slip ring-type connectors can employ hazardous substances, such as mercury, causing these types of couplers to be non-compliant under the Restriction of Hazardous Substances Directive 2002/95/EC (ROHS) and thus disfavored or even banned in some jurisdictions.

With respect to the optoelectronic systems, the industry has experienced challenges in incorporating cost-effective single photon photodetectors such as CMOS-based single photon avalanche diodes (SPADs) due to their low quantum efficiency in the near infrared wavelengths and their low dynamic range. To improve quantum efficiency, some SPAD-based detectors employ InGaAs technology but such systems are more challenging to integrate in a cost-effective manner than CMOS devices. Therefore, the external/supporting circuitry (e.g., a quenching circuit that can sense the leading edge of the avalanche current, generate a standard output pulse synchronous with the avalanche build-up, quench the avalanche by lowering the bias back down to the breakdown voltage, and then restore the photodiode to the operative level) associated with the SPAD detectors manufactured using InGaAs technology is typically fabricated separately from the SPAD array, for example, in a package that is external to the SPAD array. In addition, InGaAs substrates are relatively expensive and the associated manufacturing processes typically have a lower yield than silicon substrate manufacturing processes further compounding the costs increase. To complicate matters further, InGaAs substrates typically need to be actively cooled in order to reduce dark currents to suitable levels, which increases the amount of energy consumed during runtime, increasing cost and complexity even further.

Rather than employing SPAD-based detectors, many commercially available LIDAR solutions employ avalanche photodiodes (APDs). APDs are not binary detection devices, but rather, output an analog signal (e.g., a current) that is proportional to the light intensity incident on the detector and have high dynamic range as a result. However, APDs must be backed by several additional analog circuits including, for example, analog circuits such as transimpedance amplifiers and/or differential amplifiers, high-speed A/D converters, one or more digital signal processors (DSPs) and the like. Traditional APDs also require high reverse bias voltages not possible with standard CMOS processes. Without mature CMOS, it is difficult to integrate all this analog circuitry onto a single chip with a compact form factor and multiple external circuit modules located on a printed circuit board are usually employed which contributes to the high cost of these existing units.

Accordingly, to support growing markets for 3D sensing systems, there remains a need for more cost effective but still high performing LIDAR systems. Furthermore, there remains a need for improved and more elegant system architectures that enable streamlined assembly processes that can be effectively employed at scale.

SUMMARY

Embodiments of the disclosure pertain to a LIDAR unit that can, among other uses, be used for obstacle detection and avoidance in autonomous vehicles. Various embodiments of the disclosure can address one or more of the problems discussed above that are associated with some currently available LIDAR systems. Some specific embodiments pertain to LIDAR systems that include design features that enable the systems to be manufactured cheaply enough and with sufficient reliability and to have a small enough footprint to be adopted for use in mass-market automobiles, trucks and other vehicles.

In some embodiments, a spinning light ranging system according to the present disclosure can include a light ranging device (e.g., which emits light pulses and detects reflected pulses) that is connected to an upper circuit board assembly that rotates about an axis defined by a shaft. The upper circuit board assembly can cooperate with a lower circuit board assembly, e.g., to provide power, data, and/or encoded positions, via respective circuit elements. The inclusion of cooperating wireless circuit elements on the rotating upper board assembly and the lower board assembly (e.g., as opposed to external, physical connections) can provide for a more compact design. Further, specific circuit elements (e.g., optical or power) can be positioned in a manner to enable efficient communication and/or to increase flux. For example, a wireless power receiver can be provided at a ring at an outer edge of the upper circuit board assembly, maximizing the amount of magnetic flux captured by an inductive ring or maximizing the area available in a capacitive system.

According to some embodiments, an optical communications subsystem can provide an optical communications channel between a rotating light ranging device and a base subsystem that does not rotate about a shaft. The optical communications channel can provide for fast communications, but also can provide for a compact and inexpensive design. For instance, a turret optical communication component can be positioned on a rotating assembly to communicate data (e.g., ranging data from the light ranging device) with a base optical communication component. Such positioning can alleviate the need for more bulky communication mechanisms. For example, downlink transmitter can be positioned to transmit optical ranging data through a hollow shaft used for rotation. As another example, one or more uplink transmitters of the base subsystem can transmit uplink signals to one or more uplink receivers that rotate on a rotating assembly, e.g., where these uplink elements are positioned in rings that align.

According to some embodiments, a rotation of an upper circuit board assembly can be driven by stator and rotor elements integrated on upper and lower circuit boards, thereby making the light ranging system compact. For example, the upper circuit board assembly can include a plurality of rotor elements symmetrically arranged about a rotation shaft, and a lower circuit board assembly can include a plurality of stator elements symmetrically arranged about the shaft. A driver circuit can drive the stator elements. Having such rotor and stator elements built onto the circuit boards themselves provides various advantages over products that use bulkier motors (e.g., stepper motors, brushed motors or unintegrated brushless motors).

According to some embodiments, a light ranging system includes a shaft having a longitudinal axis; a first circuit board assembly that includes a stator assembly comprising a plurality of stator elements arranged about the shaft on a surface of the first circuit board assembly; a second circuit board assembly rotationally coupled to the shaft and spaced apart from and in an opposing relationship with the first circuit board assembly, wherein the second circuit board assembly includes a rotor assembly comprising a plurality of rotor elements arranged about the shaft on a surface of the second circuit board assembly such that the plurality of rotor elements are aligned with and spaced apart from the plurality of stator elements; a stator driver circuit disposed on either the second or the first circuit board assemblies and configured to provide a drive signal to the plurality of stator elements, thereby imparting an electromagnetic force on the plurality of rotor elements to drive a rotation of the second circuit board assembly about the longitudinal axis of the shaft; and a light ranging device mechanically coupled to the second circuit board assembly such that the light ranging device rotates with the second circuit board assembly.

In some embodiments a light ranging system includes a shaft; a first circuit board assembly that includes a stator assembly comprising a plurality of stator elements arranged about the shaft on a surface of the first circuit board assembly; a second circuit board assembly rotationally coupled to the shaft, wherein the second circuit board assembly includes a rotor assembly comprising a plurality of rotor elements arranged about the shaft on a surface of the second circuit board assembly such that the plurality of rotor elements are aligned with and spaced apart from the plurality of stator elements; a light ranging device coupled to rotate with the second circuit board assembly, the light ranging device including a light source configured to transmit light pulses to objects in a surrounding environment, and detector circuitry configured to detect reflected portions of the light pulses that are reflected from the objects in the surrounding environment and to compute ranging data based on the reflected portion of the light pulses; and a stator driver circuit disposed on either the second or the first circuit board assemblies and configured to provide a drive signal to the plurality of stator elements, thereby imparting an electromagnetic force on the plurality of rotor elements to drive a rotation of the second circuit board assembly about the shaft.

In some embodiments a light ranging system includes a stationary enclosure having an optically transparent window and a base; a hollow shaft disposed within the enclosure; a bearing system coupled to the hollow shaft; a first circuit board assembly disposed within the enclosure and parallel with a first plane perpendicular to the hollow shaft, the first circuit board assembly including a stator assembly comprising a plurality of evenly spaced stator elements arranged annularly about the shaft on a surface of the first circuit board assembly; a second circuit board assembly disposed within the enclosure parallel to the first plane and rotationally coupled to the shaft by the bearing system, wherein the second circuit board assembly includes a rotor assembly comprising a plurality of evenly spaced rotor elements arranged annularly about the shaft on a surface of the second circuit board assembly such that the plurality of rotor elements are aligned with and spaced apart from the plurality of stator elements; a light ranging device coupled to rotate with the second circuit board assembly within the stationary enclosure, the light ranging device including a light source configured to transmit light pulses through the window to objects in a surrounding environment, and detector circuitry configured to detect reflected portions of the light pulses received through the window that are reflected from the objects in the surrounding environment and to compute ranging data based on the reflected portion of the light pulses; and a stator driver circuit disposed on either the second or the first circuit board assemblies and configured to provide a drive signal to the plurality of stator elements, thereby imparting an electromagnetic force on the plurality of rotor elements to drive a rotation of the second circuit board assembly and the light ranging device about the shaft.

According to some embodiments a light ranging system includes a housing; a shaft defining an axis of rotation; a first circuit board assembly disposed within and coupled to the housing in a fixed relationship such that the first circuit board assembly is aligned along a first plane perpendicular to the axis of rotation, the first circuit board assembly including a plurality of first circuit elements disposed on a first circuit board; a second circuit board assembly spaced apart from the first circuit board assembly within the housing in a second plane parallel to the first plane and rotationally coupled to the shaft such that the second circuit board assembly rotates about the axis of rotation, the second circuit board assembly including a plurality of second circuit elements disposed on a second circuit board and aligned with and configured to function in wireless cooperation with at least one of the first plurality of circuit elements; and a light ranging device electrically connected to and coupled to rotate with the second circuit board assembly, the light ranging device configured to transmit light pulses to objects in a surrounding environment, to detect reflected portions of the light pulses that are reflected from the objects in the surrounding environment, and to compute ranging data based on the reflected portion of the light pulses.

In some embodiments, a light ranging system includes an enclosure having an optically transparent window; a shaft defining an axis of rotation through the enclosure; a first circuit board assembly disposed within and fixedly coupled to the enclosure and aligned perpendicular to the axis of rotation; a second circuit board assembly disposed within the enclosure and spaced apart from and in an opposing relationship with the first circuit assembly, the second circuit board assembly rotatably coupled to the shaft; a light ranging device coupled to the second circuit board assembly in a fixed relationship such that the light ranging device rotates with the second circuit board assembly around the shaft; an annular encoder comprising an annular encoder strip mounted on one of the first or second circuit boards and an encoder reader mounted on the other of the first or second circuit boards at a location facing and opposite the annular encoder strip; a wireless communication system comprising a first annular wireless communication component mounted to the first circuit board and a second annular wireless communication component mounted to the second circuit board at a location facing and opposite the first annular wireless communication component; and an annular wireless power transfer system comprising an annular wireless power transmitter mounted to the first circuit board and an annular wireless power receiver mounted to the second circuit board at a location facing and opposite the annular wireless power transmitter.

In some embodiments, a light ranging system includes an enclosure having an optically transparent window; a shaft defining an axis of rotation through the enclosure; a first circuit board assembly disposed within and fixedly coupled to the enclosure and aligned perpendicular to the axis of rotation; a second circuit board assembly disposed within the enclosure and spaced apart from and in an opposing relationship with the first circuit assembly, the second circuit board assembly rotatably coupled to the shaft; a light ranging device mounted to the second circuit board assembly such that the light ranging device rotates with the second circuit board assembly around the shaft, the light ranging device configured to transmit light pulses to objects in a surrounding environment, to detect reflected portions of the light pulses that are reflected from the objects in the surrounding environment, and to compute ranging data based on the reflected portion of the light pulses; an annular encoder comprising an annular encoder strip mounted on one of the first or second circuit boards and an encoder reader mounted on the other of the first or second circuit boards at a location facing and opposite the annular encoder strip; a wireless communication system comprising a first annular wireless communication component mounted to the first circuit board and a second annular wireless communication component mounted to the second circuit board at a location facing and opposite the first annular wireless communication component; an electric motor including a stator assembly comprising a plurality of stator elements arranged about the shaft on a surface of the first circuit board assembly and a rotor assembly comprising a plurality of rotor elements arranged about the shaft on a surface of the second circuit board assembly such that the plurality of rotor elements disposed at a location facing and opposite the plurality of stator elements; a stator driver circuit disposed on either the second or the first circuit board assemblies and configured to provide a drive signal to the plurality of stator elements, thereby imparting an electromagnetic force on the plurality of rotor elements to drive a rotation of the second circuit board assembly about the shaft; and an annular wireless power transfer system comprising an annular wireless power transmitter mounted to the first circuit board and an annular wireless power receiver mounted to the second circuit board at a location facing and opposite the annular wireless power transmitter.

According to some embodiments a light ranging system includes a shaft having a longitudinal axis; a light ranging device configured to rotate about the longitudinal axis of the shaft, the light ranging device including a light source configured to transmit light pulses to objects in a surrounding environment, and detector circuitry configured to detect reflected portions of the light pulses that are reflected from the objects in the surrounding environment and to compute ranging data based on the reflected portion of the light pulses; a base subsystem that does not rotate about the shaft; and an optical communications subsystem configured to provide an optical communications channel between the base subsystem and the light ranging device, the optical communications subsystem including one or more turret optical communication components connected to the detector circuitry and one or more base optical communication components connected to the base subsystem.

In some embodiments a light ranging system includes a housing having an optically transparent window; a hollow shaft having a longitudinal axis disposed within the housing; a light ranging device disposed within the housing and configured to rotate about the longitudinal axis of the shaft, the light ranging device including a light source configured to transmit light pulses through the optically transparent window to objects in a surrounding environment, and detector circuitry configured to detect reflected portions of the light pulses through the optically transparent window reflected from the objects in the surrounding environment and to compute ranging data based on the reflected portion of the light pulses; a base subsystem disposed within the housing that does not rotate about the shaft; and an optical communications subsystem disposed within the housing and configured to provide an optical communications channel between the base subsystem and the light ranging device, the optical communications subsystem including a first optical channel disposed within the hollow shaft and a second optical channel arranged annularly outside the hollow shaft.

In some embodiments, a light ranging system includes a housing having an optically transparent window; a hollow shaft having a longitudinal axis disposed within the housing; a light ranging device disposed within the housing and configured to rotate about the longitudinal axis of the shaft, the light ranging device including a light source configured to transmit light pulses through the optically transparent window to objects in a surrounding environment, and detector circuitry configured to detect reflected portions of the light pulses through the optically transparent window reflected from the objects in the surrounding environment and to compute ranging data based on the reflected portion of the light pulses; a base subsystem disposed within the housing that does not rotate about the shaft; a first optical communication channel configured to optically transmit data between the light ranging device and the base subsystem through the hollow shaft, the first optical communication channel including a first optical component coupled to circuitry coupled to rotate with the light ranging device and a second optical component coupled to circuitry disposed on the base subsystem; and a second, annular optical communication channel surrounding the hollow shaft and configured to optically transmit data between the light ranging device and the base subsystem, the annular optical communication channel including a first annular optical component coupled to circuitry coupled to rotate with the light ranging device and a second annular optical component coupled to circuitry disposed on the base subsystem.

According to some embodiments, a light ranging device can include a light emitting module and a light sensing module. The light emitting module can include a light source configured to transmit light pulses to objects in a surrounding environment. The light sensing module can include a lens housing; a bulk lens system coupled to the lens housing and configured to receive light from the surrounding environment and focus the received light to a focal plane, the bulk lens system comprising a first lens, a second lens, and a third lens mounted in the lens housing; wherein the first lens, the second lens, or the first lens and the second lens are plastic; and wherein the third lens is glass; an array of photosensors configured to receive light from the bulk lens system and detect reflected portions of the light pulses that are reflected from the objects in the surrounding environment; and a mount that mechanically couples the lens housing with the array of photosensors, wherein the lens housing, the bulk lens system, and the mount are configured to passively focus light from the bulk lens system onto the array of photosensors over a temperature range. In some instances the lens housing, the bulk lens system, and the mount are configured to match, as a function of temperature, a focal length of the lens system with an expansion coefficient of the lens housing and with an expansion coefficient of the mount so that light is passively focused onto the array of photosensors over the temperature range, such as −5 degrees C. to 70 degrees C.

In some embodiments, a light ranging system includes an enclosure having an optically transparent window, a light ranging device disposed within the enclosure and circuitry configured to compute ranging data. The light ranging device can include an optical transmitter comprising a bulk transmitter lens system and a plurality of transmitter channels, each channel including a light emitter configured to generate and transmit pulses of narrowband light through the bulk transmitter optic and through the optically transparent window into a field external to the light ranging system; and an optical receiver comprising a bulk receiver lens system, a lens housing and a plurality of micro-optic receiver channels, each micro-optic channel including an aperture coincident with a focal plane of the bulk receiver optic, a collimating lens behind the aperture, an optical filter behind the collimating lens and a photosensor responsive to incident photons passed through the aperture into the collimating lens and through the filter. The bulk receiver lens system can include a first lens, a second lens, and a third lens mounted in the lens housing; wherein the first lens, the second lens, or the first lens and the second lens are plastic; the third lens is glass; and a coefficient of thermal expansion (CTE) of the lens housing is matched, over a temperature range, with the bulk receiver lens system so that the focal plane is stable relative to each photosensor in the plurality of micro-optic receiver channels over the temperature range. In some instances the temperature range is from 20 degrees C. to 70 degrees C. and in some instances the temperature range is from −5 degrees C. to 70 degrees C.

In some embodiments an image sensing device is provided. The image sensing device can include a lens housing; a bulk lens system mechanically coupled to the lens housing and configured to receive light from the surrounding environment and focus the received light to a focal plane. The bulk lens system can include a first lens, a second lens, and a third lens mounted in the lens housing, wherein the first lens, the second lens, or the first lens and the second lens are plastic and wherein the third lens is glass. The image sensing device can further include an array of photosensors configured to receive light from the bulk lens system, and a mount that mechanically couples the lens housing with the array of photosensors. The coefficient of thermal expansion (CTE) of the lens housing can be matched, over a temperature range, with the bulk lens system so that the focal plane is stable relative to the array of photosensors over the temperature range. In some instances the temperature range is from 20 degrees C. to 70 degrees C. and in some instances the temperature range is from −5 degrees C. to 70 degrees C.

And, in some embodiments, a CTE of the mount is matched with the CTE of the lens housing.

These and other embodiments of the invention are described in detail below. Additionally, other aspects and advantages of various embodiments of the disclosure will become apparent from the following detailed description taken in conjunction with the accompanying drawings which illustrate, by way of example, the principles of the described embodiments.

BRIEF DESCRIPTION OF THE DRAWINGS

FIG. 6D shows a top view of a stator board in accordance with one or more embodiments;

FIG. 6E shows a bottom view of a rotor board in accordance with one or more embodiments;

FIG. 6F is a simplified cross-sectional view of a portion of a multi-coil wireless power receiver positioned within an annular ferrite channel according to some embodiments;

FIGS. 8A and 8B show an exploded view of a LIDAR system according to some embodiments;

FIG. 12A-12B shows top views of a SPAD-based detector according to some embodiments;

FIGS. 13A and B show simplified top and side views of a VCSEL chip transmitter according to some embodiments;

FIG. 14 depicts a simplified schematic of an embodiment of a LIDAR bulk optical system;

FIGS. 15A, 15B, and 15C depict an embodiment of a bulk optics lens assembly;

TERMS

Figure 1A:
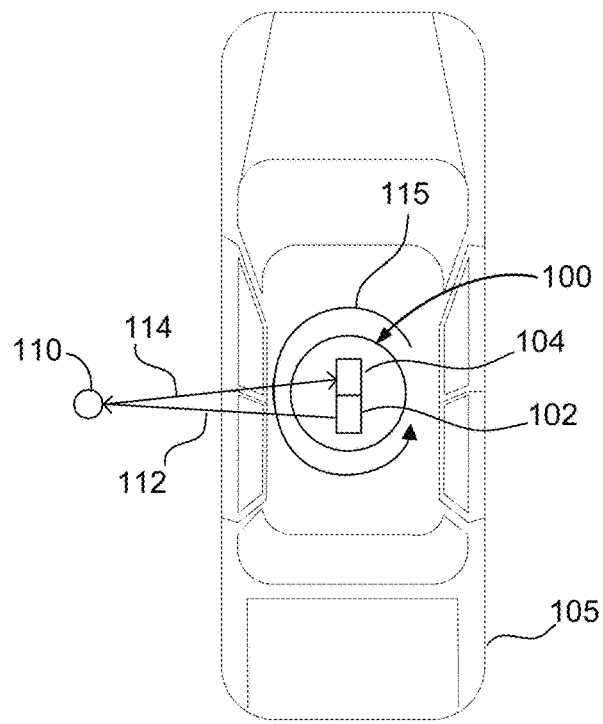
FIGS. 1A-1B show a rotating light ranging system and a non-rotating, solid-state light ranging system, respectively, that can be used in automotive applications according to some embodiments.

Unless defined otherwise, technical and scientific terms used herein have the same meaning as commonly understood by a person of ordinary skill in the art. The following definitions, however, are provided to facilitate understanding of certain terms used frequently and are not meant to limit the scope of the present disclosure. Abbreviations used herein have their conventional meaning within the relevant arts.

The term ranging data may refer to any data that can be transmitted from a laser ranging device, e.g., a turret component of a rotating LIDAR system. Examples of ranging data include range information, e.g. distance to a given target point at a certain angle (azimuth and/or zenith), range-rate or velocity information, e.g. the derivative of the ranging data with respect to time, and also operational information such as signal-to-noise ratio (SNR) of return or signal intensity, target reflectivity, ambient NIR levels coming from each pixel field of view, diagnostic information including temperature, voltage levels, etc. In some embodiments, ranging data can include RGB information from an RGB camera that is located in the turret, e.g., a high speed read-out camera such as a line scan camera or thermal imager.

The term turret can refer to the rotating part or portion of a rotating LIDAR system. Turret components include any rotating component or circuit boards in the turret portion of the LIDAR system and can include one or more components located in a light ranging device and/or one or more components located on a rotating circuit board of a rotary actuator.

In the context of a rotating LIDAR system (sometimes referred to herein as a "spinning LIDAR system"), the term base can refer to the non-rotating part or non-rotating portion of the rotating LIDAR system. Base components include any non-rotating component or circuit boards in the base portion of the LIDAR system and can include one or more components located in a base assembly and/or one or more components located on a non-rotating circuit board of a rotary actuator.

The terms upper and lower refer to the position, or relative position, of components along the axis of rotation of a LIDAR system. In some embodiments, upper components, also referred to as turret components, are located on the turret of the LIDAR system while lower components, also referred to as base components, are located on the base of the LIDAR system.

The term ring includes not just circular shapes but also shapes that are slightly non-circular, e.g., elliptical, and arranged circumferentially around a central axis, including perturbations or oscillations (e.g., wavy) at a circumference.

One or more shapes that are referred to as symmetric can include both perfectly symmetric shapes as well as shapes that are generally but not perfectly symmetric. Arrangements of electronic components described herein may operate most efficiently in a symmetric configuration, however, the term symmetric does not exclude those configurations that are slightly asymmetric, or have a slight deviation from symmetric even if those configurations do not result in the optimal operational configuration.

The term parallel is not limited to perfectly parallel but includes also those geometrical arrangements and configurations that are substantially parallel as a result of manufacturing variations, e.g., two elements that are referred to herein as being parallel may have an angle between −5 and 5 degrees or −1 and 1 degrees between the two elements depending on the manufacturing tolerance employed.

The term perpendicular is not limited to perfectly perpendicular but includes also those geometrical arrangements and configurations that are substantially perpendicular as a result of manufacturing variations, e.g., two elements that are referred to herein as being perpendicular may have an angle between 85 and 95 degrees between the two elements.

The term photosensor (or just sensor) refers to a sensor that can convert light into an electrical signal (e.g., an analog electrical signal or binary electrical signal). An avalanche photodiode (APD) is one example of a photosensor. A single photosensor can include a plurality of smaller "photodetectors". Thus, a plurality of single-photon avalanche diodes (SPADs) can be another example of a photosensor where each individual SPAD in the plurality of SPADs (e.g., each SPAD in an array of SPADs) can be referred to as a photodetector. The term sensor array can sometimes refer to a sensor chip that includes an array of multiple sensors. Additionally, the term pixel is sometimes used interchangeably with photosensor or sensor.

The term transmitter can refer to a structure that includes one or more light transmitting elements, e.g., LED, laser, VCSEL, and the like. The term transmitter can also include a transmitter chip that includes an array of transmitters, sometimes referred to as an emitter array.

The term bulk optic(s) refers to single lenses and/or lens assemblies that include one or more macroscopically-sized optics, e.g., with diameters on the order of centimeters or greater, such as those used in commercially available camera lenses and microscope lenses. In this disclosure, the term bulk optics is contrasted with the term micro-optics which refers to optical elements or arrays of optical elements having individual element diameters that are on the order of a few micrometers to a few millimeters in size or smaller. In general, micro-optics can modify light differently for different emitters and/or different detectors of an array of emitters or an array of detectors, whereas the bulk optics modify light for the entire array.

As used herein, the term image space telecentric optics module refers to an optical system (bulk or otherwise) where, at the image plane, all (or substantially all) of the chief rays from within the aperture of the lenses are incident on the image plane "straight on", or at a zero angle of incidence, within a specified tolerance (e.g., +/−2 degrees).

DETAILED DESCRIPTION

According to certain embodiments, methods and systems disclosed herein relate to a compact light ranging and detection (LIDAR) system and methods of assembly of a compact LIDAR system. The LIDAR system can include a modular light ranging device and an optional highly compact and integrated rotary actuator. The modular light ranging device can operate as a stand-alone non-rotating solid state LIDAR or, if connected to the integrated rotary actuator, can operate as part of a turret of a rotating LIDAR. The light ranging device can include a light transmission module (sometimes referred to as a "light emitting module") for illuminating objects in a field located around the light ranging module and also includes a light sensing module for sensing reflected or scattered portions of the illuminating light pulses for use in computing a 3D depth image. The light ranging module can also include a detector chip (e.g., a CMOS chip) that includes an array of photosensors, each of which can be, for example, an array of SPADs.

In some embodiments, the rotary actuator includes an upper circuit board assembly (also referred to herein as a turret, or rotating circuit board assembly) and a base circuit board assembly (also referred to herein as a stationary circuit board assembly). The various circuit boards of the rotary actuator can be highly integrated in the sense that many of the functional and/or supporting electronic and optical components of the LIDAR system can be mounted directly to one or more boards of the rotary actuator. For example, the base controller of the LIDAR system that can control various emission parameters of the light transmission module can be mounted on a board of the base circuit board assembly of the rotary actuator. Furthermore, power can be provided to the light ranging module by way of a wireless power transmission system that is also integrated onto a board of the rotary actuator. Communication between the base controller and the light ranging module and vice versa can be enabled by way of an optical uplink channel and an optical downlink channel where the electrical and optical components that support the optical uplink/downlink channels are also integrated onto one or more circuit boards of the rotary actuator.

In some embodiments, these same boards include electric motor components integrated onto one or more surfaces of the upper and lower circuit board assemblies of the rotary actuator. For example, an electric motor stator can be bonded directly to a surface of the lower circuit board assembly of the rotary actuator along with other electrical components, e.g., a group of optical uplink transmitters, an optical downlink receiver, and a wireless power transmitter. Likewise, an electric motor rotor can be bonded directly to a surface of the upper circuit board assembly of the rotary actuator along with other electrical components, e.g., a group of optical uplink receivers, an optical downlink transmitter, an optical or magnetic rotary encoder reader, and a wireless power receiver.

In some embodiments, the upper circuit board assembly can include one or more connectors, also bonded to a surface of the upper circuit board assembly, to connect the light ranging module to the upper circuit board assembly. Additionally, the rotary actuator can also include additional computational resources, one or more FPGAs, ASICs, microprocessors, and the like, that can be used by the light ranging module to perform data processing on the acquired data.

In view of the high level of systems integration in the compact LIDAR disclosed herein, a fully functioning system can be assembled by simply attaching the light ranging module to the rotary actuator. There is no need for a separate electric motor module, separate communications module, separate power modules, etc.

In some embodiments, the architecture of the rotary actuator lends itself to an elegant method of assembly. For example, the system can be architected such that the electrical components, including communications components, electric motor components, and wireless power components are arranged circumferentially and concentrically around a central axis of the system or even coaxially with the axis of the system. The central axis can also be collinear with the axis of rotation of the upper circuit board assembly, or turret. One or more boards of the rotary actuator can include a central hole that is configured to receive a shaft that can be attached (directly or indirectly) to a lower portion, or base, of a fixed enclosure. In some embodiments, the shaft defines the axis of rotation of the system and one or more bearings attached thereto provide for rotational movement of the upper circuit board assembly relative to the lower circuit board assembly.

In view of the above architecture, assembly of the rotary actuator in some embodiments can be reduced to dropping successive boards in place on the shaft. Because a subset of the electrical components (such as the communications components, electric motor components, and wireless power components) are arranged circumferentially around a central axis of the system these systems can operate effectively without the need for complex alignment procedures once the assembly is complete.

In some embodiments, the system employs a thermally stable image-space telecentric optics module employed within the light transmission module or the light sensing module, or both. The thermally stable image-space telecentric optics module can be engineered to have an image plane that is stable in space relative to transmitter or sensor chip that includes an array of transmitters and/or sensors of the light transmission module or light sensing module, respectively. The coefficients of thermal expansion of a lens housing and of the optical elements within the lens housing, along with the change in refractive index with respect to temperature, can be chosen to provide for the thermally stable image plane. In various embodiments, the individual optics in the optical system may be glass and/or plastic to provide for an economical yet thermally stable design.

A modular light ranging device according to some embodiments of the disclosure includes a set of vertical-cavity surface-emitting lasers (VCSELs) as illumination sources that emit pulses of radiation into a field and includes arrays of single-photon avalanche diode (SPAD) detectors as a set of pixels (photosensors) that detect radiation reflected or scattered from a surface in the field. As stated above, SPADs have a relatively low dynamic range as compared to APDs that are used in some currently available LIDAR sensors. The low dynamic range inherent to SPADs is due, in part, to the physics of how a SPAD detects a photon—they are so-called Geiger mode devices that, for each photon detection event, produce a binary electrical signal (photon detected or not detected) in the form of an avalanche current pulse. Using VCSELs as the emitters and SPADs as the detectors enables multiple measurements to be taken at the same time (i.e., the VCSEL emitters can be fired simultaneously) and also enables the set of emitters and the set of photosensors to each be fabricated using standard CMOS processes on a single chip, greatly simplifying the manufacturing and assembly process. Using VCSELs and SPADs in certain embodiments presents challenges, however, that various embodiments of the invention overcome. For example, VCSELs are much less powerful than the lasers used in some currently available LIDAR sensors and SPADs are much less efficient than the detectors used in some LIDAR sensors. To address these challenges, as well as challenges presented by firing multiple emitters simultaneously, certain embodiments of the disclosure can include optical components to enhance the brightness of the VCSEL emitter as well as various optical components (e.g., lenses, filters, and an aperture layer), which may work in concert with multiple arrays of SPADs, each array corresponding to a different photosensor, as described herein.

I. Illustrative Automotive LIDAR System

Figure 1B:
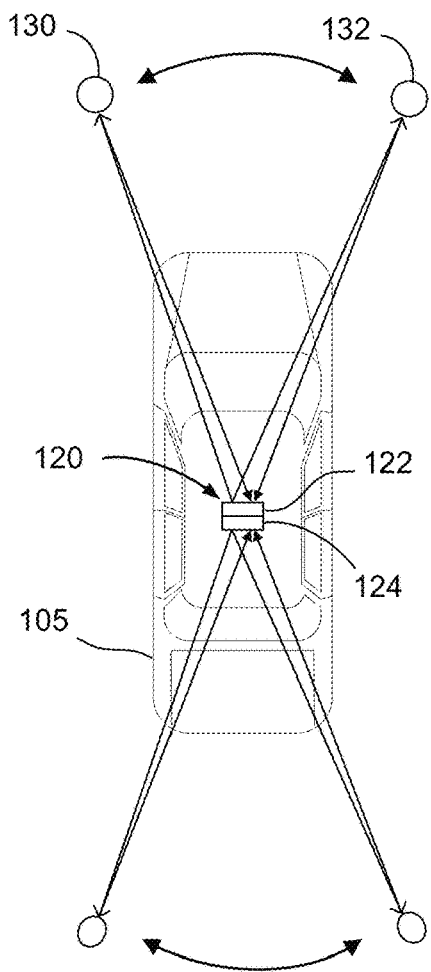

FIGS. 1A-1B show automotive light ranging devices, also referred to herein as LIDAR systems, according to some embodiments. The automotive application for the LIDAR systems is chosen here merely for the sake of illustration and the sensors described herein may be employed in other types of vehicles, e.g., boats, aircraft, trains, etc., as well as in a variety of other applications where 3D depth images are useful, such as medical imaging, geodesy, geomatics, archaeology, geography, geology, geomorphology, seismology, forestry, atmospheric physics, laser guidance, airborne laser swath mapping (ALSM), and laser altimetry. According to some embodiments, a LIDAR system, e.g., scanning LIDAR system 100 and/or solid state LIDAR system 120, can be mounted on the roof of a vehicle 105 as shown in FIGS. 1A and 1B. In other embodiments one or more LIDAR sensors can be mounted on other locations of a vehicle including, but not limited to, the front or back of the vehicle, the sides of the vehicle and/or corners of the vehicle.

The scanning LIDAR system 100 shown in FIG. 1A can employ a scanning architecture, where the orientation of the LIDAR light transmission module 102 (e.g., light source for emitting laser pulses) and/or light sensing module 104 (e.g., detector circuitry for detecting reflected pulses to determine distance to an object) can be scanned around one or more fields of view 110 within an external field or scene that is external to the vehicle 105. In the case of the scanning architecture, the emitted light 112 can be scanned over the surrounding environment as shown. For example, the output beam(s) of one or more light sources (such as infrared or near-infrared pulsed IR lasers, not shown) located in the scanning LIDAR system 100, can be scanned, e.g., rotated, to illuminate a scene around the vehicle. In some embodiments, the scanning, represented by rotation arrow 115, can be implemented by mechanical means, e.g., by mounting the light emitters to a rotating column or platform. In some embodiments, the scanning can be implemented through other mechanical means such as through the use of galvanometers. Chip-based steering techniques can also be employed, e.g., by using microchips that employ one or more MEMS based reflectors, e.g., such as a digital micromirror (DMD) device, a digital light processing (DLP) device, and the like. In some embodiments, the scanning can be effectuated through non-mechanical means, e.g., by using electronic signals to steer one or more optical phased arrays.

For a stationary architecture, like the solid state LIDAR system 120 shown in FIG. 1B, one or more solid state LIDAR subsystems (e.g., light transmission module 122 and light sensing module 124) can be mounted to the vehicle 105. Each solid state LIDAR unit can face a different direction (possibly with partially and/or non-overlapping fields of views between units) so as to capture a composite field of view that is larger than each unit is capable of capturing on its own.

In either the rotating or stationary architectures, objects within the scene can reflect portions of the light pulses that are emitted from the LIDAR light sources. One or more reflected portions then travel back to the LIDAR system and can be detected by the detector circuitry. For example, reflected portion 114 can be detected by detector circuitry 104. The light transmission module can be disposed in the same housing as the light sensing module. Aspects of the scanning system and stationary system are not mutually exclusive and thus can be used in combination. For example, the individual LIDAR subsystems 122 and 124 in FIG. 1B can employ steerable emitters such as a MEMS oscillating mirror or the whole composite unit may rotate through mechanical means thereby scanning the entire scene in front of the LIDAR system, e.g., from field of view 130 to field of view 132.

Figure 2A:
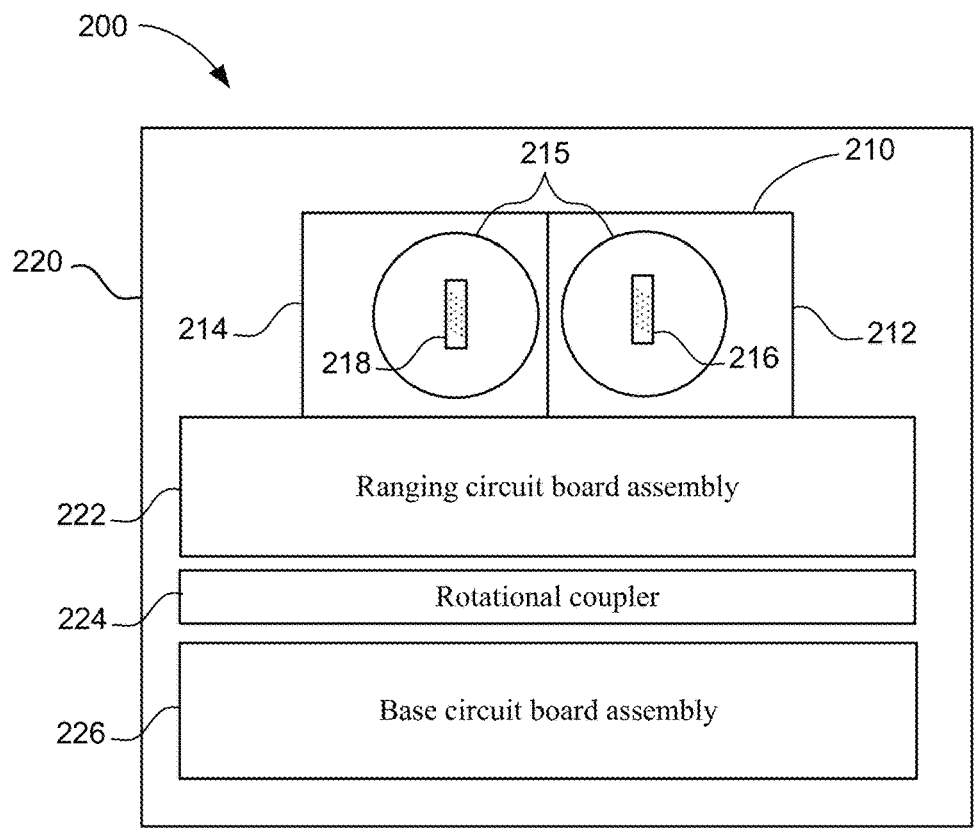
FIGS. 2A-2B show high level block diagrams of rotating and solid-state LIDAR systems, respectively, according to some embodiments.
Figure 2B:
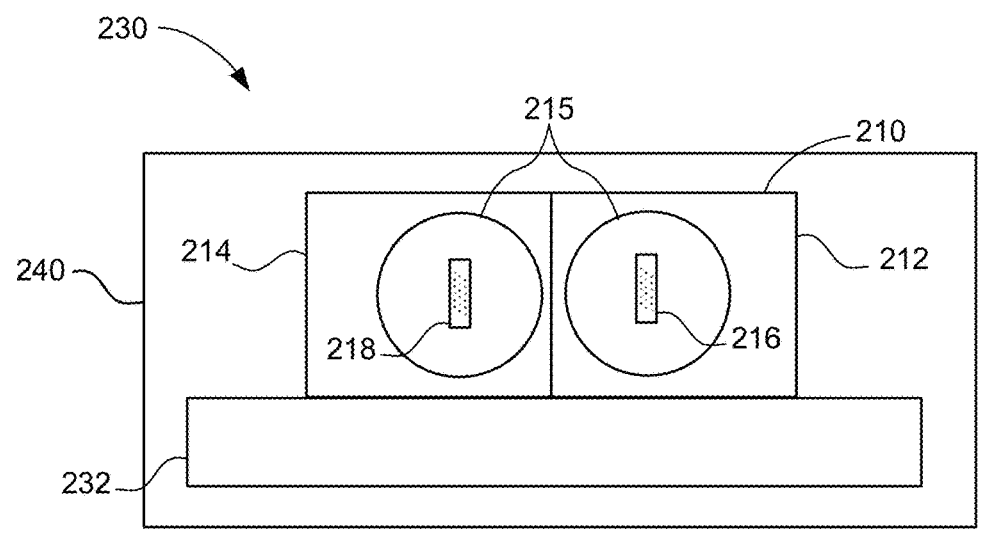

FIGS. 2A-2B show high level block diagrams of a rotating LIDAR system 200 and a stationary solid state LIDAR system 230, respectively, according to some embodiments.

Both systems employ a light ranging device 210 that includes a light transmission module 212 and a light sensing module 214. The light transmission and sensing modules 212 and 214 can each include bulk optics 215, e.g., a multi-element lens assembly positioned at the input/output of the sensing and transmission modules, respectively. Light transmission module 212 can further include a micro-optics array and optional notch filter element (not shown) that is located between the bulk optics 215 and light emitter circuitry 216. In some embodiments, light emitter circuitry 216 includes a chip-scale array of light sources, such as an array of vertical cavity surface emitting lasers (VCSELs) on an Indium Gallium Arsenide (InGAs) substrate. Light sensing module 214 can also include a micro-optics array and notch filter element (not shown) that is located between the bulk optics 215 and light detector circuitry 218. In some embodiments, light detector circuitry 218 can includes a chip-scale array of photon detectors, such as an array of single photon avalanche diodes (SPADS) fabricated in a CMOS technology. Other detector technologies can be employed as well, e.g., avalanche photodiodes, CCD image sensors, CMOS photodiode image sensors, cavity enhanced photodetectors, surface enhanced photodetectors, and the like.

Turning to FIG. 2A, in rotating LIDAR system 200, light ranging device 210 can be electrically connected to a turret circuit board assembly 222 (also referred to herein as an upper circuit board assembly or ranging circuit board assembly). Circuit board assembly 222 can be considered ranging to the extent that it is connected to light ranging device 210. As described in more detail in FIG. 3 below, the turret circuit board assembly 222 can include a number of circuit elements including one or more processors and memory. For example, the turret circuit board assembly 222 can include a field programmable gate array (FPGA) and or one or more application specific integrated circuits (ASICs) that are tailored to provide certain LIDAR functionality. In some embodiments, the light ranging device 210 can be hard wired to the turret circuit board assembly 222 via a multi-pin electrical connector or may be wirelessly connected, e.g., through a communication channel employing optical or RF connections, to the turret circuit board assembly 222.

Turret circuit board assembly 222 can be disposed directly above a base circuit board assembly 226. In some embodiments, the base circuit board assembly 226 can wirelessly transmit power to the turret circuit board assembly 222 to, for example, power light ranging device 210 and any other associated circuitry (e.g., ASICS, FPGAs, communications circuits and the like). In addition, optical, inductive, and/or capacitive communications channels can connect the base circuit board assembly 226 to turret circuit board assembly 222 thereby allowing for the light ranging device 210 to be controlled via contactless data transfer from the base circuit board assembly.

In the embodiment shown in FIG. 2A, turret circuit board assembly 222 is rotationally coupled to base circuit board assembly 226 through a rotational coupler 224. Rotational coupler 224 enables light ranging device 210 and turret circuit board assembly 222 to rotate a full 360 degrees within a housing 220 of LIDAR system 200. Rotation of the light ranging device 210 allows the system to acquire data that can be used to construct a full 360 field-of-view 3D map of a volume around the device. In some embodiments, the base circuit board assembly 226 can be coupled to the housing 220, for example, by way of a mechanical bracket and screws (not shown), such that base circuit board assembly 226 is held stationary and does not rotate relative to housing 220. Housing 220 can be a waterproof housing that protects light ranging device 210 and other internal components of LIDAR system 200 from moisture and various elements of the environment that LIDAR system 200 operates within.

Rotational coupler 224 can be implemented in a number of different ways in various embodiments. For example, some embodiments can employ a shaft and bearing structure. In some embodiments, rotational coupler 224 also includes one or more components for a rotary actuator that not only allows for rotational movement but also drives the rotational movement of the turret circuit board assembly 222. For example, an electric motor rotor assembly including an arrangement of rotor elements (e.g., permanent magnets), can be directly integrated into the turret circuit board assembly 222, and an electric motor stator assembly including an arrangement of stator elements, such as solenoid coils, can be directly integrated into the base circuit board assembly 226. In such embodiments, where one or more rotary actuation components are integrated into the base circuit board assembly 226 and/or the turret circuit board assembly 222, a separate module for rotary actuation is no longer needed. As a result, embodiments of the LIDAR system disclosed herein can have a more compact form factor and much simplified assembly process than spinning LIDAR systems that employ a separate electric motor module.

FIG. 2B is a simplified block diagram of a stationary solid state LIDAR system 230 according to some embodiments. Like rotating LIDAR system 200 shown in FIG. 2A, stationary solid state LIDAR system 230 includes a light ranging device 210 housed within a waterproof housing 240. Light ranging device 210 can be directly connected to a base circuit board assembly 232 within housing 240. Since system 230 does not rotate light ranging device 210, there is no need for a separate rotating turret circuit board assembly or a rotational coupler. Accordingly, the circuitry that was previously distributed amongst the turret circuit board assembly 222 and the base circuit board assembly 226 can be integrated entirely into the single base circuit board assembly 232 and/or shared amongst the circuitry associated with the light sensing module 214 and/or transmission module 212.

In some embodiments, for either of the embodiment shown in FIGS. 2A-2B, the hardware and software/firmware for performing one or more LIDAR-specific operations (e.g., photon time series accumulation followed by peak detection and ranging data computation and output) can be incorporated into the circuitry of light ranging device 210 and/or one or more of the circuit board assemblies (e.g., turret circuit board assembly 222 and/or base circuit board assembly 226 for LIDAR system 200, or base circuit board assembly 232 for LIDAR system 230). For example, in some embodiments, the light detector circuitry 218 may also include an ASIC that is integrated onto the same substrate as the array of SPADs. In such a situation, the light ranging device 210 is modular in the sense that a reprogramming/reconfiguring of the software/firmware can allow the light ranging device 210 to operate as part of a rotating LIDAR system (like LIDAR system 200 shown in FIG. 2A) or as a stand-alone solid state LIDAR system (like LIDAR system 230 shown in FIG. 2B). As already mentioned above, circuitry can be employed (e.g., MEMS, DMD, optical phased arrays, and the like) that will also allow for beam steering without the need for a mechanical rotational actuator. Accordingly, the modular design of the system disclosed herein results in a highly adaptable system that can fit user needs without expensive and time consuming redesign of the overall hardware and mechanical architecture.

II. Detailed Block Diagram

Figure 3:
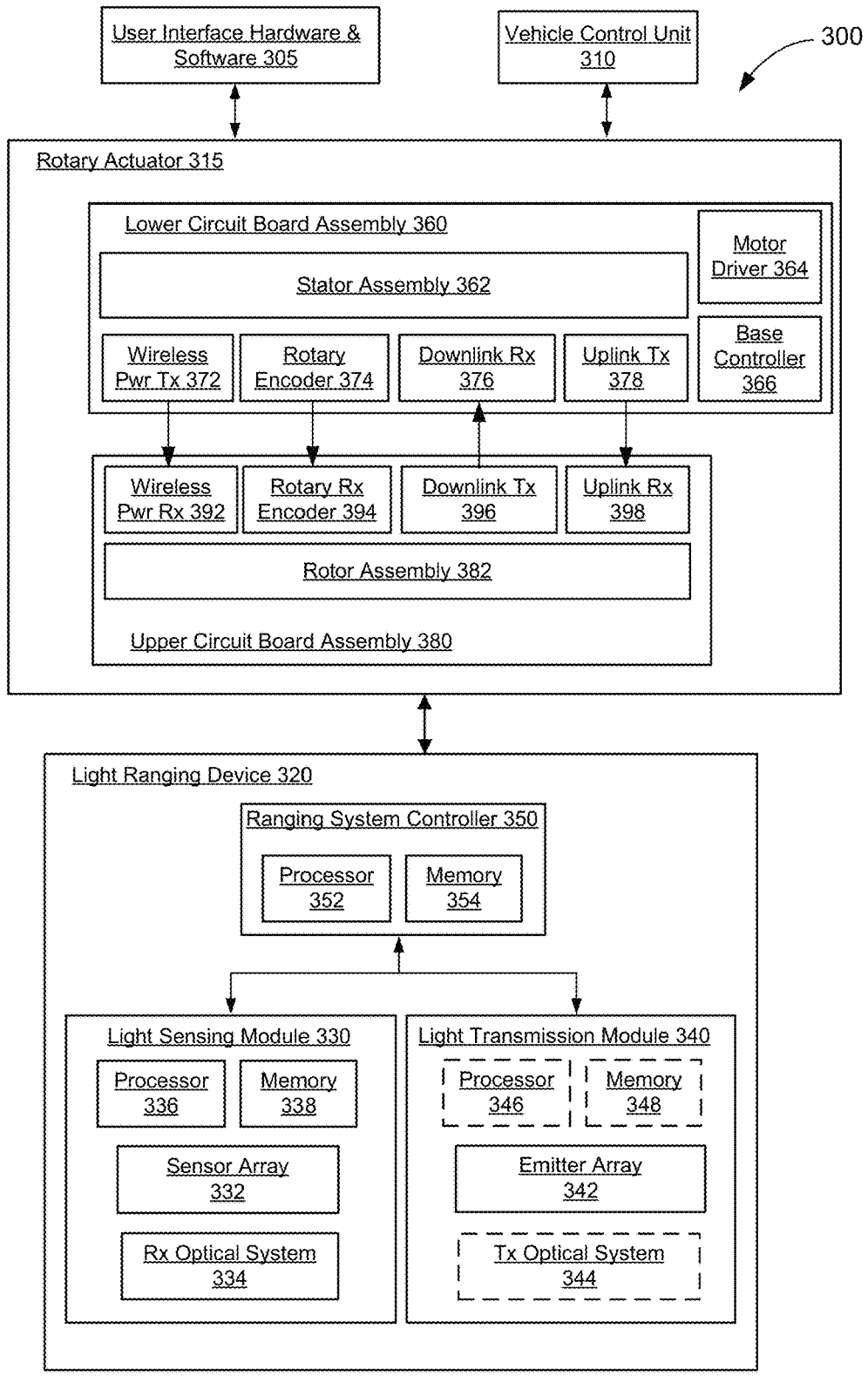
FIG. 3 illustrates a more detailed block diagram of a rotating LIDAR system 300 according to some embodiments like those described above in reference to FIG. 2A.

FIG. 3 illustrates a more detailed block diagram of a rotating LIDAR system 300 according to some embodiments like those described above in reference to FIG. 2A. More specifically, rotating LIDAR system 300 can optionally employ a rotary actuator with wireless data and power transmission and reception capabilities. In some embodiments, the rotary actuator includes a rotor that is integrated onto a surface of a rotating circuit board and a stator that is integrated onto a surface of a stationary circuit board and both board assemblies are equipped with wireless power and data transfer capabilities.

Rotating LIDAR system 300 shown in FIG. 3 includes two main modules: a light ranging device 320 and a rotary actuator 315 described in detail below. Additionally, rotating LIDAR system 300 can interact with one or more instantiations of user interface hardware and software 305. The different instantiations of user interface hardware and software 305 can vary and may include, e.g., a computer system with a monitor, keyboard, mouse, CPU and memory; a touch-screen in an automobile; a handheld device with a touch-screen; or any other appropriate user interface. The user interface hardware and software 305 may be local to the object upon which rotating LIDAR system 300 is mounted but can also be a remotely operated system. For example, commands and data to/from rotating LIDAR system 300 can be routed through a cellular network (LTE, etc.), a personal area network (Bluetooth, Zigbee, etc.), a local area network (WiFi, IR, etc.), or a wide area network such as the Internet.

The user interface hardware and software 305 can present the LIDAR data from the device to the user but can also allow a user to control the rotating LIDAR system 300 with one or more commands. Example commands can include commands that activate or deactivate the LIDAR system, specify photo-detector exposure level, bias, sampling duration and other operational parameters (e.g., for emitted pulse patterns and signal processing), specify light emitters parameters such as brightness. In addition, commands can allow the user to select the method for displaying results. The user interface can display LIDAR system results which can include, e.g., a single frame snapshot image, a constantly updated video image, and/or a display of other light measurements for some or all pixels such as ambient noise intensity, return signal intensity, calibrated target reflectivity, target classification (hard target, diffuse target, retroreflective target), range, signal to noise ratio, target radial velocity, return signal temporal pulse width, signal polarization, noise polarization, and the like. In some embodiments, user interface hardware and software 305 can track distances (proximity) of objects from the vehicle, and potentially provide alerts to a driver or provide such tracking information for analytics of a driver's performance.

In some embodiments, the LIDAR system can communicate with a vehicle control unit 310 and one or more parameters associated with control of a vehicle can be modified based on the received LIDAR data. For example, in a fully autonomous vehicle, the LIDAR system can provide a real time 3D image of the environment surrounding the car to aid in navigation. In other cases, the LIDAR system can be employed as part of an advanced driver-assistance system (ADAS) or as part of a safety system that, for example, can provide 3D image data to any number of different systems (e.g., adaptive cruise control, automatic parking, driver drowsiness monitoring, blind spot monitoring, collision avoidance systems, etc). When a vehicle control unit 310 is communicably coupled to light ranging device 320, alerts can be provided to a driver or the proximity of an object can be tracked and/or displayed.

Light ranging device 320 includes light sensing module 330, light transmission module 340 and light ranging system controller 350. The rotary actuator 315 includes at least two circuit board assemblies, a lower circuit board assembly 360 (also referred to herein as a base subsystem) and an upper circuit board assembly 380 (also referred to herein as a turret subsystem). The lower circuit board assembly 360 can be mechanically mounted to a fixed portion of an enclosure or housing (not shown) while the upper circuit board assembly 380 is free to rotate about an axis of rotation, usually defined by a shaft (not represented in FIG. 3) that is also mounted to the enclosure (directly or indirectly). The light ranging device 320 can be mechanically attached to the rotatable upper circuit board assembly 380 and therefore is free to rotate within the housing.

While FIG. 3 shows one particular arrangement of components within light ranging device 320 and rotary actuator 315, in some embodiments, certain components may be integrated into one, or the other, module differently than shown. As one example, ranging system controller 350, which can be, for example, an FPGA, ASIC, or a more general computing device, like an embedded system or system-on-a-chip (SOC), can be mounted directly (e.g., soldered) to, a printed circuit board that is part of the upper circuit board assembly 380. In other words, in some embodiments, the parts of the rotary actuator can be integrated within the light ranging device 320 and vice versa.

The rotary actuator 315 includes a number of different systems that are integrated onto one or more printed circuit boards of the lower and upper circuit board assemblies 360 and 380. For example, rotary actuator 315 can include a brushless electric motor assembly, an optical communications subsystem, a wireless power transmission subsystem, and a base controller. These systems are formed by pairs of cooperating circuit elements with each pair including one or more circuit elements on the lower circuit board assembly 360 operating in cooperation with (e.g., having a function that is complementary to) one or more circuit elements on the upper circuit board assembly 380. Complementary functions include, for example, transmission (Tx) and reception (Rx) of power and/or data communication signals as is described in more detail below.

The brushless electric motor assembly includes a stator assembly 362 integrated onto a printed circuit board of the lower circuit board assembly 360 and a rotor assembly 382 integrated onto a printed circuit board of the upper circuit board assembly 380. The rotation of rotor assembly 382 is driven from a drive signal, for example, a three-phase drive current, that originates from a motor driver circuit 364. In some embodiments, one or more motor control lines connect the motor driver circuit to the coils of the stator assembly 362 to allow for the drive signal to be provided to the motor stator. Furthermore, the motor driver circuit 364 can be electrically connected to a base controller 366 such that the base controller 366 can control the rotation rate of the rotor assembly and thus the rotation rate (i.e., frame rate) of the light ranging device 320.

In some embodiments, rotor assembly 382 can rotate at a rate between 10-30 Hz. In some embodiments, the rotor assembly 382 can be a passive device that includes a series of permanent magnets that are attached to a circuit board of the upper circuit board assembly. These permanent magnets are either attracted to or repelled by an electromagnetic force, for example, a magnetic force, generated by the coils of the stator assembly to drive a rotation of the upper circuit board assembly 380 relative to the lower circuit board assembly 360. The rotational orientation of the upper circuit board assembly 380 can be tracked by a rotary encoder receiver 394, which can track the angular position of the upper circuit board assembly by detecting the passage of one or more features on the rotary encoder 374. A variety of different rotary encoder technologies can be employed. In some embodiments, rotary encoder 374 is integrated directly onto a surface of a circuit board of the lower circuit board assembly 360.

Rotary actuator 310 can also include a wireless power system that includes a wireless power transmitter 372 and a wireless power receiver 392 in a configuration referred to herein as a rotary transformer. Power transmitted from transmitter 372 to wireless power receiver 392 can be consumed by light ranging device 320 and/or any circuitry needing power on the turret/upper circuit board assembly. In some embodiments, all power required by light ranging device 320 is provided through wireless power receiver 392 and thus there is no need for a rotary electric coupler like a slip ring or mercury based device thereby increasing reliability and decreasing cost of the overall system.

Rotary actuator 310 can also include an optical communication subsystem that includes a number of optical transmitters (e.g., optical transmitters 378 and 396) and a number of optical receivers (e.g., optical receivers 376 and 398) used for bi-directional contactless data transmission between rotary actuator 315 and light ranging device 320 (or to/from any other device or system that is mechanically connected to upper circuit board assembly 380 of the rotary actuator 315). More specifically, the optical communication subsystem can include a set of base optical communication components that are attached to (e.g., soldered to) lower circuit board assembly 360 that is part of the stationary base of LIDAR system 300, and can include a set of turret optical communication components that are attached to (e.g., soldered to) rotating upper circuit board assembly 380 that is part of the rotating turret of LIDAR system 300. These optical communication components provide an uplink data channel for providing optical signals, including control signals, to light ranging device 320 and also provide a downlink data channel for providing optical signals, including ranging and operational data, from light ranging device 320 to base controller 366, user interface hardware and software 305, and/or the vehicle control unit 310.

A downlink optical communication channel from the upper circuit board assembly 360 to the lower circuit board assembly 380 can be created between the optical downlink transmitter 396 and the optical downlink receiver 376. Light ranging device 320 can be connected directly to upper circuit board assembly 380 and therefore can access the downlink optical communication channel to pass ranging and operational data down to lower circuit board assembly 360 for further use. In some embodiments, the data passed down in the optical signals via the optical downlink can include range data for individual points (pixels) in the field (or possibly multiple ranges for a single pixel and angle, e.g. during fog/rain, when looking through glass windows, etc.), azimuth and zenith angle data, signal to noise ratio (SNR) of the return or signal intensity, target reflectivity, ambient near IR (NIR) levels coming from each pixel field of view, diagnostic operational information from the light ranging device such as temperature, voltage levels, etc. In addition, data from any other system connected to upper circuit board 380 of the rotary actuator can be passed down through the optical downlink. For example, data from high speed RGB or thermal cameras, line scan cameras and the like.

An uplink optical communication channel from lower circuit board assembly 360 can be created between optical uplink transmitter 378 and optical uplink receiver 398. In some embodiments, control signals from the base controller 366 can be passed to light ranging device 320 via the optical uplink communication channel. For example, in some embodiments, base controller 366 can monitor various temperatures in the device (as received from the downlink channel) and can, in the case of an overheat condition, send an emergency shutdown signal to light ranging device 320 via the uplink channel. In some embodiments, the base controller can be a mobile computer, e.g., a programmable system-on-a-chip employing an ARM+FPGA architecture with associated memory and I/O capability (e.g., Ethernet and the like).

Ranging data can be generated by light ranging device 320 by transmitting one or more light pulses from light transmission module 340 to objects in a field of view surrounding the light ranging device. Reflected portions of the transmitted light are then detected by light sensing module 330 after some delay time. Based on the delay time, commonly referred to as the "time of flight", the distance to the reflecting surface can be determined. Other ranging methods can be employed as well, for example, continuous wave, Doppler, and the like.

Light transmission module 340 can include an emitter array 342 and a Transmit (Tx) optical system 344. Emitter array 342 can be a one-dimensional or two-dimensional array of transmitters, which when combined with transmit optical system 344 form an array of transmitter channels behind a bulk imaging optic. These transmitter channels can optionally include micro-optic structures for beam-shaping, beam-steering, brightness enhancement, or the like. Light transmission module 340 can further include an optional processor 346 and memory 348, although in some embodiments these computing resources can be incorporated into ranging system controller 350. In some embodiments, a pulse coding technique can be used, e.g., Barker codes and the like. In such cases, memory 348 can store pulse-codes that indicate when light should be transmitted. In one embodiment the pulse-codes are stored as a sequence of integers stored in memory.

Light sensing module 330 can include a sensor array 332 and a receiver (Rx) optical system 334. Sensor array 332 can be a one-dimensional or two-dimensional array of photosensors. In some embodiments, each photosensor can include a collection of binary photon detectors (e.g., SPADs or the like), while in other embodiments each photosensor can be a linear photodetector (e.g., an APD). Receiver optical system 334 and sensor array 332 taken together can form an array of micro-optic receiver channels behind a bulk imaging optic as described in more detail below. Each micro-optic receiver channel measures light that corresponds to an image pixel in a distinct field of view of the surrounding volume. Each photosensor (e.g., a collection of SPADs) of sensor array 332 can correspond to a particular emitter of emitter array 342 as a result of a geometrical configuration of light sensing module 330 and light transmission module 340. In an alternative embodiment, each sensor of sensor array 332 can correspond to multiple emitters (e.g., a cluster of VCSELs) of emitter array 342. In yet another embodiment, a single large emitter (e.g., a laser diode bar) could in emitter array 342 could correspond to multiple sensors within sensor array 336.

In some embodiments, sensor array 332 of light sensing module 330 can be fabricated as part of a monolithic device on a single substrate using, for example, CMOS technology, that includes both an array of photosensors, a processor 336 and a memory 338 for signal processing the raw signals from the individual photosensors (or groups of photosensors) in the array. The monolithic structure including sensor array 332, processor 336, and memory 338 can be fabricated as a dedicated ASIC. In some embodiments, micro-optical components that are part of receiver optical system 334 can also be a part of the monolithic structure in which sensor array 332, processor 334, and memory 338 are a part. In such instances, the micro-optical components can be formed on the ASIC so that they become part of the monolithic structure with separate substrate layers for each layer of the receiver channel. For example, an aperture layer, a collimating lens layer, an optical filter layer and a photodetector layer can be stacked and bonded to multiple ASICs at the wafer level before dicing. The aperture layer can be formed by laying a non-transparent substrate on top of a transparent substrate or by coating a transparent substrate with an opaque film. In such an embodiment, the dicing step forms multiple ASICs, each with its own micro-optic structure bonded directly thereto. As another example, the micro-optical components can be formed as a separate monolithic structure that can be bonded directly to an ASIC after the ASIC is separated from a larger wafer via a dicing process. In this manner, the ASIC and micro-optic structure can be bonded together to form a single monolithic structure. Yet other embodiments one or more components of the Rx module 330 may be external to the monolithic structure. For example, the aperture layer may be implemented as a separate metal sheet with pin-holes.

As mentioned above, processor 336 and memory 338 (e.g., SRAM) can perform the signal processing. As an example of signal processing, for each photosensor or grouping of photosensors, memory 338 of light sensing module 330 can accumulate counts of detected photons over successive time bins and these time bins taken together can be used to recreate a time series of the reflected light pulse (i.e., a count of photons vs. time). This time-series of aggregated photon counts is referred to herein as an intensity histogram (or just histogram). In addition, processor 336 can accomplish certain signal processing techniques, such as matched filtering, to help recover a photon time series that is less susceptible to pulse shape distortion that can occur due to SPAD saturation and quenching. In some embodiments, one or more components of ranging system controller 350 can also be integrated into the same ASIC as sensor array 332, processor 336 and memory 338, thereby eliminating the need for separate a ranging controller module.

In some embodiments, the output from processor 336 is sent to ranging system controller 350 for further processing. For example, the data can be encoded by one or more encoders of ranging system controller 350 and then sent as data packets via the optical downlink to lower circuit board assembly 360. Ranging system controller 350 can be realized in multiple ways including, e.g., by using a programmable logic device such an FPGA, as an ASIC or part of an ASIC, using a processor 352 with a memory 354, and some combination of the above. Ranging system controller 350 can cooperate with base controller 366 or operate independently of the base controller (via pre-programed instructions) to control light sensing module 330 by sending commands that include start and stop light detection and adjust photo-detector parameters. Similarly, ranging system controller 350 can control the light transmission module 340 by sending commands, or relaying commands from the base controller 366, that include start and stop light emission controls and controls that can adjust other light-emitter parameters such as, emitter temperature control (for wavelength tuning), emitter drive power and/or voltage.

If emitter array 342 has multiple independent drive circuits, then there can be multiple on/off signals that can be properly sequenced by ranging system controller 350. Likewise, if the emitter array includes multiple temperature control circuits to tune different emitters in the array differently, the transmitter parameters can include multiple temperature control signals. In some embodiments, ranging system controller 350 has one or more wired interfaces or connectors (e.g., traces on a circuit board) for exchanging data with light sensing module 330 and with light transmission module 340. In other embodiments, ranging system controller 320 communicates with the light sensing module 330 and light transmission module 340 over a wireless interconnect such as an optical communication link.

III. Light Transmission and Detection

Figure 4A:
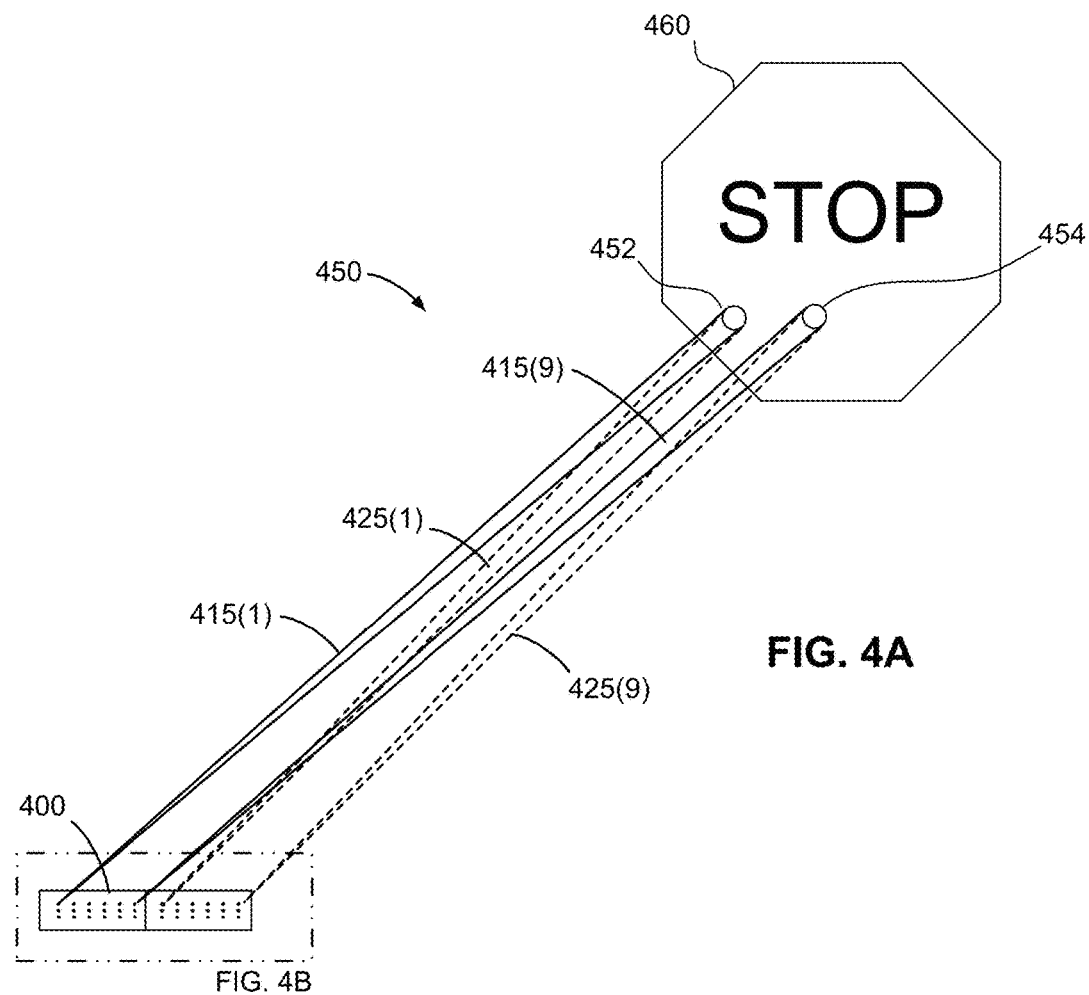
FIGS. 4A and 4B show an illustrative example of the light transmission and detection process for a light ranging system according to some embodiments, with a focus on the emitter array and sensor array that form an arrangement of emitter-sensor channels, as introduced above in reference to FIG. 2.
Figure 4B:
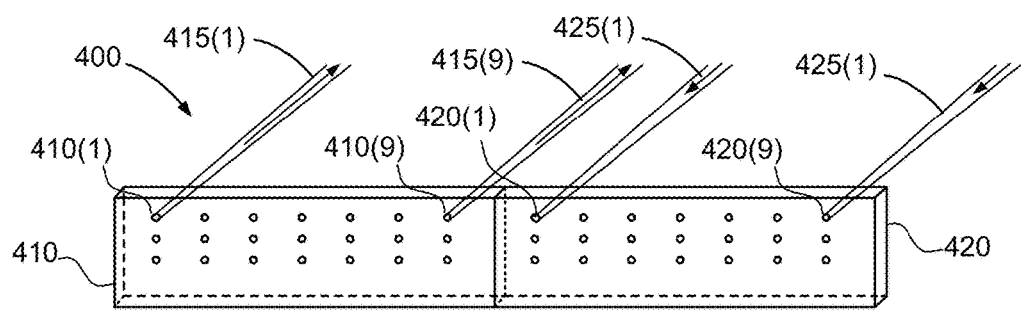

FIGS. 4A and 4B depict an illustrative example of the light transmission and detection process for a light ranging system according to some embodiments, with a focus on the emitter array and sensor array that form an arrangement of emitter-sensor channels, as introduced above in reference to FIG. 2. FIG. 4A depicts a light ranging system 400 (e.g., solid state or and/or scanning) collecting three-dimensional distance data of a volume or scene 450 external to light ranging system 400. FIG. 4B is an enlarged view of light ranging system 400 from FIG. 4A. Light ranging system 400 can be representative of any of light ranging systems 200, 220 or 300 discussed above, as well as the various light ranging devices discussed below. FIGS. 4A and 4B are highly simplified drawings to highlight relationships between emitters and sensors, and thus other components are not shown.

As shown in FIGS. 4A and 4B, light ranging system 400 includes a light emitter array 410 and a light sensor array 420. Light emitter array 410 includes an array of light emitters (e.g., an array of VCELs or the like) that includes individual emitters, such as emitter 410(1) and emitter 410(9). Light sensor array 420 includes an array of photosensors that includes individual photo sensors, such as sensors 420(1) and 420(9). The photosensors can be pixelated light sensors that employ, for each pixel, a set of discrete photodetectors such as single photon avalanche diodes (SPADs) or the like. However, various embodiments can deploy other types of photosensors. In some embodiments, light ranging system 400 includes one or more sets of bulk optical elements (not shown), referred to herein as bulk optics, placed in front of light emitter array 410 and/or the light sensor array 420 for redirecting the beams in the directions shown.

Each emitter can be slightly offset from its neighbor and can be configured to transmit light pulses into a different field of view from its neighboring emitters, thereby illuminating a respective field of view associated with only that emitter. For example, emitter 410(1) emits an illuminating beam 415(1) (formed from one or more light pulses) into the circular field of view 452 (the size of which is exaggerated for the sake of clarity). Likewise, emitter 410(9) emits an illuminating beam 415(9) (also called an emitter channel) into the circular field of view 454. While not shown in FIGS. 4A and 4B to avoid complication, each emitter emits a corresponding illuminating beam into its corresponding field of view resulting in a 2D array of fields of view being illuminated (twenty one distinct fields of view in this example corresponding to the twenty one emitters, arranged in a 3×7 array, of light emitter array 410).

Each field of view that is illuminated by an emitter can be thought of as a pixel or spot in the corresponding 3D image that is produced from the ranging data. Each emitter channel can be distinct to each emitter and can be non-overlapping with other emitter channels, i.e., there is a one-to-one mapping between the set of emitters and the set of non-overlapping fields of view. Thus, in the example of FIGS. 4A and 4B, the system can sample twenty one distinct points in the 3D space. A denser sampling of points can be achieved by having a denser array of emitters or by scanning the angular positions of the emitter beams over time such that one emitter can sample several points in space.

Each sensor can be slightly offset from its neighbor and, like the emitters described above, each sensor can see a different field of view of the scene in front of the sensor. Furthermore, each sensor's field of view substantially coincides with, e.g., overlaps with and is the same size as a respective emitter channel's field of view. Similar to the emitters described above, the fields of view of the sensors can be scanned by rotation of the assembly. Scanning could also be accomplished using galvanometers, MEMS mirrors, or via some other method.

In FIGS. 4A and 4B, the distance between corresponding emitter-sensor channels is exaggerated relative to the distance to objects in the field of view. In practice, the distance to the objects in the field of view is much greater than the distance between corresponding emitter-sensor channels and thus the path of light from the emitter to the object is approximately parallel to the path of the reflected light back from the object to the sensor (i.e., it is almost "back reflected"). Accordingly, there is a range of distances in front of the system 400 over which the fields of view of individual sensors and emitters are overlapped and it is over this range of distances that the system can most accurately determine depth information.

Because the fields of view of the emitters are overlapped with the fields of view of their respective sensors, each sensor channel ideally can detect the reflected illumination beam that originates from its respective emitter channel with ideally no cross-talk, i.e., no reflected light from other illuminating beams is detected. For example, emitter 410(1) emits an illuminating beam 415(1) into the circular field of view 452 and some of the illuminating beam reflects from the object 460 as reflected beam 425(1). Ideally, reflected beam 425(1) is detected by sensor 420(1) only. Thus, emitter 410(1) and sensor 420(1) share the same field of view (i.e., field of view 452) and form an emitter-sensor pair. Likewise, emitter 410(9) and sensor 420(9) form an emitter-sensor pair, sharing field of view 454. In some embodiments emitter array 410 and sensor array 420 are designed and configured (in conjunction with the bulk optics) such that the fields of view of each emitter-sensor pair are non-overlapping (beyond a threshold distance) with the fields of view of other emitter-sensor pairs.

While the emitter-sensor pairs are shown in FIGS. 4A and 4B as being in the same relative locations in their respective array, any emitter can be paired with any sensor depending on the design of the optics used in the system. In some embodiments, having identical bulk imaging optics in front of identically arranged emitter/sensor pairs can be advantageous from a design simplicity/cost perspective.

During a ranging measurement, the reflected light from the different fields of view distributed around the volume surrounding the LIDAR system is collected by the various sensors and processed, resulting in range information for any objects in each respective field of view. As described above, a time-of-flight technique can be used in which the light emitters emit precisely timed pulses, and the reflections of the pulses are detected by the respective sensors after some elapsed time. The elapsed time between emission and detection and the known speed of light is then used to compute the distance to the reflecting surface. In some embodiments, additional information can be obtained by the sensor to determine other properties of the reflecting surface in addition to the range. For example, the Doppler shift of a pulse can be measured by the sensor and used to compute the relative velocity between the sensor and the reflecting surface.

In some embodiments, the LIDAR system can be composed of a relatively large 2D array of emitter and sensor channels and operate as a solid state LIDAR, i.e., it can obtain frames of range data without the need to scan the orientation of the emitters and/or sensors. In other embodiments, the emitters and sensors can be scanned, e.g., rotated about an axis, to ensure that the fields of view of the sets of emitters and sensors sample a full 360 degree region (or some useful fraction of the 360 degree region) of the surrounding volume. The range data collected from the scanning system, e.g., over some predefined time period, can then be post-processed into one or more frames of data that can then be further processed into one or more depth images or 3D point clouds. The depth images and/or 3D point clouds can be further processed into map tiles for use in 3D mapping and navigation applications.

IV. LIDAR Unit with Integrated Architecture

Figure 5A:
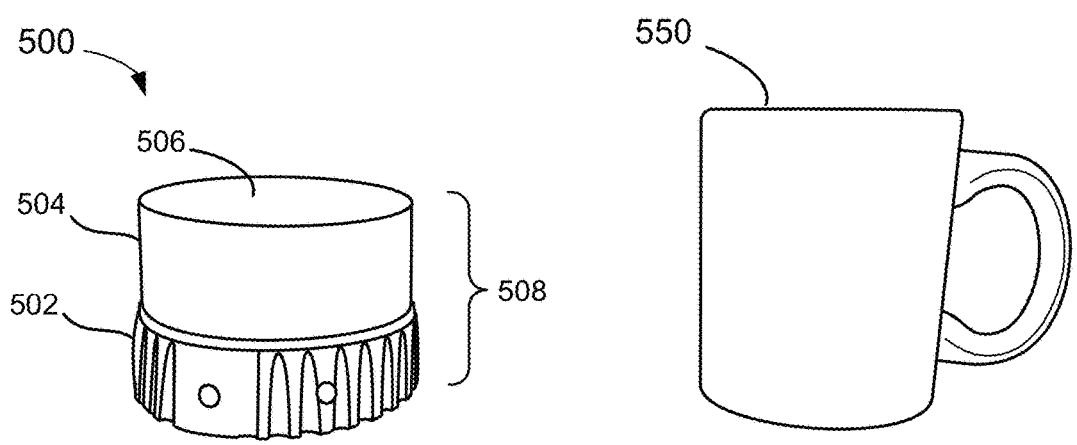
FIGS. 5A-5B show a rotating LIDAR system 500 in accordance with one or more embodiments.
Figure 5B:
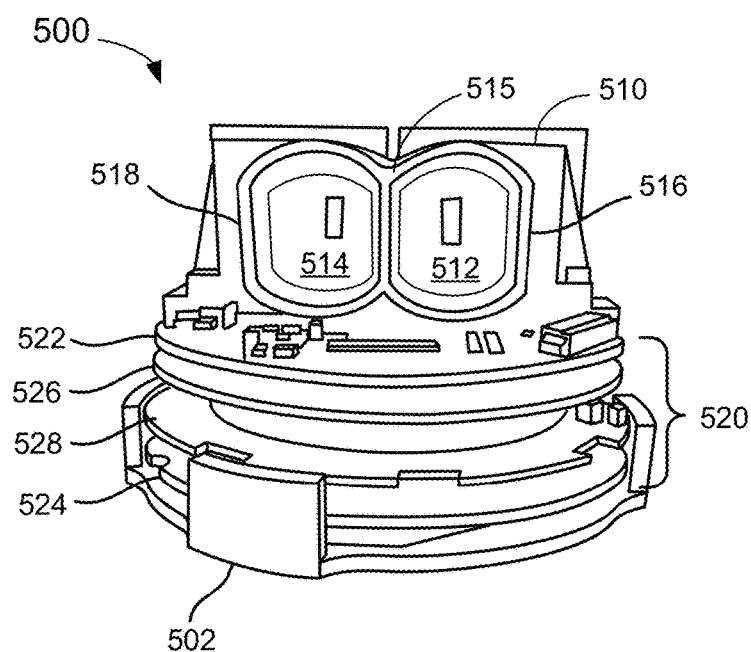

FIGS. 5A-5B show a rotating LIDAR system 500 that employs a 360 scanning architecture, according to some embodiments of the disclosure. In some embodiments, LIDAR system 500 can spin in a clockwise or counter-clockwise direction to observe the surrounding field around a vehicle. System 500 can include a stationary base housing 502, an optically transparent window 504, and a stationary lid 506 for providing protection for the internal components of LIDAR system 500. Window 504 can be made from a transparent material to allow for two-way transmission of near IR light. Stationary base housing 502, window 504 and lid 506 make up a water-resistant or waterproof system housing or enclosure 508 that fully encloses internal components of LIDAR system 500 to protect the components from the elements. Housing/enclosure 508 can be representative, for example, of housing 220 discussed above with respect to FIG. 2A. In some embodiments, the enclosure can have a generally cylindrical shape as shown in FIG. 5A.

In some embodiments, window 504 can extend fully around a periphery of enclosure 508 and be attached to base housing 502 and lid 506 in a fixed relationship. In such embodiments, a light ranging device 510 (shown in FIG. 5B), can rotate within enclosure 508 behind window 504. In other embodiments, window 504 can rotate with light ranging device 510. The configuration of base housing 502, window 504 and stationary lid 506 shown in FIG. 5A is just one example of an enclosure 508 according to embodiments of the disclosure. A person of skill in the art will recognize that other configurations of a suitable enclosure for LIDAR system 500 are possible. As one example of a different configuration, lid 506 can be part of window 504. As another example, in embodiments where window 504 rotates with light ranging device 510, window 504 can include two or more separate windows separated by an opaque region. For example, in some embodiments, LIDAR system 500 can include a first window aligned with an optical transmitter and a second window, spaced apart from the first window, aligned with an optical receiver. As used herein, "aligned" means that the optical transmitter or receiver transmits or receives light through the window.

The internal components (not shown in FIG. 5A) of system 500 can include a rotary actuator and light ranging device, such as actuator 310 and light ranging device 320 described with respect to FIG. 3. The light ranging device can be aligned with window 504 and can be spun by the rotary actuator to project pulsed beams of light through window 504 into a field surrounding LIDAR system 500 while the light ranging device is spinning continuously through 360 degrees in a clockwise or counter-clockwise direction. Light reflected from the field back through window 504 can then be detected by the light ranging device to determine distance to objects in the field as described herein.

As described in more detail below, rotating LIDAR system 500 can employ a highly integrated architecture and enables a highly compact configuration for the internal mechanical elements and circuitry. Accordingly, the overall form factor of LIDAR systems according to some embodiments of the disclosure can be smaller than many existing systems, for example, with an overall volume that is similar to or smaller than that of a coffee mug 550 as can be seen in FIG. 5A.

FIG. 5B shows an embodiment of LIDAR system 500 with the outer enclosure/system housing 508 (including window 504 and lid 506) removed to highlight the integrated, stacked-board design according to some embodiments of the disclosure. As shown in FIG. 5B, rotating LIDAR system 500 includes a light ranging device 510 that includes an optical transmitter 512 and an optical receiver 514 mounted within a housing 515 that includes a first housing portion 516 for the optical transmitter and a second housing portion 518 for the optical receiver. Light ranging device 510 is mechanically connected in a fixed relationship to a printed circuit board 522 that forms the rotating end of stacked board rotary actuator 520. The fixed side of stacked board rotary actuator 520, including printed circuit board 524, is attached to base portion 502 of the enclosure.

As described in more detail below, embodiments of the LIDAR system possess a highly integrated design that makes them especially suitable for a highly compact rotating LIDAR system. The various functional elements of the LIDAR system (both mechanical and electronic) are integrated into a stacked circuit board assembly that includes the one or more circuit boards stacked in a parallel arrangement, as shown in FIG. 5B, e.g., circuit boards 522, 524, 526 and 528. In some embodiments, the power system, electric motor, communication system, and LIDAR control system are all integrated into the one or more stacked planar circuit boards of the stacked board rotary actuator 520. Light ranging device 510 can be conveniently attached to the top board 522 by way of one or more multi-pin connectors or the like (not shown). As will be detailed below, the boards can include a central aperture through which a central shaft passes. The upper boards can be attached to the upper portion of the shaft via one or more bearings. Each of the boards can be arranged with its planar surface perpendicular to the shaft and therefore the axis of rotation. As a result of this configuration, assembly and maintenance are much simpler relative to other systems that employ multiple boards in different orientations within the LIDAR system.

Figure 6A:
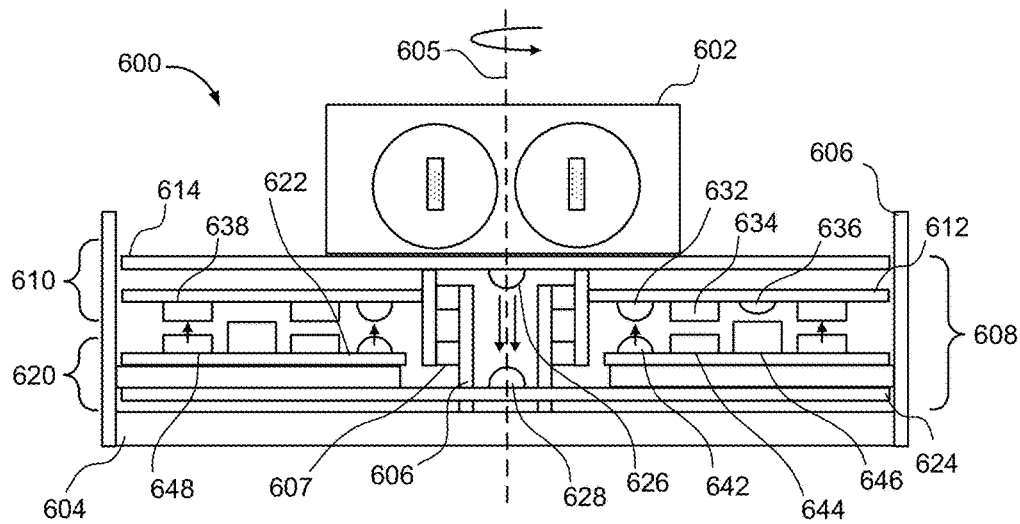
FIGS. 6A-6C show cross-sectional views of a LIDAR system in accordance with one or more embodiments.
Figure 6B:
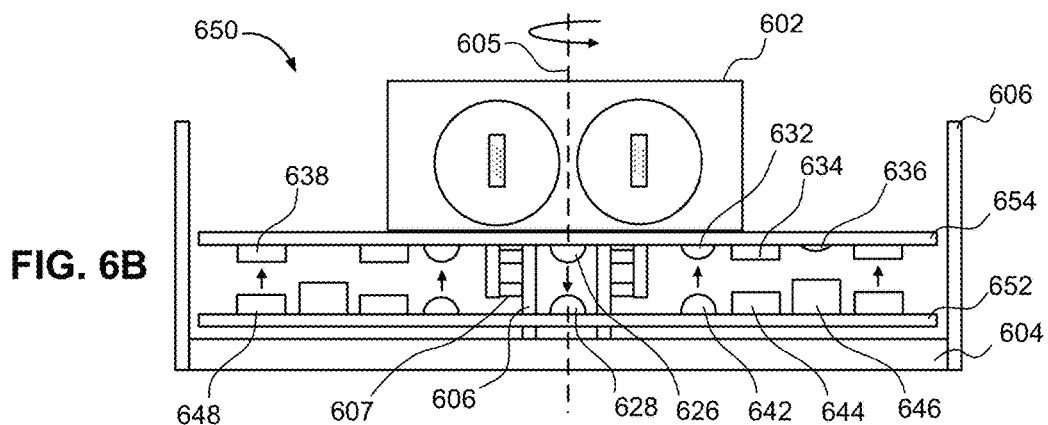
Figure 6C:
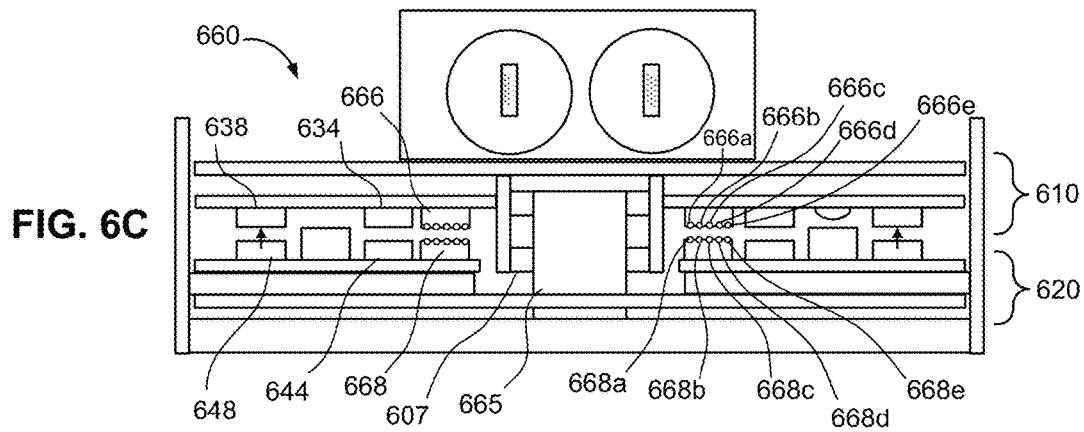

FIGS. 6A-6C show cross-sectional views of LIDAR systems 600, 650 and 660 in accordance with various embodiments of the disclosure. More specifically, the individual components shown in FIGS. 6A-6C correspond generally to those already described above in reference to FIG. 3, with the views shown FIGS. 6A-6C providing examples of the geometric placement of the various circuit elements according to different embodiments. FIGS. 6A and 6B each show embodiments that employ optical communication between the upper and lower circuit board assemblies while FIG. 6C shows an embodiment that employs inductive communication between the upper and lower circuit board assemblies. FIGS. 6D-6E provide views of surfaces of the individual circuit boards according to some embodiments to further illustrate the concentric circumferential arrangement of a number of individual circuit elements.

Referring now to FIG. 6A, LIDAR system 600, which can be representative of LIDAR system 500, can include a light ranging device 602 along with upper and lower circuit board assemblies 610 and 620, respectively, in which upper board assembly 610 rotates with respect to lower board assembly 620 around an axis 605 that is perpendicular to the board assemblies. Circuit board assemblies 610 and 620 are each structural components of LIDAR system 600 that holding all or essentially all of the components of the LIDAR system. The two piece design enables system 600 to have reduced size and increased reliability compared to many currently available LIDAR systems and enables system 600 to be manufactured at a reduced cost.

Light ranging device 602 can be mounted to one of the circuit boards in upper board assembly 610 enabling the light ranging device to rotate with upper board assembly 610 while lower board assembly 620 can be mounted to base 604 and or sidewall 606, each of which is a part of the stationary base of LIDAR system 600. Rotation of upper circuit board assembly 610 and light ranging device 602 is enabled by a bearing system 607 located on a hollow shaft 606 centered along the longitudinal axis or rotation 605.

Each of the assemblies 610, 620 can include two or more stacked planar circuit boards arranged in a parallel relationship with each other. In the specific embodiment shown, upper assembly 610 includes a rotor communication board 612 and a rotor control board 614 while lower assembly 620 includes a stator communication board 622 and a stator control board 624. An electric motor can be integrated directly on the board assemblies, along with an encoder, a wireless power system and optical communication system as described in more detail below. Many or all of these same elements are also integrated on the board assemblies of LIDAR systems 650 and 660 shown in FIGS. 6B and 6C, respectively. Thus, to simplify the description of the FIGS. 6A-6C and avoid repetition, like reference numbers are used to indicate like elements and the description of such like elements is typically not repeated.

The highly integrated, stacked board design of LIDAR system 600 provides for a system that has a greatly simplified assembly process in comparison to systems that employ numerous stand-alone modules for each of the different functional elements of a LIDAR system. In alternative embodiments, LIDAR systems of the present disclosure can include upper and lower board assemblies that are each a single circuit board even further simplifying the stacked board design. For example, LIDAR system 650 shown in FIG. 6B includes a single lower circuit board 652 and a single upper circuit board 654.

While not shown explicitly in FIGS. 6A-6C, one or more supporting power circuits, drive/control circuits, and communication circuits can be paired with each of the systems discussed below and these supporting systems can also be integrated onto one or more circuit boards of the rotary actuator. For example, a motor driver for providing a three-phase drive current to the solenoids of the stator can be attached to a surface of a circuit board of the lower circuit board assembly 620. Power drive and conditioning circuits can be paired with the wireless power transmission components and mounted to the upper and/or lower board assemblies. Supporting circuitry for the digital communication system, such as buffers, LED/laser current drivers, encoders/decoders, clock recovery circuits, photodetector drive and conditioning circuits, etc., can also be mounted to one or more boards of the circuit board assemblies. Some of these elements will be discussed in further detail below but one or ordinary skill in the art will appreciate that any number of arrangements and configurations of standard circuit components can be employed without departing from the scope of the present disclosure. In some embodiments, because of the nature of the rotationally symmetric optical uplink, wireless power rotary transformer, brushless dc motor, and rotary encoder, any concentric ordering of these subsystems about the shaft can be employed.

V. Optical Links

1. Integrated Central Optical Downlink

In some embodiments, hollow shaft 606 can serve not only as a central structural member that supports each of the board assemblies, but also serves as a housing for a downlink optical communications channel ("the downlink channel") for providing data, e.g., ranging and/or operational data, from the turret assembly to the control and processing circuitry located in the lower circuit board assembly 620 (also referred to as the base system). The optical downlink channel can include an optical downlink transmitter 626 and an optical downlink receiver 628 each of which can be centered along rotational axis 605. Optical downlink transmitter 626 can be attached (e.g., soldered) directly to a surface of a circuit board of upper circuit board assembly 610 and can be positioned such that it can transmit optical signals through a central hole or opening in the hollow shaft 606. Likewise, the optical downlink receiver 628 can be attached (e.g., soldered) directly to a surface of a circuit board of the lower circuit board assembly 620. The optical downlink receiver 628 can be positioned on the lower end of the shaft and aligned with the optical downlink transmitter 626 such that it is able to receive optical signals transmitted from the optical downlink transmitter 626.

The optical transmitters and receivers used for the optical downlink of the rotary actuator can be any suitable optical emitter or detector. For example IR LEDs, laser diodes, VCSELs, and the like can be used for the optical emitters. Likewise any suitable light detection technology can be used for the receivers, such as, photodiodes or the like.

2. Integrated Optical Uplink

An optical uplink channel can be formed between a circumferential arrangement of multiple optical uplink transmitters 642 and a complementary circumferential arrangement of multiple optical uplink receivers 632. As with the optical downlink transmitter/receiver pair, the individual optical uplink transmitters and optical uplink receivers can be directly attached (e.g., soldered) to respective circuit boards of the lower and upper circuit board assemblies, respectively. Optical communication components that are disposed on the lower circuit board assembly are also referred to herein as "base optical communication components". Optical communication components that are disposed on the upper circuit board assembly, or turret, are also referred to herein as "turret optical communication components." Advantageously, the wall of the hollow shaft 606 provides for optical isolation between the uplink and downlink channels and therefore minimizes crosstalk.

The individual emitter and receivers of the circumferential arrangements can be coupled together to act together as a single composite receiver and a single composite transmitter. For example, as the system rotates, the overall optical intensity of the uplink signal detected by the full arrangement of optical uplink receivers varies only slightly as the individual emitters/detectors pass each other. Furthermore, the number of individual transmitters in the composite transmitter can be the same as or different from the number of individual receivers in the composite receiver.

The optical transmitters and receivers used for the optical uplink of the rotary actuator can be any suitable type of optical emitter or detector. For example, a ring of IR LEDs, laser diodes, VCSELs, or the like can be used as the composite optical transmitter. Likewise any suitable type of light detection technology can be used for the receivers, e.g., a ring of photodiodes or the like can be used as the composite optical receiver. In addition, the optical transmitters and receivers used for the optical uplink can be the same or different type (e.g., power and wavelength) as those used for the downlink.

An example of a circumferential arrangement of optical uplink transmitters 642 is shown in FIG. 6D, which illustrates a top view of a stationary circuit board (e.g., circuit board 622 of FIG. 6A). In this example, there are six (6) optical uplink transmitters 642 that are circumferentially arranged around the central hole 672. The six (6) transmitters are evenly spaced around the circle 674 whose center is located at the center of the shaft (and thus the center of hole 672) and therefore overlapped with the axis of rotation.

The opposing surface of the rotating circuit board (e.g., circuit board 612 of FIG. 6A or circuit board 654 of FIG. 6B) includes a corresponding circumferential arrangement of optical uplink receivers 632, as shown in FIG. 6E, which illustrates a bottom view of a rotating circuit board according to some embodiments. In this example, there are seven (7) optical uplink receivers that are circumferentially arranged around the central hole 672. The seven (7) receivers are evenly spaced around the circle 684 whose center is located at center of the shaft and therefore overlapped with the axis of rotation. Accordingly, as the board rotates, the arrangement of optical uplink receivers 632 rotates about the axis of rotation. Because the radius of circle 684 is same as the radius of circle 674, the transmitters are aligned with the receivers and the rotation merely results in a slight rise and fall of the average signal over time with a frequency being a multiple of the rotation frequency of the turret system. The number of transmitters needed for a reliable uplink channel depends on both the nominal power of the transmitters as well as the divergence of the light cone that is emitted from each transmitter. Ideally, the spot size of the transmitter light at the front surface of the rotating board is large enough that the individual spots overlap to such an extent that as the rotating board rotates, the overall variation in the average intensity seen by the collection of receivers is below a specified value.

While FIGS. 6D and 6E depict an embodiment in which an optical downlink channel is formed within hollow shaft 606 and an optical uplink channel is formed between a circumferential arrangement of multiple optical uplink transmitters and a complementary circumferential arrangement of multiple optical uplink receivers disposed outside the shaft, in other embodiments other arrangements of optical channels are possible. For example, in some embodiments an uplink channel can be formed within hollow shaft 606 and a downlink channel can be formed outside the shaft. In still other arrangements both a downlink and an uplink channel can be formed inside shaft 606 (e.g., using separate light guides) or both a downlink channel and an uplink channel can be formed outside the shaft in separate circumferential arrangements of optical components.

VI. Inductive Communication Links

Referring back to FIG. 6C, FIG. 6C shows an embodiment that employs an inductive communications system 666, 668 between the upper and lower circuit board assemblies. In this example, data uplink and downlink are provided by pairs of coils 666*a-e* and 668*a-e* respectively mounted on the lower circuit board assembly and upper circuit board assembly, as shown. The coils can include both data lines and clock lines. Each coil can be embedded within a separate channel, e.g., a circular channel, of a housing, such as upper coil housing 666 and lower coil housing 668 that are themselves mounted to the surfaces of their respective circuit boards. In some embodiments, there can be several coils that are used for multiple inductive data lines, e.g., downlink channel 1 transmitter coil 666*b* and downlink channel 1 receiver coil 668*b*, downlink channel 2 transmitter coil 666*c* and downlink channel 2 receiver coil 668*c*. In some embodiments, the downlink clock signal can be transmitted via a separate coil pair, e.g., downlink clock transmit coil 666*a* and downlink clock receiver coil 668*a*. Likewise, data uplink channels can be formed from one or more pairs of coils, e.g., by uplink transmitter coil 668*d* and uplink receiver could 666*d*. Like the downlink, the data uplink clock signal can also have a dedicated channel formed from a pair of coils, e.g., uplink clock transmitter coil 668*e* and uplink clock receiver coil 666*e*.

In some embodiments, the use of an inductive communications links can provide a number of advantages over an optical configuration, including: (1) replacement of the hollow shaft 606 with a solid shaft 665 which is simpler and easier to construct; (2) in some situations, an inductive coil arrangement can require less stringent tolerances on mechanical alignment and thus have lower cost of manufacture; (3) an easier arrangement for passing multiple channels of information between the boards; (4) can enable passing a clock along with data, which removes the need for clock and data recovery (CDR) chips; (5) can allow for scaling bandwidth by providing a multichannel (parallel) data transmission lines arrangement; and (6) by distributing a separate clock signal between the boards, deterministic timing behavior can be achieved between the lower board assembly (stator) and upper board assembly/light ranging unit (rotor).

While FIG. 6C shows an embodiment with five coil pairs, any number of coil pairs can be implemented without departing from the scope of the present disclosure. For example, a two coil pair configuration having only one data uplink channel and one downlink channel can be implemented. In this case, the clock signal can be provided via the uplink channel and the downlink clock can be derived from this uplink clock signal. In other embodiments, three coil pairs can be employed, one for uplink data, one for downlink data and one for the uplink clock signal, again, with the downlink clock signal being derived from the uplink clock signal. Four coil pair configurations are also possible that provide for both uplink and downlink clock signal channels. In addition to all the above, any number of data cannels can be employed without departing from the scope of the present disclosure.

VII. Integrated Electric Motor

According to certain embodiments, an electric rotary motor can be integrated directly onto the circuit boards. The motor can have a "pancake" or "axial" design having a planar rotor assembly on a rotor board that opposes a planar stator assembly on an opposing stator board. The stator and rotor assemblies of the electric motor can be integrated onto the boards of the rotary actuator 608, i.e., the elements of the electric motor are one of many components on the surface of the printed circuit boards and thus a separate motor module is not required for LIDAR system 600. For example, referring back to FIG. 6D, stator assembly 644 can include an annular arrangement of multiple stator elements 644(*i*), e.g., vertically oriented solenoids (having their longitudinal axes perpendicular to the surface of the board) that are affixed (e.g., using an adhesive) to a board of the lower circuit board assembly 620 (e.g., board 622) or to a soft magnetic core that is then affixed to the lower circuit board assembly 620. Examples of the stator elements are shown in the top view of FIG. 6D. Each stator element 644(*i*) can include a solenoid coil 644*a* wound around a core 644*b* of magnetic material, e.g., ferrite or the like. The coils are oriented such that the magnetic field exiting the solenoid is substantially oriented in a direction that is substantially perpendicular to the plane of the circuit board. In the embodiment shown in FIG. 6D, stator assembly 644 includes eighteen (18) individual stator elements 644(*i*) evenly spaced apart from each other, but embodiments of the disclosure are not limited to a stator assembly with any particular number of stator elements and other embodiments can include fewer or more individual stator elements 644(*i*). For example, in some embodiments stator assembly 644 includes at least 12 individual stator elements 644(*i*) in an annular arrangement. Also, in some embodiments, the number of individual stator elements 644(*i*) in stator assembly 644 is a multiple of three and a motor driver circuit and controller (not shown in FIG. 6D) provide a three-phase alternating signal to stator assembly 644 to control the rotation rate of board 622 and thus the rotation rate of light ranging device 602.

Positioned directly opposite the motor stator assembly 644 and attached to a board of the upper circuit board assembly 610 is the motor rotor assembly 634. In some embodiments, motor rotor assembly 634 can be a passive element that includes an annular arrangement of permanent magnets 634(*i*), with their poles arranged in an alternating pattern to sequentially oppose and attract the opening of the various solenoid coils of the stator assembly, as shown in more detail in board view shown in FIG. 6E. Thus, as shown in FIG. 6E, each individual magnet 634*a* can have its poles arranged opposite to its adjacent magnets 634*b*, and each individual magnet 634*b* can have its poles arranged opposite to its adjacent magnets 634*a*. Additionally, while the embodiment of the stator assembly 644 shown in FIG. 6E includes twenty four (24) individual magnets 634(*i*) evenly spaced apart from each other, embodiments of the disclosure are not limited to a rotor assembly with any particular number of elements and other embodiments can include fewer or more individual magnets 634(*i*). Further, as can be seen in FIGS. 6D and 6E, the motor stator assembly 644 and the motor rotor assembly 634 can have an overall circular ring shape with both stator and rotor circles having the same radius and center positions (e.g., both rings can be centered on the shaft).

While the embodiments shown in FIGS. 6D and 6E employ rotor elements that are permanent magnets and stator elements that are solenoid coils, the opposite configuration can also be employed without departing from the scope of the present disclosure. For example, solenoids can be employed as the rotor elements and permanent magnets can be employed as the stator elements, in which case, power to the stator elements can be provided by the wireless power transmission system described below. In addition, rather than employing permanent magnets as rotor/stator elements, electromagnets can be employed in certain embodiments. One of ordinary skill having the benefit of this disclosure will appreciate that any implementation of a PCB mounted brushless DC motor can be employed, for example, any non-contact configuration of solenoid coils and permanent magnet elements can be employed and any drive scheme that implements rotary motion of the underlying hardware can be employed without departing from the scope of the present disclosure.

VIII. Integrated Wireless Power Transmission System

To provide power to the circuit elements connected to the rotating upper circuit board assembly 610, the rotary actuator 608 includes a wireless power system, also referred to herein as a rotary transformer. The wireless power system includes a wireless power transmission subsystem including a wireless power transmitter 648 and a wireless power receiving subsystem including a wireless power receiver 638. The wireless power transmitter 648 can be a transmitter coil in the form of a circular loop antenna (e.g., a single turn or multi-turn coil) that is attached to a surface of a circuit board of the lower circuit board assembly 620 (e.g., board 622) as shown, for example, in FIG. 6D. Likewise, the wireless power receiver 638 can be a receiver coil in the form of a circular loop antenna (e.g., a single turn or multi-turn coil) that is attached to a surface of a circuit board of the upper circuit board assembly 610 (e.g., board 612) as shown in FIG. 6E. The centers of both the wireless power transmitter 648 and the wireless power receiver 638 are positioned at the center of the hollow shaft 606 and are therefore concentric with, the optical encoder ring, the electric motor assemblies, and the optical uplink receiver/transmitters. Advantageously, the wireless power transmitter and receiver can be positioned at the outermost region of the boards 622 and 612 to maximize the area (and therefore inductance) of the circular loops which maximizes power transfer efficiency and advantageously blocks light from the environment or the internals of the LIDAR system from reaching the optical encoder, uplink or downlink.

In some embodiments, the wireless power transmitter 648 and a wireless power receiver 638 can be placed within an annular region of their respective boards with the walls and bottom of the annular regions formed from a magnetic material, e.g., ferrite or the like. For example, FIG. 6E shows wireless power receiver 638 disposed within an annular region formed from ferrite walls 686 and 688 (not shown in FIGS. 6A-6C) and an occluded ferrite bottom. Such an arrangement of ferrite materials is depicted in FIG. 6F, which is a simplified cross-sectional view of a portion of a multi-coil wireless power receiver 638 positioned within an annular channel defined by ferrite walls 686, 688 and a bottom ferrite wall 690. The arrangement shown in FIG. 6F helps channel the magnetic fields between the transmitter and receiver to improve power transfer efficiency and reduce electromagnetic radiation leaking from the system.

IX. Integrated Optical Encoder

The rotary actuator 608 further includes an integrated optical encoder assembly that allows for readout of the angular position of the upper circuit board assembly 610 relative to the lower circuit board assembly 620. The optical encoder assembly includes a patterned annular optical encoder 646 and rotary encoder detector 636 for reading off the angular position of the assembly by, for example, detecting and counting the number of patterns that pass the rotary encoder detector 636 as the system rotates. In certain embodiments, rotary encoder detector 636 can include an illumination device, such as an LED and a detector, such as a photodiode or imaging detector for illuminating and detecting the patterned surface of the annular optical encoder. In some embodiments, the annular optical encoder can include a start code that occurs at a unique position on the annulus or provides absolute encoding patterns thereby enabling an absolute angular orientation measurement. In some embodiments, the encoder system is magnetic instead of optical in nature and relies on a similarly positioned magnetic encoder strip and magnetic encoder reader.

In some embodiments, the annular optical encoder 646 can be attached to a surface of a circuit board of the lower circuit board assembly 620 (e.g., board 622) and the rotary encoder detector 636 can be attached to a surface of the upper circuit board assembly 610 (e.g., board 612) as shown here, or vice versa. Regardless of which board it is placed on, the annular optical encoder 646 can be arranged to have its center at the center of the hollow shaft 606 and is therefore concentric with both the electric motor assemblies and the optical uplink receiver/transmitters as shown, for example, in FIG. 6D. In some embodiments, the rotary encoder detector 636 is positioned on the rotating circuit board, anywhere above the annular optical encoder 646, e.g., as shown in FIG. 6E.

Advantageously, the encoder assembly can be positioned between the wireless power transmission system and the electric motor assembly to maximize the optical isolation between the encoder detector and the transmitters of the optical uplink system. As shown in the example of FIG. 6A, in some embodiments the annular optical encoder 646 can be on the stator side of the rotary actuator 606 while the rotary encoder detector 636 on the rotor side. While this is a non-standard configuration for rotary actuators, this configuration is advantageous for a LIDAR application. For example, by removing the rotary connection between the rotary encoder detector 636 and the light ranging device 602 in this manner, the implementation of a low latency connection between the two systems can be implemented. In LIDAR applications a low latency connection can be important for quickly ingesting the angular position measurements of the rotary encoder detector 636 and correlating the current ranging information with the current angular position of the rotor for increased spatial accuracy.

X. Method of Assembly

Figure 7:
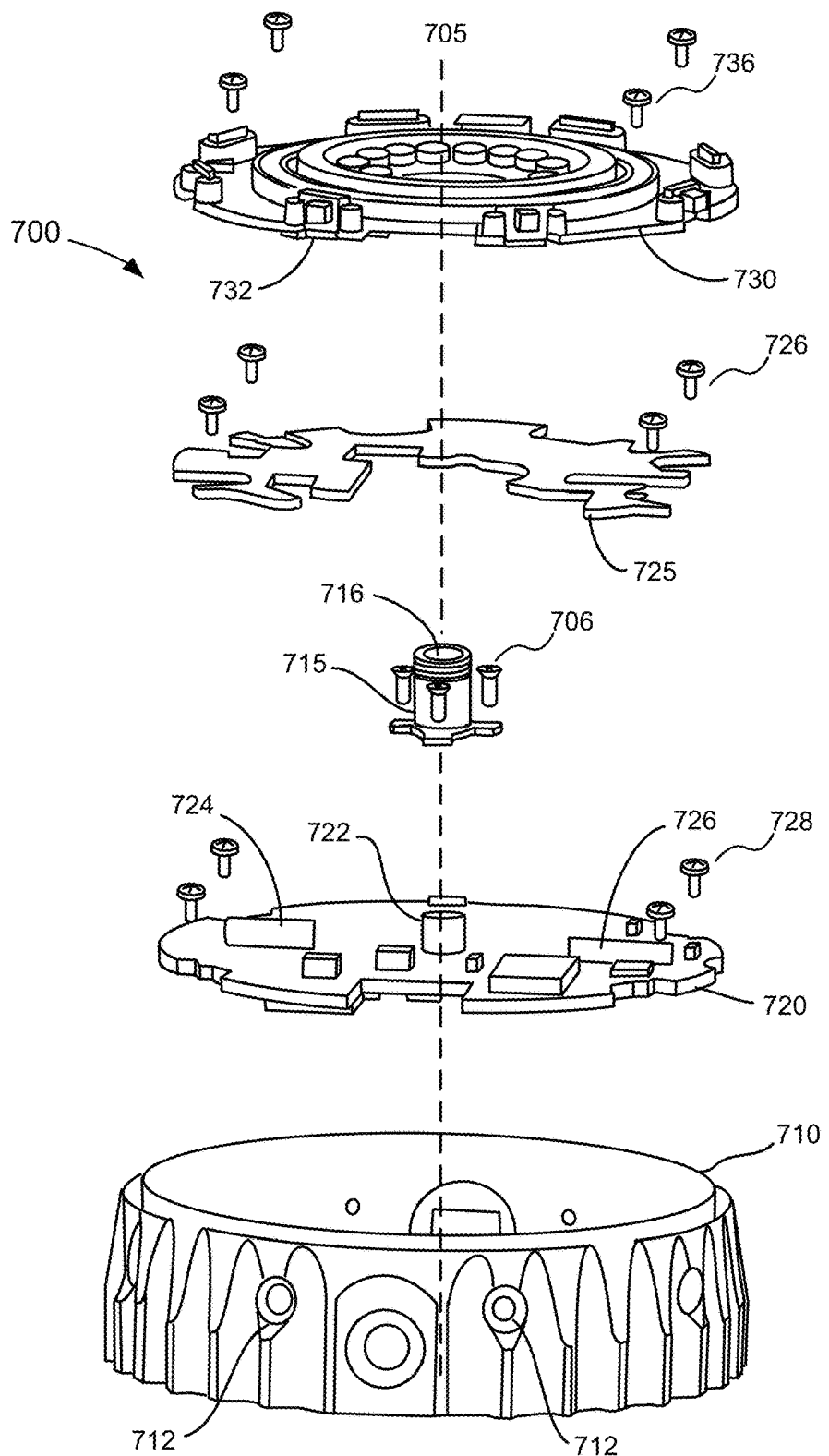
FIG. 7 shows an exploded view of the lower circuit board assembly to illustrate the assembly process of the compact LIDAR system according to certain embodiments.

FIGS. 7-8 show exploded views of a LIDAR system to illustrate the assembly process according to certain embodiments. FIG. 7 illustrates the mechanical assembly of the lower circuit board assembly (also referred to herein as the base assembly). FIG. 8 illustrates the mechanical assembly of the upper circuit board assembly and its attachments to both the lower circuit board assembly and the light ranging device, thereby forming the full LIDAR system.

1. Assembling the Lower Circuit Board Assembly

FIG. 7 shows an exploded view of a lower circuit board assembly 700 to illustrate an assembly process of the compact LIDAR system according to certain embodiments. In the embodiment shown in FIG. 7, lower circuit board assembly 700 is of a two-board configuration, similar to that described above in reference to FIG. 6A. Specifically, lower circuit board assembly 700 includes first and second sub-boards, referred to herein as the base control board 720 and the stator board 730. In some embodiments, base control board 720 and stator board 730 correspond to boards 643 and board 641, respectively, as shown in FIG. 6A.

The assembly of lower circuit board assembly 700 can begin with base control board 720 being mechanically attached to a base housing unit 710 by way of screws 728.

As already described above in reference to FIGS. 3 and 6A, the base control board can include a number of circuit elements, including a base controller, similar to base controller 366. Supporting circuitry, e.g., drivers for, the elements of the optical communications systems, wireless power transmission system, and the rotary encoder system can also be included on the base control board. To enable the optical downlink communications channel, an optical downlink receiver 722 can be mounted to (e.g., soldered to) an upper surface of base control board 720 in a central region of the board as described above in reference to FIG. 6A.

In some embodiments (e.g., as described above in reference to FIG. 6B), optical downlink receiver 722 and the other supporting circuit elements are integrated directly onto stator board 730 thereby eliminating the need for a separate base control board 720. In such a case, assembly of lower circuit board assembly 700 can begin by attaching a heat spreading element 725 directly to the base 710 or in cases that do not employ the base or heat spreading element 725, the assembly can begin by installing stator board 730.

After base control board 720 is attached to base 710, shaft 715 can be attached to base control board 720, using screws 706. In some embodiments, shaft 715 can be attached directly to base 710 for improved thermal conduction of heat from the upper circuit board assembly to the base 710 via the bearing system (shown in more detail in FIGS. 8A and 8B below). As described above in reference to FIGS. 6A-6B, shaft 715 can include a central hole 716 through its length that provides an open optical path for an optical downlink channel. As such, shaft 715 can be placed directly on top of optical downlink receiver 722 located generally near the center of base 710. In some embodiments, regardless of the shape of the outer circumference of base control board 712 or base 710, shaft 715 defines the axis of rotation 705 of the system. Thus, the position of shaft 715 need not be directly in the center of base control board 720 or in the center of base 710.

After shaft 715 is attached to base control board 710, heat spreading element 725 can be attached to base control board 720 by one or more screws 716. In some embodiments, heat spreading element 725 can be made from a material having a high thermal conductivity (e.g., aluminum and the like). In addition, there may be one or more intervening thermal foam pads between heat spreading element 725 and the boards to prevent electrical shorts while providing a conductive heat path. In some embodiments, heat spreading element 725 makes thermal contact with one or more portions of the lower surface of stator board 730 and one or more portions of the upper surface of base control board 720 thereby providing a thermal path for concentrated heat from the circuit elements of these boards to more evenly distribute amongst the boards. On its periphery, heat spreading element 725 may also make thermal contact with the sides of base 710 and thus provide an improved thermal path for heat to be conducted from the boards to base 710 and eventually out of the system.

After securing heat spreading element 725, stator board 730 can be attached by way of screws 736. In some embodiments, stator board 730 can be electrically connected to base control board 720 by way of one or more multi-pin electrical connectors (e.g., lower connectors 724 and 726). In some embodiments, the physical connection between the boards is made by applying a mechanical connection pressure between stator board 730 and base control board 720 (e.g., by pressing the stator board onto the base control board after it has been attached to base 710). The connection pressure can be maintained over the life of the system by screws 736 used to secure stator board 730 to base control board 720.

Once assembled and secured to the base 710, one or more optional color cameras 732 can be positioned around the periphery of stator board 730 to have a clear visual path out of base 710 through one or more imaging apertures 712, which in some embodiments can be clear apertures or can contain one or more optical elements to assist with imaging. In other embodiments, the color cameras 732 can be mounted directly to base 710 rather than be mounted to stator board 730. Color cameras 732 enable LIDAR data that is accumulated by the LIDAR system to be supplemented by color imaging data such as still frames and/or video as described in U.S. application Ser. No. 15/980,509 entitled "Augmenting Panoramic LIDAR Results with Color," which is incorporated herein by reference in its entirety for all purposes.

2. Assembling the Upper Circuit Board Assembly and Attaching to the Lower Circuit Board Assembly FIG. 8A is an exploded view of a compact LIDAR system 800 to illustrate an assembly process of a LIDAR system according to some embodiments of the disclosure. LIDAR system 800 can be, for example, LIDAR system 500 shown in FIG. 5A. LIDAR system 800 includes lower circuit board assembly 700, described above with respect to FIG. 7, an upper circuit board assembly 810, a light ranging device 820, and an enclosure 830. As shown in FIG. 8A, LIDAR system 800 includes an upper circuit board assembly 8 that.

As shown in FIG. 8A, upper circuit board assembly 810 is of a two-board configuration, similar to that described above in reference to FIG. 6A and includes a ranging device control board 840 and the rotor board 850. In some embodiments, ranging device control board 850 and rotor board 730 correspond to stator control board 624 and rotor control board 614, respectively described above in reference to FIG. 6A.

Rotor board 850 includes a bearing assembly 860, shown in FIG. 8B, which is an exploded view of rotor board 850. Bearing assembly 860 includes bearings 862 and 864, which are inserted into either end of a t-shaped bearing housing 865. T-shaped bearing housing 865 can then attached to rotor board 850 with screws 866.

Rotor board 850 can be placed on top of assembled lower circuit board assembly 700 by fitting the central portion of T-shaped bearing housing 865 over shaft 715. A circular nut 852 can then be fitted into a circular central recess 854 in the top surface of the t-shaped bearing housing 86 and threaded onto the top of shaft 715 to securely attach rotor board 850 to lower circuit board assembly 700. As discussed above, rotor board 850 is able to rotate relative to lower circuit board assembly 700 due to the rotational coupling made between shaft 715 and bearings 862 and 864.

Ranging device control board 840 can then be joined to rotor board 850 by applying a downward pressure to the ranging device control board 840. To provide an electrical connection between ranging device control board 840 and rotor board 850, one or more electrical connectors can be attached to (e.g., soldered to) the lower surface of ranging device control board 840 (not visible in FIG. 8A) and the upper surface of rotor board 850 (e.g., connector 856). Ranging device control board 840 can then be secured to rotor board 850 using screws 846.

3. Attaching the Laser Ranging Device to the Rotary Actuator

Once the upper circuit board assembly has been assembled and secured to the lower circuit board assembly, light ranging device 820 can be electrically connected to the upper surface of ranging device control board 840, which mechanically connects the light ranging device to T-shape bearing housing 865. Light ranging device 820 includes a Tx module 822 and a Rx module 824 each of which can have dedicated electrical connectors that mate with corresponding connectors 844 and 846 disposed on the upper surface of light ranging device control board 840. As with the other boards in the system, connecting the light ranging device 820 to the rest of the assembled system can be achieved by applying a pressing force to the components. Once the connections are made, the pressing force can be maintained by screws 826 mounted on either side of light ranging device 820 as shown. In addition, a u-shaped bracket 828 can secured to light ranging device 820 with additional screws 826 to provide further structure to the assembly.

Once all the internal components are assembled, enclosure 830 can be dropped over the entire assembly and affixed to base 700, e.g., using one or more screws as well as adhesive, if required to achieve a more robust seal. Enclosure 830 can include an optically transparent window as described above with respect to FIG. 5 that enables laser pulses from Tx module 822 to be projected from the LIDAR system into the surrounding environment and enables reflected and scattered light from the pulses to be received by the LIDAR system via Rx module 824.

In the assembly process described above, various arrangements of screws and brackets are disclosed merely for the sake of example. Embodiments of the compact LIDAR system are not required to employ screw arrangements that are identical to that shown in FIGS. 7-8 and any number, arrangement, and type of fastener, including adhesive, deformable pins or latches, rivets, or welds, can be used without departing from the scope of the present disclosure.

XI. Optics and Optoelectronics

Figure 9A:
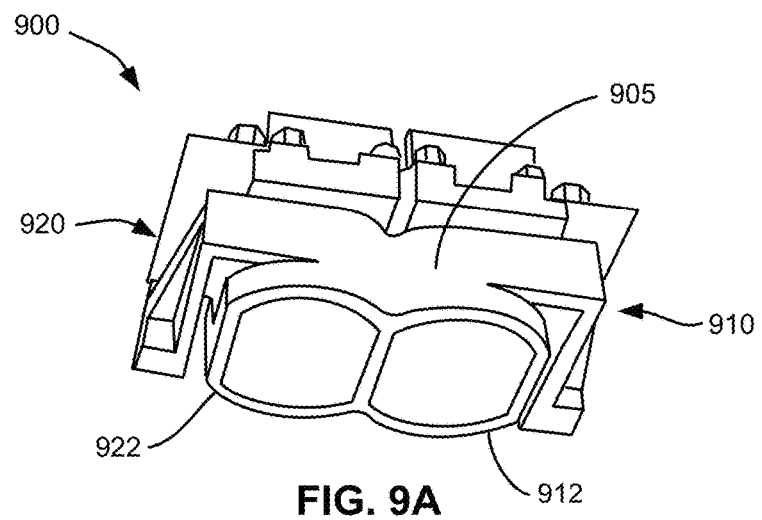
FIGS. 9A-9C show a perspective view, a front view, and a zoomed front view, respectively, of a light ranging device 900 according to certain embodiments.
Figure 9B:
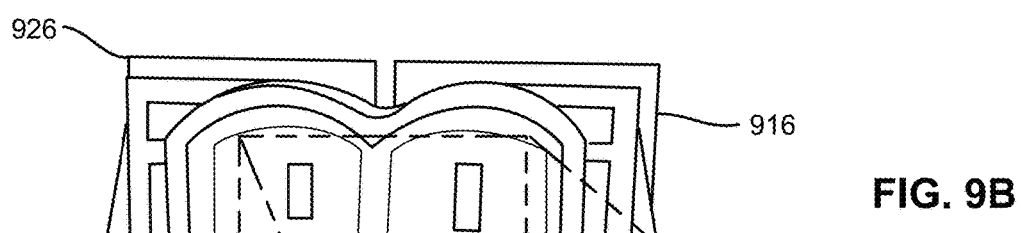
Figure 9C:
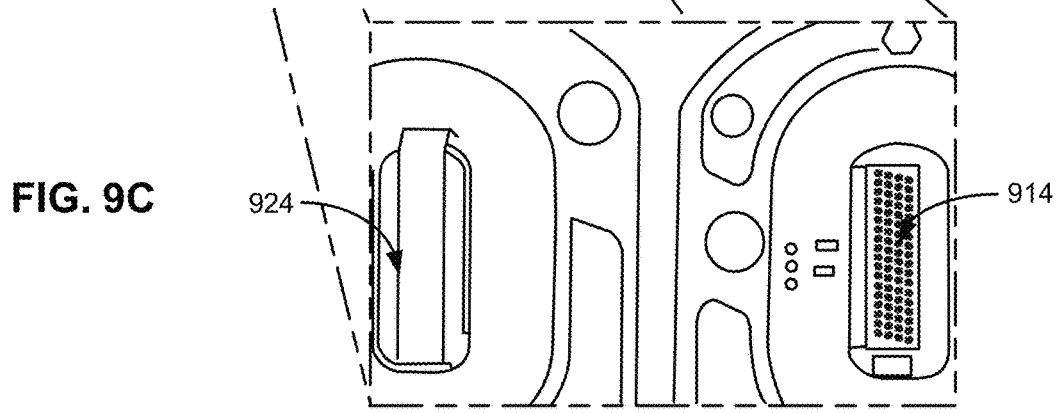

FIGS. 9A-9C show a perspective view, a front view, and a zoomed front view, respectively, of a light ranging device 900 according to certain embodiments. The light ranging device 900 can correspond to embodiments described above in reference to FIGS. 1-6, e.g., light ranging device 320 described above in reference to FIG. 3 or light ranging device 510 described with respect to FIG. 5. Light ranging device 900 includes two main modules: a light transmission (Tx) module 910 and a light sensing (Rx) module 920 spaced apart from each other within a common housing or mount 905 that includes two lens tubes, e.g., transmitter lens tube 912 and detector lens tube 922. The light Tx module and light Rx modules each include bulk optics modules (not shown) that are positioned in front of their respective sensors/emitters, e.g., by sliding the bulk optics module into the appropriate lens tube. The bulk optics modules are described in more detail below. On the transmission side, located behind the Tx-side bulk optics module is, optionally, a Tx-side micro-optics assembly. Details of the micro-optics assembly are set forth below in reference to FIGS. 10-11. Behind the optional transmit-side micro-optics assembly is an emitter array 914, e.g., a monolithic single-chip NIR VSCEL array fabricated on InGaAs, or the like. On the detector side, located behind the Rx-side bulk optics module is a Rx-side micro-optics assembly, also described in more detail below in reference to FIGS. 10-11. Behind the Rx-side micro-optics assembly is a single chip detector array and ASIC combination 924, e.g., a monolithic single-chip MR SPAD array fabricated on a CMOS process, or the like.

Both Rx module 920 and Tx module 910 are backed by circuit boards 926 and 916, respectively, that include additional supporting circuitry for the light ranging device, e.g., voltage regulators, VCSEL current drivers, and the like. For example, circuit board 926 can include circuitry for counting signals from SPADs to include in a histogram of time bins, which may be specified by a time-to-digital converter. Circuit board 926 can also include match filtering for analyzing the histogram to determine a received time. In some embodiments, a programmable computation element such as an FPGA (e.g., to perform advanced filtering, such as interpolation) may be operatively connected to the Rx module 920.

While not shown in FIG. 9A-9B, the FPGA can be located on one or more boards of the upper board assembly of the rotary actuator described above, that include, e.g., the rotor half of a brushless motor, the receive side of a rotary transformer power link, the receive side of a rotary optical uplink, and the transmit side of a rotary optical downlink. These elements taken together are referred to herein as the turret assembly of the LIDAR system. In certain embodiments, the turret assembly can spin at a frequency of 1 Hz to 30 Hz, taking range measurements at fixed angular intervals. In one embodiment, for any given full rotation ("frame"), a 64×2048 resolution depth image can be produced, although the user may select other resolutions by changing device operating parameters. In some embodiments, the LIDAR system can acquire 2,621,440 points (range measurements) per second.

1. Optical Systems for the Tx and Rx Modules

Figure 10:
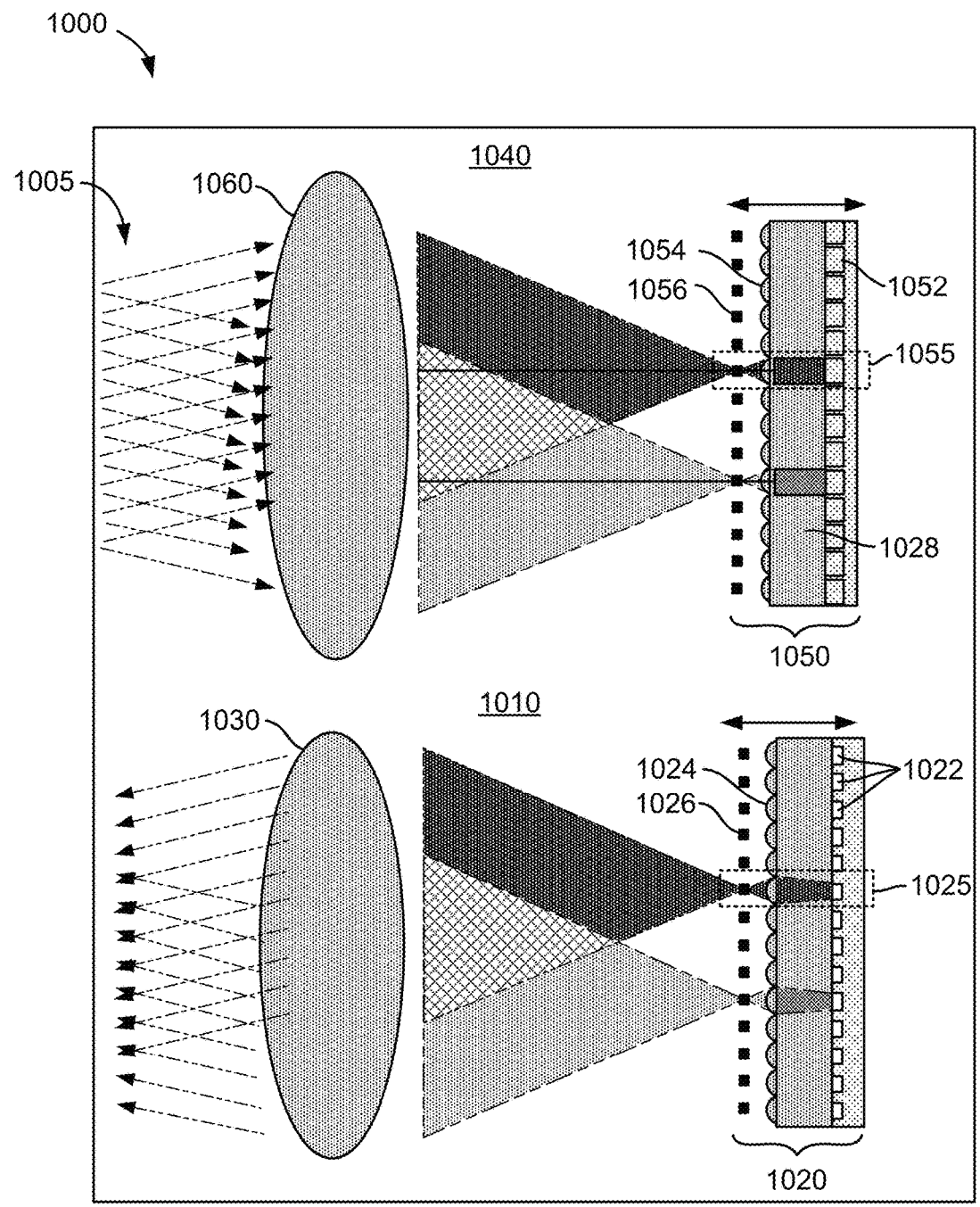
FIG. 10 shows an optical block diagram of a light ranging device 1000 showing both the optical systems for a Rx module 1001 and a Tx module 1003 according to certain embodiments.

FIG. 10 shows an optical block diagram of a light ranging device 1000 according to some embodiments of the disclosure. As shown in FIG. 10, light ranging device 1000 includes a light transmission (Tx) module 1010 and a light sensing (Rx) module 1040. Light transmission module 1010 can be representative of Tx module 910 while light sensing module 1040 can be representative of Rx module 920. Embodiments of the disclosure are not limited to the specific optical configurations shown in FIG. 10. In other embodiments, light transmission module 1010 and light sensing module 1040 can include fewer, more or different optical components. Non-limiting examples of other configurations for light transmission module 1010 and light sensing module 1040 are set forth in U.S. application Ser. No. 15/979,235 entitled "Optical Imaging Transmitter with Brightness Enhancement," filed on May 14, 2018, and U.S. application Ser. No. 15/979,266 entitled "Spinning LIDAR Unit with Micro-optics Aligned behind Stationary Window," filed on May 14, 2018, the disclosures of each of which are incorporated herein by reference in their entirety for all purposes.

Embodiments of the light ranging device 1000 can be employed within the compact LIDAR system disclosed herein as described above in reference to, e.g., FIGS. 5A-5B. The Tx module 1010 provides active illumination of objects in the area around the LIDAR system by, e.g., transmitting pulses of narrow band light, e.g., NIR light having a spectral width of, e.g., 2 nm, 1 nm, 0.5 nm, 0.25 nm or less, into one or more fields of view, as shown in FIGS. 1A-1B and 4 above. The Rx module 1040 detects reflected portions of the transmitted narrowband light that is reflected by the objects in the scene.

As shown in FIG. 10, Tx module 1010 can include a TX-side micro-optics package 1020 and a bulk optical element 1030. The TX-side micro-optics package 1020 includes a plurality of light emitters 1022, and optionally includes a micro-lens layer 1024 and an aperture layer 1026. Emitters 1022 can be arranged in a one or two-dimensional array of transmitter channels, e.g., channel 1025 shown in the boxed region. Each one of the transmitter channels has one or more light emitters 1022, e.g., NIR VCSELs or the like, capable of emitting narrowband light, and optionally, a micro-lens from lens layer 1024 and an aperture from aperture layer 1026.

Light emitted from each one of the transmitters diverges as it approaches one of the micro-optics of the Tx-side micro-optic lens layer 1024. Micro-lenses from micro-lens layer 1024 capture the diverging light and refocus it to a focal plane that is coincident with apertures in aperture layer 1026 that includes an array of apertures that correspond in position to the array of micro-optics and the array of emitters. Aperture array 1026 can reduce crosstalk in the system. After exiting the micro-lenses, the focused light again diverges in the form of cones that then encounter the Tx-side bulk imaging optics module 1030. Details of the Tx-side bulk imaging optics module 1030 are discussed in more detail below.

In some embodiments, the separation between the micro-lens layer 1024 and the Tx-side bulk imaging optics module 1030 is equal to the sum of their focal lengths, such that light focused at the aperture array 1026 appears as collimated light at the output of the Tx-side bulk imaging optics module 1030 with each collimated bundle of rays exiting the Tx-side bulk imaging optics module 1030 at a different angle. Accordingly, the light from each emitter is directed to a different field of view ahead of the device. In some embodiments, the Tx-side bulk imaging optic 1030 is telecentric on the VCSEL side of the lens, i.e., in a ray diagram of the system, all the chief rays entering anywhere within the aperture of the bulk imaging optic 1030 leave the lens travelling parallel to each other and intersect the VCSEL (image) plane at an angle of incidence that is substantially perpendicular to the VCSEL (image) plane. In this configuration the VCSEL array advantageously operates as a telecentric source, i.e., the optics capture substantially all light produced by the emitter array, even light that is emitted from the emitters on the outer edges of the array. Without the telecentric design, light captured by the outer emitters may be reduced, scattered or refracted in an undesirable manner because of their highly oblique angle of incidence.

The Rx module 1040 includes an Rx-side bulk imaging optics module 1060 and an RX-side micro-optics package 1050. The RX-side micro-optics package 1050 has either a one or two-dimensional array arrangement that matches the TX-side micro-optics package 1020, with a micro-optic receiver channel 1055 for each corresponding micro-optic transmitter channel 1025. The RX-side micro-optics package 1050 includes an Rx-side aperture array layer 1056, an Rx-side micro-optics lens layer 1054, a narrow band optical filter layer 1028 and a sensor array layer 1052. The portions of the emitted light that reflect off of objects in the field, shown as light rays 1005, enter the Rx-side bulk imaging optics module 1060 from multiple directions. The Rx-side bulk imaging optics module 1060 focuses light rays at a plane that is coincident with the Rx-side aperture array layer 1056. The focused light then is captured by the micro-lenses of the Rx-side micro-optics lens layer 1054 and directed to a sensor array layer 1052 in a collimated fashion (i.e. having a divergence half angle of less than ten degrees).

In some embodiments, the sensor array layer 1052 includes a 1-D or 2-D array of light sensors or a one or two dimensional array of groups of light sensors, e.g., SPADS and the like. In some embodiments, each sensor or group of sensors in the array corresponds to an emitter in the emitter module and thus a "pixel" in the ranging data.

In some embodiments, to remove spurious background light, a narrow band optical filter layer 1028 can be disposed within the layered structure, e.g. between the micro-optics array and the sensor array layer 1052. The pass band of the narrow band optical filter layer 1028 can be chosen to correspond with the center wavelength of the emitters and the width of the pass band can be wide enough to accommodate any variation in the output wavelength across the emitter array. In some embodiments, where a very narrow pass band is desired, a control system can stabilize the wavelength of the emitters individually or as a whole. In some embodiments, where a very narrow pass band is desired, the collimation angle of the light passing through filter layer 1028 must be tightly controlled so that no angle-of-incidence shifts occur (as is common in thin-film interference filters); the collimation angle is primarily controlled by the size of apertures in RX-side aperture array layer 1056, the focal lengths of the lenses in RX-side micro-optic lens layer 1054, the relative positioning between RX-side aperture array layer 1056 and RX-side micro-optic lens layer 1054, and surface quality and form precision of RX-side micro-optic lens layer 1054. In some embodiments the narrow band optical filter layer 1028 is continuous planar layer across the entire array of sensors. In other embodiments, the narrow band optical filter layer 1028 can be fabricated as an array of micro-optical elements that correspond with the pixel geometry of the sensor array layer 1052.

As with the Tx side, the individual elements of the Rx module 1040 form micro-optic receiver channels, e.g., receiver channel 1055. According to certain embodiments, the array of micro-optics and receivers can have a layered monolithic structure. Each micro-optic receiver channel 1055 measures light for a different pixel in the sensor array layer 1052, i.e., the optics of the Rx module 1040 serve to map bundles of parallel rays entering the module from different angles to different corresponding spatial positions on the sensor array layer 1052. In some embodiments, the bulk imaging optics module 1060 is telecentric on the detector side of the system to avoid the non-idealities in the image plane in a manner similar to the TX side, as described above.

In some embodiments, the micro-optic receiver channels as formed by the cooperation between the micro-optic lens layer 1054, narrow band optical filter layer 1028, and Rx-side aperture array layer 1056 provide for increased isolation between different pixels on the sensor array layer. This is advantageous because in some situations, such as when the emitter light is reflected from a strong reflector in the field, such as a stop sign, the photon flux at the Rx side for each channel can be sizable, making the system susceptible to cross talk and blooming (i.e. the incoming light from one channel may be so bright that it is detectible by an adjacent channel). One solution to the booming problem is to employ a complex time multiplexing scheme such that only one emitter-detector pair (or a carefully chosen group of emitter-detector pairs) are triggered at any given time, therefore eliminating the risk of cross talk. Such an arrangement requires additional timing electronics and multiplexing software and hardware which adds additional cost and complexity to the system. In addition, time-multiplexing is an inefficient data collection method because each receiver emitter pair must be sequentially activated in series thereby increasing the overall acquisition time of the array as a whole. Advantageously, the design of the Rx side micro-optics assembly reduces cross-talk to such an extent that time multiplexing and sequential activation is not necessary, i.e., all channels can be employed at the same time to collect data points in parallel, in a manner similar to a flash LIDAR system.

The design of the micro-optical systems for the Rx module 1040 and the Tx module 1010 advantageously enable the conceptual LIDAR arrangement described above in reference to FIG. 3 where each transmitter element is paired with a sensor element such that the sensor element views light only from the field of view that the transmitter illuminates. This 1:1 pairing of fields of view helps eliminates cross-talk in the detector from adjacent or neighboring pixels. The additional micro-optical aperture layer also helps to eliminate cross-talk. The narrow band filter layer helps to remove background light which may contribute to spurious signal detection, eventually leading to ranging errors.

2. Micro-Optics

Figure 11A:
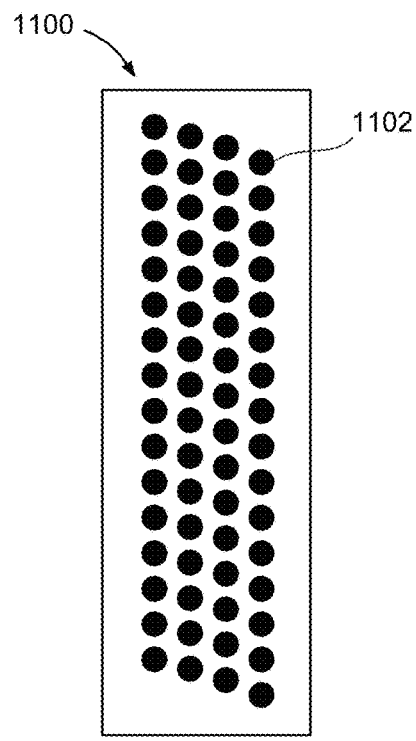
FIG. 11A shows a top view of a micro-optics package according to certain embodiments.

FIG. 11A shows a simplified top view of a micro-optics package 1100 according to certain embodiments. Micro-optics package 1100 can be applied on either or both the transmitter or detector side of the light ranging device and includes a plurality of channels 1102. For example if implemented on the receiver side, each channel 1102 would correspond to a single micro optical receiver channel, such as channel 1055. Similarly, if implemented on the transmitter side, each channel 1102 would correspond to a single transmitter channel, such as channel 1025. In the example shown in FIG. 11A, the micro-optical channels are laid out as an m×n staggered array, e.g., laid out in 16×4 array. As an example, if FIG. 11A represents receiver channels, for a receiver channel size of 0.500 mm (diameter) the layout illustrated can be implemented in a chip of size 8.000 mm by 2.000 mm.

Other array patterns are possible without departing from the scope of the present disclosure. For example, rather than a staggered array, any of the following shaped arrays can be employed: a square array, a 1-D straight line array (m×1), a warped linear (m×1) array, a warped rectangular m×n array, or arrays having any arbitrary pattern. As used herein the term "warped" refers to embodiments where the spacing between receiver channels is uneven. For example, receiver channels near the center, are spaced closer together, while the exterior channels are spaced further apart. The warped layout has an advantage of being able to allow for correction of the distortion curve of a lens (i.e. the angles between the receiver channel fields of view are evenly spaced in the object space).

Figure 11B:
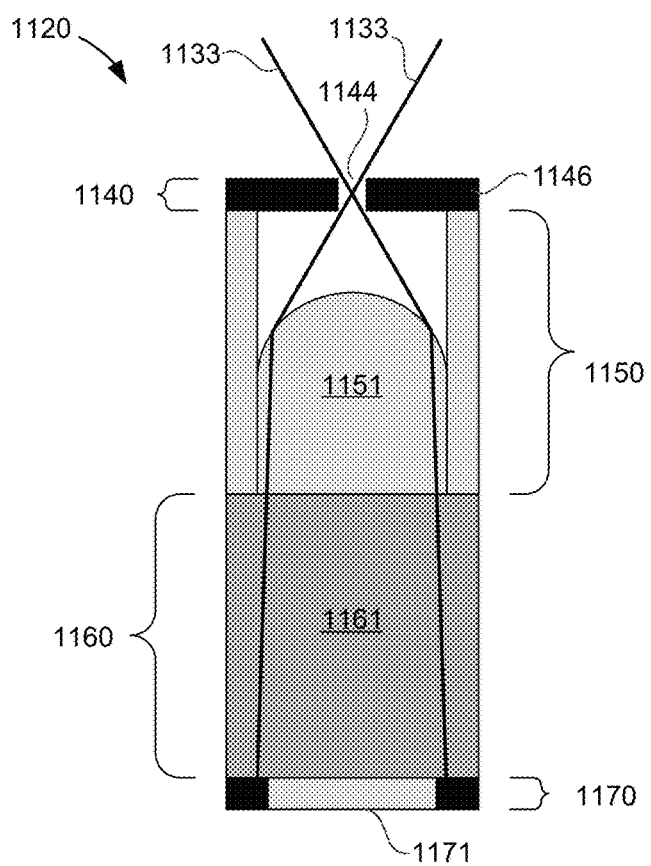
FIG. 11B shows a cross-section of a single micro-optic receiver channel according to some embodiments.

FIG. 11B shows a cross-section of a single micro-optic receiver channel 1120 according to some embodiments that can be representative of, for example, receiver channel 1055 shown in FIG. 10. Receiver channel 1120 serves to accept an input cone of light containing a wide range of wavelengths, filters out all but a narrow band of those wavelengths centered at the operating wavelength, and allows a pixel (photosensor) 1171 to detect only or substantially only photons within the aforementioned narrow band of wavelengths. Embodiments of the disclosure are not limited to any particular configuration for receiver channels and channel 1120 is just one example of a receiver channel that can be implemented as receiver channel 1055.

In some embodiments, the receiver channel 1132 includes an input aperture layer 1140 including an optically-transparent aperture 1144 and optically-non-transparent stop region 1146. Aperture 1144 is configured to define a narrow field of view when placed at the focal plane of an imaging optic, such as bulk receiving optic 1060. As used herein, the term "optically-transparent" refers to a material that allows most or all incident light to pass through. As used herein, the term "optically non-transparent" refers to a material that allows little to no light to pass through, e.g., a reflecting or absorbing surface. The aperture layer 1140 is configured to receive the input marginal ray lines 1133. The aperture layer 1140 may include an array of optically-transparent apertures and optically-non-transparent stop regions built upon a single monolithic piece such as an optically-transparent substrate. In some embodiments, aperture layer 1140 can be formed from a optically non-transparent material that forms stop regions 1146 and apertures 1144 can be holes or openings in layer 1140.

In some embodiments, the receiver channel 1120 includes an optical lens layer 1150 including a collimating lens 1151 characterized by a focal length. The collimating lens can be offset from the plane of aperture 1144 and stop region 1146 by the focal length and aligned axially with aperture 1144 (i.e., the optical axis of the collimating lens is aligned with the center of the aperture). In this manner the collimating lens can be configured to collimate light rays passed by the aperture such that the light rays are travelling approximately parallel to the optical axis of collimating lens 1151. The optical lens layer 1150 may optionally include apertures, optically-non-transparent regions and tube structures to reduce cross talk.

In some embodiments, the receiver channel 1132 includes an optical filter layer 1160 including an optical filter 1161, e.g., a Bragg reflector type filter or the like. In some embodiments, the optical filter layer is disposed on a detector-side of the an optical lens layer 1150 (as opposed to the aperture side). The optical filter layer is configured to pass normally incident photons at a specific operating wavelength and passband. The optical filter layer 1160 may contain any number of optical filters 1161. The optical filter layer 1160 may optionally include apertures, optically-non-transparent regions and tube structures to reduce cross talk.

In some embodiments, receiver channel 1132 includes a photosensor layer 1170 including a pixel 1171 disposed behind the filter layer. The pixel can be a photosensor capable of detecting photons with a detector active area made of, e.g., a standard photodiode, an avalanche photodiode, an array of SPADs, RCPs (Resonant Cavity Photodiodes), or other suitable photodetectors. Photosensor 1171 may be composed of several photon detector areas (e.g., each a different SPAD) cooperating together to act as a single pixel, often with higher dynamic range, faster response time, or other beneficial properties as compared to a single large photon detection area. Photosensor layer 1170 refers to a layer made of pixels and can include optional structures to improve detection efficiency and reduce cross talk with neighboring receiver structures. Photosensor layer 1170 may optionally include diffusers, converging lenses, apertures, optically-non-transparent tube spacer structures, optically-non-transparent conical spacer structures, etc.

Stray light may be caused by roughness of optical surfaces, imperfections in transparent media, back reflections, and so on, and may be generated at many features within the receiver channel 1132 or external to receiver channel 1132. The stray light can be directed through the filter region 1161 along a path non-parallel to the optical axis of collimating lens 1151; reflecting between the aperture 1144 and the collimating lens 1151; and generally taking any other path or trajectory possibly containing many reflections and refractions. If multiple receiver channels are arrayed adjacent to one another, this stray light in one receiver channel may be absorbed by a pixel in another channel, thereby contaminating the timing, phase, or other information inherent to photons. Accordingly, the receiver channel 1120 may also feature several structures to reduce crosstalk and increase signal between receiver channels. Examples of such structures and other suitable receiver channels are described in U.S. patent application Ser. No. 15/979,295 entitled "Micro-optics for Imaging Module with Multiple Converging Lenses per Channel," filed on May 14, 2018, the disclosure of which is hereby incorporated by reference in its entirety for all purposes.

3. Detector Array (e.g., SPADs)

FIGS. 12A and 12B show a top view of a SPAD-based photosensor array layer 1200 according to certain embodiments. Photosensor array layer 1200 shown in FIG. 12A is a two-dimensional array of sensor channels 1210 where each individual sensor channel can correspond, for example, to receiver channel 1055. Thus, each sensor channel 1210 can include a group of SPADs as described above. In the example shown in FIG. 12A, photosensor array 1200 is an 18×4 array that includes a total of 72 individual sensor channels 1210. Photosensor array 1200 also includes 8 calibration pixels 1220 at the top of the array. Calibration pixels 1220 can be, for example, covered by an opaque surface such that they are not exposed to any light and therefore can be used to measure dark counts.

FIG. 12B shows a magnified view of a subset of sensor channels 1210 illustrating that each sensor channel 1210 can be formed from a group (array) of individual SPADs 1212 cooperating together to act as a single pixel. Such an arrangement is advantageous when SPADs are used as the photodetectors because after a photon detection event, a SPAD suffers some deadtime during which external circuitry operates to quench the SPAD so that it is ready to detect again. Thus, a single SPAD has an upper limit to the light intensity (measured in photons/sec) that it can detect. That is, a single SPAD cannot detect a light intensity that is greater than one photon per quench time. Collecting multiple SPADs together as shown in FIG. 12B increases the overall intensity that can be detected because not all SPADs will be saturated at the same time. Thus, a collection of N SPADs may be able to detect with N-times the dynamic range of a single SPAD.

4. Emitter Array (e.g., VCSELs)

FIGS. 13A and 13B depict simplified top and side views, respectively, of an emitter array 1300 according to certain embodiments. The emitter array 1300 can include a two-dimensional array of VCSEL emitters 1310 that are fabricated on a single monolithic chip 1305 and whose pattern matches the photosensors pixels on a corresponding sensor chip. In this example, emitter array 1300 VCSEL array is 16×4 for a total of 64 emitter channels 1310 to match the middle 64 detector channels shown in FIG. 12A above. Emitter array 1300 can also include a plurality of leads 1320 over which signals to drive the various emitters in array 1300 can be transmitted to the emitters.

As was described in reference to FIG. 12A, the monolithic VCSEL array of optical emitters can be arranged behind the TX-side micro-optics package and behind the TX-side bulk optics module. Each VCSEL emitter can output an illuminating beam of an initial diameter that is substantially identical to (or slightly greater than) the diameter of a corresponding aperture defined either by the aperture layer or the numerical aperture of the micro-lenses of the micro-optics layer to ensure that all or substantially all of the light emitted by the VCSEL will be transmitted to objects in the field.

5. Bulk Optics

In some embodiments, the present disclosure provides a telecentric light ranging device having a fast lens system (e.g., f-number=1.0, 1.2, or 1.4) and/or a lens system that is passively athermal over a specified temperature range that is likely to be encountered when the light ranging device is used for obstacle detection and avoidance in autonomous navigation for automobiles, trucks or other vehicles. In addition, the bulk optical system possesses a low focal plane distortion and one or more of the optical elements may be AR coated to maximize optical throughput and reduce stray reflections, ghosting, and cross-talk amongst different sensor channels. Advantageously, the optical system is image-space telecentric and thus provides a "straight on" view (when viewed from the object side) of each of the detector channels of the sensor array (each chief ray arrives perpendicular to the focal plane), even those on the outer edges of the array.

As used herein, passively athermal describes an optics system, wherein the spot quality of light from an extended source with non-zero angular size focused by a lens system on an array does not change significantly as temperature changes. If the back focal length of the lens system changes, and the array remains in the same place relative to the rear lens element, then the spot quality of light on the array would change. As used herein, spot quality can be defined by a fraction of light from an extended source with angular size of 0.13 degrees that is focused onto the image plane and contained by a circle 25 μm in diameter. An opto-mechanical system is considered to be passively athermal over a temperature range if the spot quality remains above 50% for all temperatures in the temperature range. The diameters and angular sizes listed are exemplary and depend on the size of the apertures in the micro-optic array, the focal length of the system, etc.

FIG. 14 depicts a simplified schematic of a portion of an optical module 1400 that provides a thermally stable image plane over a wide range of temperatures according to some embodiments. Optical module 1400 includes an array 1410, a bulk lens system 1420, a lens housing 1430, and a mount 1440 to mechanically couple the housing with the array. Optical module 1400 can be representative of an embodiment of light sensing module 330 (in which case array 1410 can be an array of photosensors) or an embodiment of light emitting module 340 (in which case array 1410 can be an array of emitters), and in some embodiments mount 1440 can representative of a portion of mount 905 shown in FIG. 9. A light ranging device according to some embodiments of the disclosure can include a first optical module 1400 as a light sensing module and a second module 1400 as a light emitting module.

Array 1410 can be planar (e.g., having irregularity from a perfect plane less than 1 mm peak-to-valley over a 10 mm diameter disc) for ease in manufacturing (e.g., forming arrays in bulk on a semiconductor substrate, wherein there are a plurality of emitters or detectors in one array). In some embodiments, array 1410 can include a micro-optics structure, such as transmitter micro-optics package 1020 or receiver micro-optics package 1050 discussed above with respect to FIG. 10 depending on optical module 1400 is implemented as a light sensing module or as a light emitting module.

As shown in FIG. 14, lens system 1420 can include a first lens 1422, a second lens 1424, a third lens 1426, and a fourth lens 1428. In some embodiments, the first lens, the second lens, the third lens, and the fourth lens are mounted in the lens housing 1430. When implemented as part of an imager sensor (i.e., array 1410 is an array of photosensors), lens housing 1430, lens system 1420, and mount 1440 are configured to passively focus light from the lens system to the photosensor array over a temperature range (e.g., from −40 Celsius to 85 Celsius, −50 Celsius to 95 Celsius, −35 Celsius to 60 Celsius, −40 Celsius to 105 Celsius, −45 Celsius to 110 Celsius, or −35 Celsius to 100 Celsius). In embodiments that include a micro-optics structure in the array, the lens system 1420 is configured to passively focus light from the lens system to the aperture layer of the micro-optics structure and the various micro-optic components in the micro-optic structure can then focus light received at each individual micro-optic channel to the corresponding photosensor for that channel.

The array can be kept at the image plane of the lens system for varying temperatures. Materials can be chosen to reduce cost, reduce weight, and/or maintain the image plane at the array. To reduce costs, first lens 1422, second lens 1424, the forth lens 1428 can be made of plastic (e.g., OKP-1), while third lens 1426 can be made of glass (e.g., to reduce temperature variations in the lens system). A nominal distance between an apex of the fourth lens and the image plane is 8 mm. In the lens assembly shown, the image plane moves toward the fourth lens as temperature increases. This is perhaps counter intuitive given that the index of refraction for plastic decreases as temperature increases, which would usually push the image plane away from a plastic lens since a lens with a lower refractive index would refract light less sharply (i.e., longer focal length) than a convex plastic lens of similar shape with a higher refractive index (e.g., according to the Lensmaker's Equation where focal length is inversely proportional to a difference between the refractive index of the lens and air, where refractive index of air equals 1; see also Snell's Law). The combination of a glass lens with two or more plastic lenses may allow the effective focal length of the lens system to decrease with increase of temperature even though one or more plastic lenses in the lens system has a focal length that increases with temperature.

Lens housing 1430 (e.g., made of polycarbonate) can elongate as temperature increases. In some embodiments, mount 1440 attaches to lens housing 1430 near third lens 1426, so that fourth lens 1428 moves to the right as temperature of the housing increases. Material of mount 1440, which separates lens housing 1430 from array 1410, expands with increasing temperature, moving lens housing 1430 away (e.g., left) from array 1410. Simultaneously, lens housing 1430 expands with increasing temperature moving the fourth lens 1428 toward (e.g., right) array 1410. Also simultaneously, the back focal shift moves the image plane leftward, as described above. By choosing the housing material CTE, mount material CTE, and the housing-to-mount interface location appropriately, the back focal shift can be compensated by the aforementioned housing expansion and mount expansion such that the image plane remains approximately coincident with the array over the temperature range.

In some embodiments, mount 1440 can be coupled with lens housing 1430 near the glass lens (i.e., third lens 1426 in some embodiments). In some embodiments, mount 1440 can be coupled with lens housing 1430 near the glass lens so that a lens of lens system 1410 nearest array 1410 (e.g., fourth lens 1428) can move in relation to array 1410 (e.g., toward the array) as the focal length of lens system 1420 moves in relation to array 1410 (e.g., away from the array). In some embodiments, near can be a point or line on the outside of lens housing 1430, nearest the glass lens, and/or or within +/−5 mm or +/−10 mm from the point or line.

The spot quality of the lens system in FIG. 14 was experimentally verified for a temperature range from −5 degrees C. to 70 degrees C. using the Zemax optical design program. In some embodiments, the inside of the LIDAR unit can be deliberately heated when the environment gets below a specific temperature. For example, when the environment is −40 degrees C., internal components of the LIDAR unit can be heated to keep the lens system at a temperature of −5 degrees C. or higher. In some embodiments a light ranging device can include a temperature sensor and a heating element (e.g., a resistive heater) that can heat the lens system when the temperature drops below a predetermined level as detected by the temperature sensor. Accordingly, system 1400 can be expected to perform well from at least temperatures ranging from −40 degrees C. to 70 degrees C. (a temperature range of 100 degrees). In various embodiments, system 1400 can provide a stable image plane over temperature ranging from 0 degrees C. to 32 degrees C.; from 0 degrees C. to 55 degrees C.; from −10 degrees C. to 32 degrees C.; from −10 degrees C. to 55 degrees C.; from −20 degrees C. to 60 degrees C.; from −40 degrees C. to 85 degrees C.; and combinations thereof. In some embodiments, the temperature range can be from −40 degrees C. to 105 degrees C. (a temperature range of 145 degrees).

It can be often desirable to make lens housing 1430 out of material with a comparable coefficient of thermal expansion (CTE) to the lenses to avoid stressing the lenses. Changing the housing material can also change how the lens elements are spread apart as temperature increases. In some embodiments, the material CTE of lens housing 1430 is not changed/tuned substantially to prevent reduction in optical performance. Thus, the lens housing material has a CTE close to that of the lenses; and not all possible materials for the housing are considered because some housing materials have CTEs that are sufficiently different from CTEs of lenses that stress in the lenses will occur, which can result in degradation of optical performance of the lenses.

The CTE of lens housing 1430 can be matched, over a temperature range, with lens system 1420 so that a focal plane of lens system 1420 is stable relative to lens housing 1430 over the temperature range. In some embodiments, a thermal coefficient of mount 1440 is matched with lens system 1420 and/or with thermal expansion of lens housing 1430 so that the focal plane is stable relative to a position of the detector (e.g., detector array) over the temperature range. As used herein, a focal plane is said to be "stable" over a range of temperatures if the focal plane maintains a predetermined resolution at the detector for the system over the given temperature range. As an example, in some embodiments a predetermined resolution requires light focused to a point at the detector to have 50% of the light in a 25 micron circle, in other embodiments a predetermined resolution requires light focused to a point at the detector to have 80% of the light in a 20 micron circle. The CTE of the material of mount 1440 can be chosen with a caveat that material of mount 1440 is strong and/or mechanically rigid (lower CTE materials tend to be stronger). In this example, the fact that the back focal shift is negative (leftward) rather than positive (rightward) allows a very rigid glass filled polymer, or even a metal like magnesium or aluminum, to be used for the separating material of mount 1440.

FIGS. 15A, 15B, and 15C depict an optical module 1500 according to some embodiments of the disclosure. Optical module 1500 includes a lens system 1520 with four lenses (of which only two, lenses 1522 and 1528, are visible in FIGS. 15A-15C) and a housing 1530. Lens system 1520 can be, for example, lens system 1420, while housing 1530 can be, for example, lens housing 1430. Since image sensors are generally not circular, the lenses of assembly system 1500 generally do not need to be circular. For example, a photosensor array associated with lens assembly 1500 can be narrow and tall, so lenses can be clipped in a rectangular fashion. It is typically easier and less expensive to make rectangular molded polymer optics, while it can be more expensive to grind glass lenses into rectangular shapes. The diameter of the third lens (not shown in FIGS. 15A-15C) can define a minimum width of the lens system, thereby defining part of the rectangular shape. By using a circular glass element and rectangular molded polymer optics lens assembly 1500 can be relatively easy and cheap to manufacture.

In some embodiments, two housings are put as close together as possible (e.g., touching), which is another reason to keep the glass lens (e.g., lens 3) small. For example, the light ranging device can include a first lens system mounted in a first housing, a second lens system mounted in a second housing, a sensor array, and an emitter array. The first lens system, the first housing, and the sensor array can form a first unit. The second lens system, the second housing, and the emitter array can form a second unit. The first unit and the second unit can be placed side by side as close as possible (e.g., no more than 2.5 cm spaced apart in some embodiments and no more than 5.0 cm in other embodiments) so that light emitted from the second unit and reflected/scattered is gathered by the first unit in similar field of views as the second lens system projected light from the emitter array.

Lens system 1520 can be designed to be a fast lens system. In some embodiments, the f-number of lens system 1520 is between 1.0 and 2.4 (e.g., 1.2). The spot sizes on the sensor array can have 80% of the light in a 20 μm circle. Further, lens system 1520 can have a track length equal to or less than 100 mm, 50 mm, 35 mm, and/or 20 mm, and/or equal to or greater than 5, 10, 15, 20, and/or 25 mm.

In various instances, bulk lens systems according to the present disclosure can include: two or more plastic lenses and at least one glass lens; two or more plastic lenses; and/or one or more glass lenses. In some embodiments, micro-optic structure can be included as part of the array as described above. The micro-optics can modify light differently for different emitters and/or detectors on the array, whereas the bulk lens system modifies light for the entire array. In some embodiments there is one or more micro-optic elements for each individual array element.

Figure 16A:
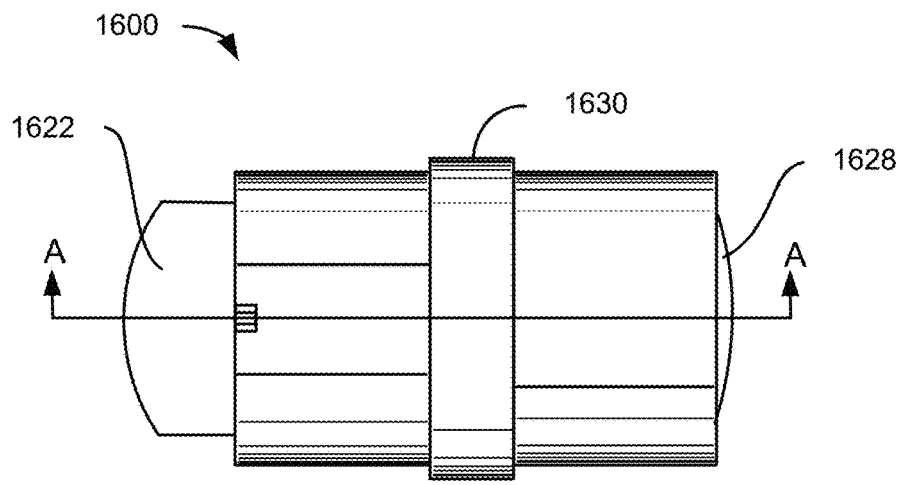
FIGS. 16A-16E depicts various views of an embodiment of a lens assembly.
Figure 16B:
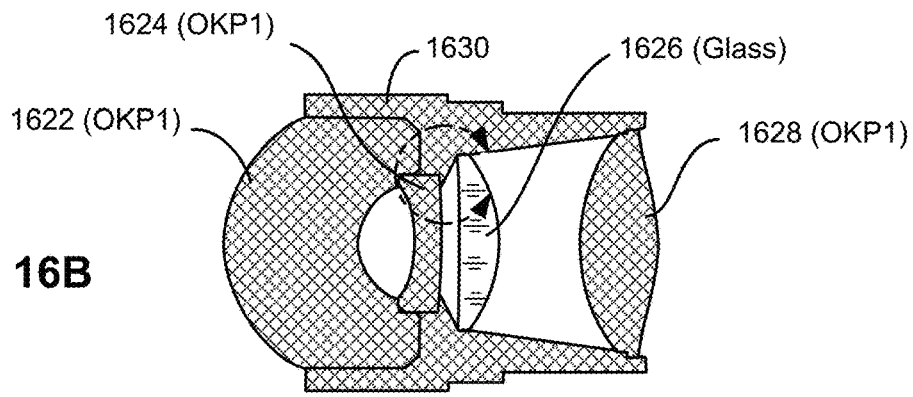
Figure 16C:
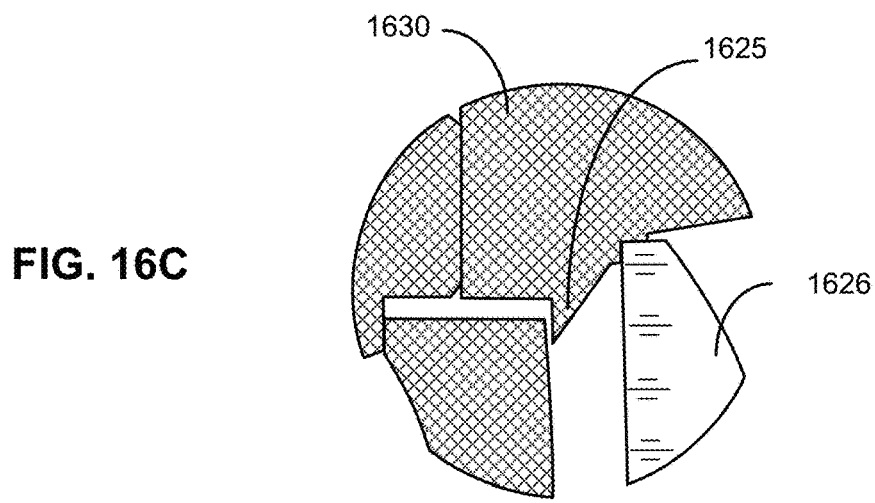

FIG. 16A depicts a top view of an embodiment of an optical module 1600 that can be, for example, optical module 1500. Cross section A-A is identified in FIG. 16A. FIG. 16B depicts an embodiment of cross section A-A. As shown in FIG. 16B, optical module 1600 includes four optical elements, including: element 1622 (e.g., lens 1), element 1624 (e.g., lens 2), element 1626 (e.g., lens 3), and element 1628 (e.g., lens 4); and a housing 1630. FIG. 16C shows a magnified portion of the cross section A-A. The magnified portion shows one example of how lens 1624 and lens 1626 can be mounted in housing 1630. The aperture stop 1625 of lens system 1600 is between lens 1624 and lens 1626. The aperture stop 1625 can be used to secure lens 1624 within the housing.

Figure 16D:
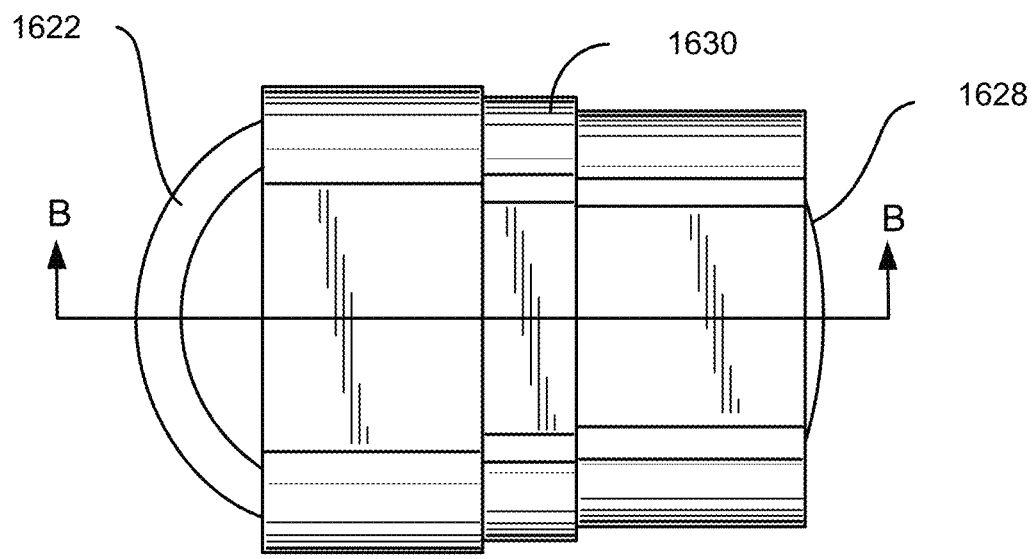
Figure 16E:
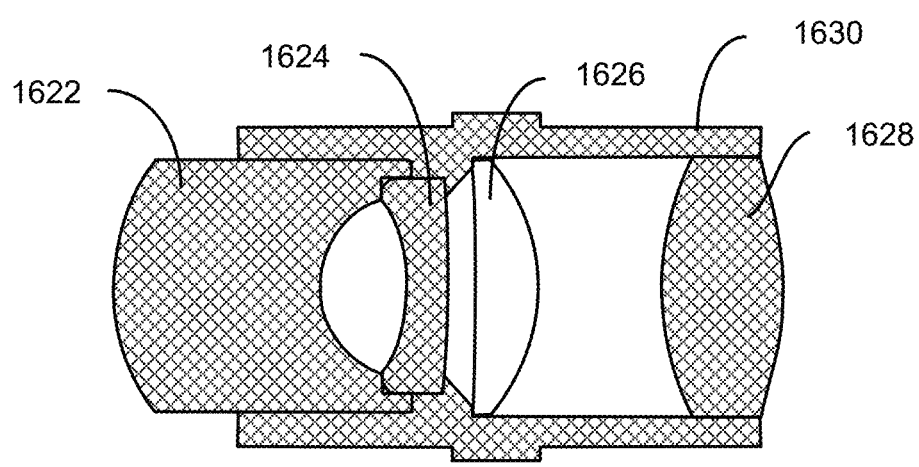

FIG. 16D depicts a side view of an embodiment of lens assembly 1600. Cross section B-B is identified in FIG. 16D. FIG. 16E depicts an embodiment of cross section B-B. Lens 1, lens 2, lens 3, lens 4, and the housing are shown.

Figure 17A:
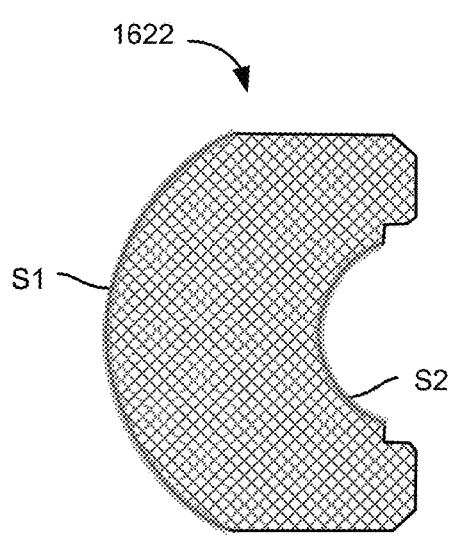
FIG. 17A-17D, depict a cross sections of embodiment of the lenses of a lens assembly.

FIG. 17A, depicts a cross section of an embodiment of first lens (lens 1522). The first lens has a first surface S1 and a second surface S2. The first surface S1 of lens 1522 and the second surface S2 of lens 1 are spherical. The first surface S1 of the first lens can be a convex surface. The second surface S2 of the first lens can be a concave surface. Light traveling from left to right can be focused by the first lens. The first surface of the first lens can be larger than the second surface of the first lens to gather light (e.g., reduce the f-number of lens system) for the lens system.

Figure 17B:
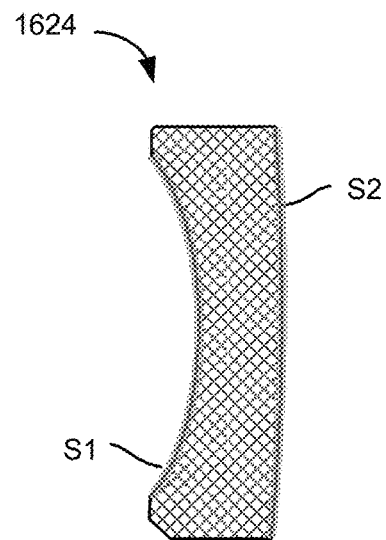

FIG. 17B, depicts a cross section of an embodiment of the second lens (lens 1524). The second lens has a first surface S1 and a second surface S2. The first surface S1 of lens 1524 and the second surface S2 of lens 2 are aspherical. The first surface S1 of the second lens can be a convex surface. The second surface S2 of the second lens can be planar, slightly convex, or slightly concave. Light traveling from left to right can be defocused by the second lens.

Figure 17C:
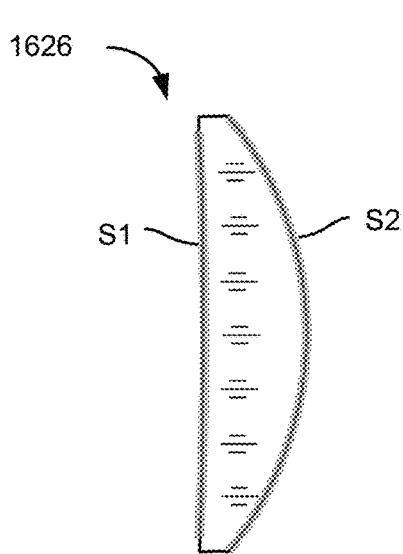

FIG. 17C, depicts a cross section of an embodiment of the third lens (lens 1526). The third lens has a first surface S1 and a second surface S2. The first surface S1 of lens 1526 and the second surface S2 of lens 3 are spherical. As examples, the third lens can have a width (e.g., diameter) equal to or greater than 10 mm and equal to or less than 20 mm (e.g., 11, 11.5, 12, 12.5, 13, 13.5, 14, and/or 14.5 mm). In some embodiments, the third lens is a high-index glass. In some embodiments, an index of the glass does not change (e.g., change equal to or less than 0.05%) for the temperature range of 100 degrees. The first surface S1 of the third lens can be planar, slightly convex, or slightly concave. The second surface S2 of the third lens can be convex. Light traveling from left to right can be collimated or slightly focused by the third lens.

Figure 17D:
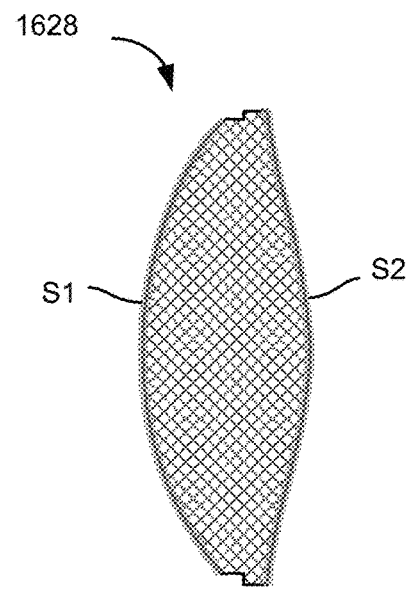

FIG. 17D, depicts a cross section of an embodiment of the fourth lens (lens 1528). The fourth lens has a first surface S1 and a second surface S2. The first surface S1 of lens 4 and the second surface S2 of lens 4 are aspherical. The first surface S1 of the fourth lens can be convex. The second surface S2 of the third lens can be convex. Light traveling from left to right can be focused to the array.

By mixing plastic and glass lenses, as well as mixing aspherical and spherical lenses, an economical, light, compact, and/or athermal light ranging device can be made for autonomous vehicles.

In some embodiments, the lens system has a fixed focal length (e.g., fixed focal length while at constant temperature; not a zoom lens). In some embodiments, the lens system has a fixed focal length to reduce size, weight, number of parts, and/or complexity of the lens system.

Figure 18:
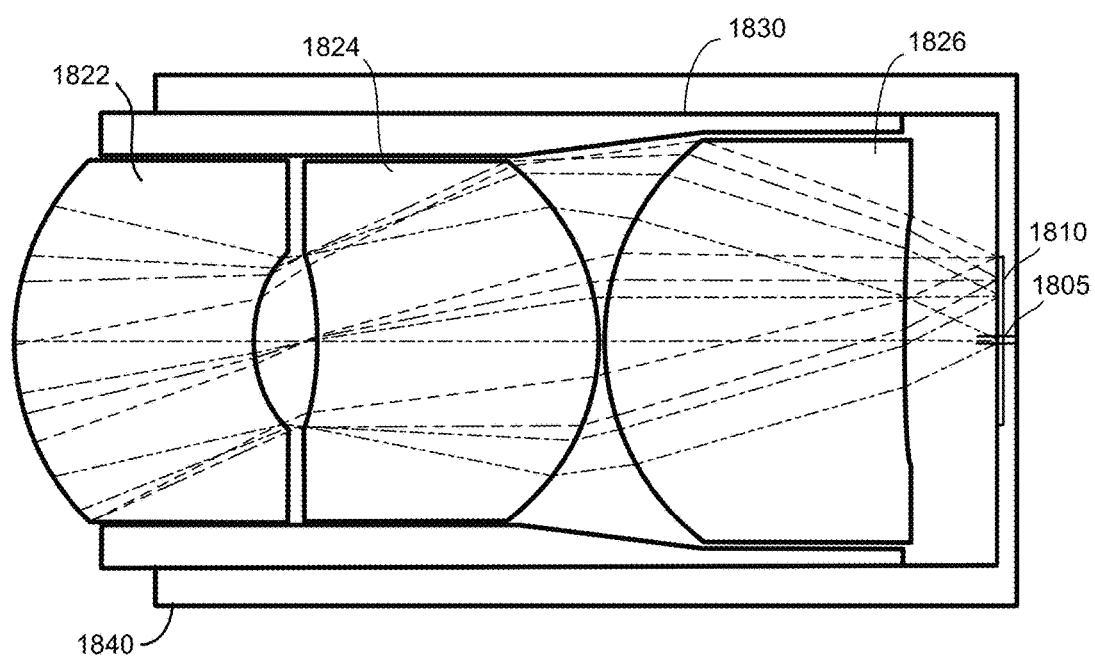
FIG. 18 depicts an embodiment of a lens assembly with three lenses.

FIG. 18 depicts an embodiment of an optical module 1800 with three lenses: a first lens 1822; a second lens 1824; and a third lens 1826. The first lens, the second lens, and the third lens are mounted in a housing 1830. A connecter 1805 couples the housing with a sensor 1810 (e.g., a sensor in an array). The first lens, the second lens, and the third lens can be made of plastic (e.g., OKP-1). The first lens, the second lens, and the third lens are part of a lens system 1810. Lens system 1810 is estimated to have a focal shift of around 105 μm over a 50 degree C. temperature range (e.g., from 0 to 50 degrees C.). Housing 1830 can be made of a high CTE material, and/or the mount 1840 attaches near lens 1822, to hold the focal plane of lens system 1810 at the array. In the embodiment in FIG. 18, polycarbonate (CTE=70 ppm/C) is used and mount 1840 is attached to housing 1830 25-35 mm away from the array. A combination of mount 1840 attached to the housing 30 mm away from array 1810, a movement of lenses of the lens system 1810 due to thermal expansion of housing 1830, a movement of housing 1830 due to thermal expansion of mount 1840, and/or a focal shift of lens system 1810 due to temperature change are matched to align the focal plane of the lens system with the array.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to explain the principles of the invention and its practical applications to thereby enable others skilled in the art to utilize the invention in various embodiments and with various modifications as are suited to the particular use contemplated.

As an example, while various embodiments and examples described above have focused primarily on the application of light ranging within the context of 3D sensing for automotive or other road vehicle use cases, systems disclosed herein can be used in any application without departing from the scope of the present disclosure. The small, or even miniature, form factor of a LIDAR system according to the present disclosure enables a number of additional use cases, e.g., for solid-state light ranging systems. As specific examples, systems can be used in 3D cameras and/or depth sensors within devices, such as mobile phones, tablet PCs, laptops, desktop PCs, or within other peripherals and/or user-interface devices. As other examples, one or more embodiments could be employed within a mobile device to support facial recognition and facial tracking capabilities, eye tracking capabilities, and/or for 3D scanning of objects. Other use cases include forward-facing depth cameras for augmented and virtual reality applications in mobile devices.

Other applications include deployment of one or more systems on airborne vehicles, such as airplanes, helicopters, drones, and the like. Such examples could provide 3D sensing and depth imaging to assist with navigation (autonomous or otherwise) and/or to generate 3D maps for later analysis, e.g., to support geophysical, architectural, and/or archeological analyses. Systems can also be mounted to stationary objects and structures, such as buildings, walls, poles, bridges, scaffolding, and the like. In such cases, the systems can be used to monitor outdoor areas, such as manufacturing facilities, assembly lines, industrial facilities, construction sites, excavation sites, roadways, railways, bridges, etc. Furthermore, systems can be mounted indoors and used to monitor movement of persons and or objects within a building, such as the movement of inventory within a warehouse or the movement of people, luggage, or goods within an office building, airport, train station, etc.

As another example, while various examples above included lasers in the IR or near-IR wavelengths as the emitters in LIDAR systems according to some embodiments of the disclosure, embodiments of the disclosure are not limited to any particular wavelength of light or other types of radiation for the emitters. For example, in some embodiments, the emitters can be lasers that generate pulses having any suitable known operating wavelength including a green (532 nm) wavelength, which can be particularly well-suited for underwater applications, or UV wavelengths that can be particularly useful for atmospheric LIDAR systems. As would be appreciated by one of ordinary skill in the art with the benefit of this disclosure, many different applications of light ranging systems are possible and, as such, the examples provided herein are provided for illustrative purposes only and shall not be construed to limit the uses of such systems to only the examples explicitly disclosed.

The specific details of particular embodiments described above may be combined in any suitable manner without departing from the spirit and scope of embodiments of the invention. However, other embodiments of the invention may be directed to specific embodiments relating to each individual aspect, or specific combinations of these individual aspects. For example, to reduce a spot size on the array, more than four lenses could be used, using more aspheric surfaces, and/or using multiple types of plastics could be used. As another example, in some embodiments a curved detector and/or emitter can be used. Additionally, in some embodiments three lenses are used instead of four (e.g., two lenses plastic and one lens glass). These examples and others are included within the scope of the present disclosure.

What is claimed is:

1. A light ranging system comprising:
a shaft;
a first circuit board assembly that includes a stator assembly comprising a plurality of stator elements arranged about the shaft on a surface of the first circuit board assembly;
a second circuit board assembly rotationally coupled to the shaft, wherein the second circuit board assembly includes a rotor assembly comprising a plurality of rotor elements arranged about the shaft on a surface of the second circuit board assembly such that the plurality of rotor elements are aligned with and spaced apart from the plurality of stator elements;
a light ranging device coupled to rotate with the second circuit board assembly, the light ranging device including a light source configured to transmit light pulses to objects in a surrounding environment, and detector circuitry configured to detect reflected portions of the light pulses that are reflected from the objects in the surrounding environment and to compute ranging data based on the reflected portion of the light pulses; and
a stator driver circuit disposed on either the second or the first circuit board assemblies and configured to provide a drive signal to the plurality of stator elements, thereby imparting an electromagnetic force on the plurality of rotor elements to drive a rotation of the second circuit board assembly about the shaft.

2. The light ranging system of claim 1 wherein the plurality of rotor elements and the plurality of stator elements are arranged symmetrically about the shaft.

3. The light ranging system of claim 1 wherein the second circuit board assembly further includes a plurality of optical uplink receivers disposed on a circuit board of the second circuit board assembly and symmetrically arranged about the shaft.

4. The light ranging system of claim 3 wherein the plurality of rotor elements are farther from the shaft than plurality of optical uplink receivers.

5. The light ranging system of claim 1 wherein the first circuit board assembly further includes a plurality of optical uplink transmitters disposed on a circuit board of the first circuit board assembly and symmetrically arranged about the shaft.

6. The light ranging system of claim 5 wherein a distance between the shaft and each of the plurality of stator elements is greater than a distance between the shaft and each of a plurality of optical uplink transmitters.

7. The light ranging system of claim 1 wherein the plurality of stator elements includes a plurality of solenoid coils, each of the plurality of solenoid coils being arranged in a ring around the shaft.

8. The light ranging system of claim 7 wherein each of the plurality of stator elements has a longitudinal axis perpendicular to the first circuit board assembly and comprises a solenoid coil wrapped around a core of magnetic material, wherein each rotor element in the plurality of rotor elements comprises a magnet having its poles arranged opposite the poles of the magnets adjacent to the rotor element.

9. The light ranging system of claim 8 wherein a number of stator elements in the plurality of stator elements is a multiple of three and the light ranging system further comprises a motor driver circuit coupled to the plurality of stator elements and configured to provide a 3-phase alternating signal to the plurality of stator elements.

10. The light ranging system of claim 8 wherein the plurality of rotor elements includes a plurality of permanent magnets.

11. The light ranging system of claim 1 wherein the plurality of stator elements includes a plurality of permanent magnets arranged in a ring around the shaft, and the plurality of rotor elements comprises a plurality of solenoid coils arranged in a ring around the shaft directly opposite the plurality of permanent magnets.

12. The light ranging system of claim 11 wherein the plurality of stator elements includes at least 12 stator elements.

13. The light ranging system of claim 1 wherein the second circuit board assembly further includes an optical downlink transmitter configured to transmit ranging data from the light ranging device through a central hole within the shaft, and wherein the first circuit board assembly further includes an optical downlink receiver configured to receive ranging data from the optical downlink transmitter via the central hole within the shaft.

14. The light ranging system of claim 1 wherein the first circuit board assembly comprises a wireless power transmission subsystem configured to transmit power to the light ranging device that is electrically connected to the second circuit board assembly, the wireless power transmission subsystem comprising a transmitter coil disposed on the first circuit board assembly and disposed around the shaft,
wherein the second circuit board assembly comprises a wireless power receiver subsystem configured to receive power from the wireless power transmission subsystem, the wireless power receiver subsystem comprising a receiver coil that is disposed on the second circuit board assembly and disposed around the shaft.

15. A light ranging system comprising:
a stationary enclosure having an optically transparent window and a base;
a hollow shaft disposed within the enclosure;
a bearing system coupled to the hollow shaft;
a first circuit board assembly disposed within the enclosure and parallel with a first plane perpendicular to the hollow shaft, the first circuit board assembly including a stator assembly comprising a plurality of evenly spaced stator elements arranged annularly about the shaft on a surface of the first circuit board assembly;
a second circuit board assembly disposed within the enclosure parallel to the first plane and rotationally coupled to the shaft by the bearing system, wherein the second circuit board assembly includes a rotor assembly comprising a plurality of evenly spaced rotor elements arranged annularly about the shaft on a surface of the second circuit board assembly such that the plurality of rotor elements are aligned with and spaced apart from the plurality of stator elements;
a light ranging device coupled to rotate with the second circuit board assembly within the stationary enclosure, the light ranging device including a light source configured to transmit light pulses through the window to objects in a surrounding environment, and detector circuitry configured to detect reflected portions of the light pulses received through the window that are reflected from the objects in the surrounding environment and to compute ranging data based on the reflected portion of the light pulses; and
a stator driver circuit disposed on either the second or the first circuit board assemblies and configured to provide a drive signal to the plurality of stator elements, thereby imparting an electromagnetic force on the plurality of rotor elements to drive a rotation of the second circuit board assembly and the light ranging device about the shaft.

16. The light ranging system of claim 15 further comprising:
a first optical communication channel configured to optically transmit data between the first circuit board assembly and the second circuit board assembly through the hollow shaft, the first optical communication channel including a first optical component coupled to circuitry disposed on the first circuit board assembly and a second optical component coupled to circuitry disposed in the second circuit board assembly; and
a second, annular optical communication channel surrounding the hollow shaft and configured to optically transmit data between the first circuit board assembly and the second circuit board assembly, the annular optical communication channel including a first annular optical component coupled to circuitry disposed on the first circuit board assembly and a second annular optical component coupled to circuitry disposed in the second circuit board assembly.

17. The light ranging system of claim 16 wherein the first optical communication channel is a downlink channel configured to transmit ranging data from the light ranging device to a processor coupled to the first circuit board subassembly and the second optical communication channel is an uplink channel configured to transmit control signals from the processor to the light ranging device.

18. The light ranging system of claim 15 further comprising a heat spreading element coupled to the first circuit board assembly, wherein components of the light ranging system are configured to conduct heat from the second circuit board assembly to the base through the bearing system and the heat spreading element.

19. The light ranging system of claim 15 wherein each of the plurality of evenly spaced stator elements has a longitudinal axis perpendicular to the first circuit board assembly and comprises a solenoid coil wrapped around a core of magnetic material, wherein each rotor element in the plurality of evenly spaced rotor elements comprises a magnet having its poles arranged opposite the poles of the magnets adjacent to the rotor element.

20. A light ranging system comprising:
a shaft having a longitudinal axis;
a first circuit board assembly that includes a stator assembly comprising a plurality of stator elements arranged about the shaft on a surface of the first circuit board assembly;
a second circuit board assembly rotationally coupled to the shaft and spaced apart from and in an opposing relationship with the first circuit board assembly, wherein the second circuit board assembly includes a rotor assembly comprising a plurality of rotor elements arranged about the shaft on a surface of the second circuit board assembly such that the plurality of rotor elements are aligned with and spaced apart from the plurality of stator elements;

a stator driver circuit disposed on either the second or the first circuit board assemblies and configured to provide a drive signal to the plurality of stator elements, thereby imparting an electromagnetic force on the plurality of rotor elements to drive a rotation of the second circuit board assembly about the longitudinal axis of the shaft; and a light ranging device mechanically coupled to the second circuit board assembly such that the light ranging device rotates with the second circuit board assembly.

21. A light ranging system comprising:

a shaft having a rotational axis;

a first circuit board assembly arranged perpendicular to the rotational axis, wherein the first circuit board assembly includes a plurality of stator elements arranged about the shaft on a surface of the first circuit board assembly;

a second circuit board assembly rotationally coupled to the shaft and spaced apart from and parallel to the first circuit board assembly, wherein the second circuit board assembly includes a plurality of rotor elements arranged about the shaft on a surface of the second circuit board assembly such that the plurality of rotor elements are aligned with and spaced apart from the plurality of stator elements;

a stator driver circuit electrically coupled to the plurality of stator elements to provide a drive signal to the plurality of stator elements, thereby imparting an electromagnetic force on the plurality of rotor elements to drive a rotation of the second circuit board assembly about the longitudinal axis of the shaft; and a time-of-flight light ranging device mechanically coupled to the second circuit board assembly such that the light ranging device rotates with the second circuit board assembly, the time-of-flight light ranging device including a plurality of light emitters and a plurality of light sensors, wherein the plurality of light emitters emit precisely timed pulses into a field external to the light ranging system and reflections of the pulses off an object in the field back to the light ranging device are detected by the plurality of light sensors such that an elapsed time between emission and detection can be used to compute a distance to the object.

22. The light ranging system of claim 21 wherein the shaft is hollow and the system further includes a first communication channel between the first and second circuit board assemblies through the hollow shaft.

23. The light ranging system of claim 22 further comprising a second communication channel between the first and second circuit board assemblies at a location spaced apart from the shaft, the second communication channel including a receiver mounted on one of the first or second circuit board assemblies and a transmitter disposed in an opposing relationship to the receiver and mounted on the other of the first or second circuit board assemblies.

24. The light ranging system of claim 21 further comprising a wireless power system that includes a wireless power transmitter mounted to the first circuit board assembly and a wireless power receiver disposed in an opposing relationship to the wireless power transmitter and mounted to the second circuit board assembly.

25. The light ranging system of claim 24 further comprising an encoder having a encoder strip mounted on one of the first or second circuit board assemblies and an encoder reader disposed in an opposing relationship to the encoder strip and mounted on the other of the first or second circuit board assemblies.

* * * * *